(12) United States Patent
Bang et al.

(10) Patent No.: US 12,156,441 B2
(45) Date of Patent: Nov. 26, 2024

(54) DISPLAY DEVICE HAVING CONNECTION LINES

(71) Applicant: Samsung Display Co., Ltd., Yongin-si (KR)

(72) Inventors: Ki Ho Bang, Hwaseong-si (KR); Won Suk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 157 days.

(21) Appl. No.: 17/107,780

(22) Filed: Nov. 30, 2020

(65) Prior Publication Data

US 2021/0320163 A1    Oct. 14, 2021

(30) Foreign Application Priority Data

Apr. 13, 2020    (KR) ........................ 10-2020-0044482

(51) Int. Cl.
*H10K 59/131* (2023.01)
*G06F 3/041* (2006.01)
*G06F 3/044* (2006.01)
*H10K 59/123* (2023.01)
*H10K 59/124* (2023.01)

(52) U.S. Cl.
CPC ......... *H10K 59/131* (2023.02); *G06F 3/0412* (2013.01); *G06F 3/0443* (2019.05); *H10K 59/123* (2023.02); *H10K 59/124* (2023.02)

(58) Field of Classification Search
CPC ... H01L 27/3244–3248; H01L 27/3258–3262; H01L 27/3276–3279; H01L 27/124; H01L 51/52; H01L 51/5253; H01L 27/1218; H01L 27/323; G09F 3/3208; G09F 3/3225; G09G 2300/0426; G09G 2300/0439; G09G 3/3225; G06F 3/0412; G06F 3/0443; G06F 1/1605; H04M 1/0266; G02F 1/136227; H10K 59/12–1315; H10K 59/40–70; H10K 59/80–80524
See application file for complete search history.

(56) References Cited

U.S. PATENT DOCUMENTS 9,853,096 B1 * 12/2017 Choi ................... H01L 27/3276
11,314,279 B2 * 4/2022 Hong ................... H10K 50/844
2017/0031323 A1 * 2/2017 Kim .................... H10K 59/1213
(Continued)

FOREIGN PATENT DOCUMENTS

KR    10-2017-0111827 A    10/2017
KR    10-2018-0049296 A    5/2018
(Continued)

*Primary Examiner* — Roberto W Flores
(74) *Attorney, Agent, or Firm* — Lewis Roca Rothgerber Christie LLP

(57) ABSTRACT

A display device includes: a base part including a display area including a plurality of pixels each having at least one switching element and a light-emitting element, a non-display area surrounding the display area, and a through hole surrounded by the display area and configured to transmit light; a plurality of first lines extending in a first direction on the base part and connected to the plurality of pixels; and connection lines bypassing the through hole and extending in the display area to connect between the first lines spaced apart from one another by the through hole among the plurality of first lines.

13 Claims, 26 Drawing Sheets

(56) References Cited

U.S. PATENT DOCUMENTS

| | | | |
|---|---|---|---|
| 2017/0148856 A1* | 5/2017 | Choi | H10K 59/873 |
| 2017/0162111 A1* | 6/2017 | Kang | H01L 27/3276 |
| 2017/0162637 A1* | 6/2017 | Choi | H01L 27/3276 |
| 2017/0288003 A1* | 10/2017 | Kim | H01L 27/3276 |
| 2018/0366495 A1* | 12/2018 | Xu | G02F 1/136209 |
| 2019/0115415 A1 | 4/2019 | Choi et al. | |
| 2019/0123066 A1* | 4/2019 | Zhan | H01L 27/1218 |
| 2019/0123298 A1* | 4/2019 | Kanaya | H10K 59/121 |
| 2019/0326553 A1* | 10/2019 | Abe | H05B 33/04 |
| 2020/0020752 A1 | 1/2020 | Shi et al. | |
| 2020/0058728 A1 | 2/2020 | Song et al. | |
| 2020/0064702 A1 | 2/2020 | Yeh et al. | |
| 2020/0119304 A1* | 4/2020 | Choi | H10K 59/12 |
| 2021/0005669 A1* | 1/2021 | Kamada | H10K 65/00 |
| 2021/0210718 A1* | 7/2021 | Zhang | H10K 59/88 |
| 2021/0265451 A1 | 8/2021 | Son et al. | |
| 2022/0115474 A1* | 4/2022 | Jia | H10K 71/00 |

FOREIGN PATENT DOCUMENTS

| | | |
|---|---|---|
| KR | 10-2019-0134311 A | 12/2019 |
| KR | 10-2021-0108542 A | 9/2021 |

* cited by examiner

VL: DL, VDDL
SL: GL1, GL2, GL3, EML

VL: DL, VDDL
SL: HGL1, HGL2, HGL3, HGL4, EML

DISPLAY DEVICE HAVING CONNECTION LINES

CROSS-REFERENCE TO RELATED APPLICATION

The present application claims priority to and the benefit of Korean Patent Application No. 10-2020-0044482 filed on Apr. 13, 2020, in the Korean Intellectual Property Office, the entire disclosure of which is incorporated herein by reference.

BACKGROUND

1. Field

Aspects of some example embodiments of the present disclosure relate to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices include, for example, flat panel display devices such as liquid-crystal display devices, field emission display devices, and organic light-emitting display devices. Among such flat panel display devices, organic light-emitting display devices include a light-emitting element so that each of the pixels of the display panel are self emitting. Accordingly, an organic light-emitting display device can display images without a backlight unit that supplies light to the display panel.

The display panel may include a through hole penetrating through the display area in the thickness direction of the display panel. In such case, data lines and gate lines that have been already arranged may be disconnected by the through hole. In addition, as the through hole includes a dead space area surrounding it, the display area may be reduced by the area equal to the dead space area.

The above information disclosed in this Background section is only for enhancement of understanding of the background and therefore the information discussed in this Background section does not necessarily constitute prior art.

SUMMARY

Aspects of some example embodiments of the present disclosure include a display device that may be capable of reducing a dead space area created by a through hole.

Aspects of some example embodiments of the present disclosure include a display device that can increase the degree of freedom for the position of a through hole.

It should be noted that characteristics of embodiments according to the present disclosure are not limited to the above-mentioned characteristics; and other characteristics of embodiments according to the present invention will be more apparent to those skilled in the art from the following descriptions.

According to some example embodiments of the present disclosure, a display device includes: a base part comprising a display area comprising a plurality of pixels each having at least one switching element and a light-emitting element, a non-display area surrounding the display area, and a through hole surrounded by the display area and transmitting light, a plurality of first lines extended in a first direction on the base part and connected to the plurality of pixels, and connection lines bypassing the through hole and extended in the display area to connect between the first lines spaced apart from one another by the through hole among the plurality of first lines.

According to some example embodiments, each of the connection lines may include: a first portion connected to a first line terminated at one side of the through hole, a second portion connected to the first portion and extended in a direction parallel to the first line, and a third portion connecting the first line terminated at an opposite side of the through hole with the second portion.

According to some example embodiments, the display device may further include: a first conductive layer comprising a first anode connection electrode connected to the at least one switching element, and a second conductive layer on the first conductive layer and comprising a second anode connection electrode connecting the first anode connection electrode with the light-emitting element. The first lines may be in one of the first and second conductive layers, and the connection lines may be in the other one of the first and second conductive layers.

According to some example embodiments, the display device may further include: a first conductive layer comprising a first anode connection electrode connected to the at least one switching element, and a second conductive layer on the first conductive layer and comprising a second anode connection electrode connecting the first anode connection electrode with the light-emitting element. The plurality of first lines and the second portion of each of the connection lines may be in one of the first and second conductive layers, and the first portion of each of the connection lines may be in the other of the first and second conductive layers.

According to some example embodiments, the display device may further include: a first conductive layer comprising a first anode connection electrode connected to the at least one switching element, a second conductive layer on the first conductive layer and comprising a second anode connection electrode connected to the first anode connection electrode, and a third conductive layer on the second conductive layer and comprising a third anode connection electrode connecting the second anode connection electrode with the light-emitting element. The first lines may be in one of the first to third conductive layers, and the first portion of each of the connection lines may be in another of the first to third conductive layers, and the second portion of each of the connection lines may be in the other one of the first to third conductive layers.

According to some example embodiments, the plurality of first lines may comprise: a plurality of data lines supplying a data voltage to each of the plurality of pixels, and a plurality of driving voltage lines supplying a driving voltage to each of the plurality of pixels.

According to some example embodiments, the display device may further comprise: a plurality of second lines extended in a second direction crossing the first direction on the base part to be connected to the plurality of pixels, a first gate driver on one side of the non-display area to supply gate signals to the plurality of second lines, and a second gate driver on an opposite side of the non-display area to supply gate signals to the plurality of second lines. The first gate driver may supply a gate signal to a second line terminated at one side of the through hole among the plurality of second lines, and the second gate driver may supply a gate signal to a second line terminated at an opposite side of the through hole.

According to some example embodiments, the plurality of second lines may comprise: a plurality of gate lines supplying a gate signal to each of the plurality of pixels, and a plurality of emission control lines supplying an emission signal to each of the plurality of pixels.

According to some example embodiments, the display device may further comprise: a plurality of second lines extended in a second direction crossing the first direction on the base part to be connected to the plurality of pixels, and gate connection lines bypassing the through hole and extended in the display area to connect the second lines spaced apart from each other by the through hole among the plurality of second lines.

According to some example embodiments, each of the gate connection lines comprises: a first portion connected to a second line terminated at one side of the through hole, a second portion connected to the first portion and extended in a direction parallel to the second line, and a third portion connecting the second line terminated at an opposite side of the through hole with the second portion.

According to some example embodiments, the display device may further comprise: a first gate layer comprising the plurality of second lines, and a second gate layer on the first gate layer and comprising the gate connection lines.

According to some example embodiments, the display device may further comprise: a first gate layer comprising some of the plurality of second lines, a second gate layer on the first gate layer and comprising a metal layer, and a third gate layer on the second gate layer and comprising some others of the plurality of second lines. The second portion of each of the gate connection lines may be in one of the first to third gate layers, and the third portion of each of the gate connection lines is in the second gate layer.

According to some example embodiments of the present disclosure, a display device includes: a base part comprising a display area comprising a plurality of pixels each having at least one switching element and a light-emitting element, a non-display area surrounding the display area, and a through hole surrounded by the display area and transmitting light, a plurality of first lines extended in a first direction on the base part and connected to the plurality of pixels, and bypass connection lines bypassing the through hole and extended in the display area and the non-display area to connect between the first lines spaced apart from one another by the through hole among the plurality of first lines.

According to some example embodiments, each of the bypass connection lines may comprise: a first portion connected to a first line terminated at one side of the through hole, a second portion connected to the first portion and extended to the non-display area in a direction parallel to the first line, and a third portion in the non-display area and connecting the first line terminated at an opposite side of the through hole with the second portion.

According to some example embodiments, the bypass connection lines may have longer first portions as the first lines connected thereto have coordinates in the second direction closer to a center of the through hole.

According to some example embodiments, the display device may further comprise: a first conductive layer comprising a first anode connection electrode connected to the at least one switching element, and a second conductive layer on the first conductive layer and comprising a second anode connection electrode connecting the first anode connection electrode with the light-emitting element. The first lines may be in one of the first and second conductive layers, and the bypass connection lines may be in the other one of the first and second conductive layers.

According to some example embodiments, the display device may further comprise: a first conductive layer comprising a first anode connection electrode connected to the at least one switching element, a second conductive layer on the first conductive layer and comprising a second anode connection electrode connected to the first anode connection electrode, and a third conductive layer on the second conductive layer and comprising a third anode connection electrode connecting the second anode connection electrode with the light-emitting element. The first lines may be in one of the first to third conductive layers, and the first portion of each of the bypass connection lines may be in another of the first to third conductive layers, and the second portion of each of the bypass connection lines may be in the other one of the first to third conductive layers.

According to some example embodiments, the display device may further comprise: a plurality of second lines extended in a second direction crossing the first direction on the base part to be connected to the plurality of pixels, and gate bypass connection lines bypassing the through hole and extended in the display area and the non-display area to connect the second lines spaced apart from each other by the through hole among the plurality of second lines.

According to some example embodiments, each of the gate bypass connection lines may comprise: a first portion connected to a second line terminated at one side of the through hole to be extended to the non-display area, a second portion in the non-display area and extended in a direction parallel to the second line, and a third portion connecting the second line terminated at an opposite side of the through hole with the second portion.

According to some example embodiments, the display device may further comprise: a first gate layer comprising the plurality of second lines, and a second gate layer on the first gate layer and comprising the gate bypass connection lines.

According to some example embodiments, the display device may further comprise: a first gate layer comprising some of the plurality of second lines, a second gate layer on the first gate layer and comprising a metal layer, and a third gate layer on the second gate layer and comprising some others of the plurality of second lines. The second portion of each of the gate bypass connection lines may be in one of the first to third gate layers, and the third portion of each of the gate bypass connection lines may be in the second gate layer.

According to some example embodiments, the base part may further comprise a dead space area between the through hole and the display area. The first electrode of the light-emitting element is disconnected at the dead space area.

According to some example embodiments, a distance between the dead space area and the non-display area may be less than half a distance between a center of the through hole and the display area.

According to some example embodiments of the present disclosure, connection lines bypass a through hole and extended in a display area to connect between first lines spaced apart from each other by the through hole. In this manner, no additional line area or wiring area for connecting between the first lines is required, and thus a dead space area created by the through hole can be reduced.

According to some example embodiments of the present disclosure, bypass connection lines bypass a through hole and extended in a display area and a non-display area to connect between first lines spaced apart from each other by the through hole. In this manner, a dead space area created by the through hole can be reduced, and the degree of freedom for the position of the through hole can be increased by reducing the distance between the through hole and the non-display area.

It should be noted that effects of the present disclosure are not limited to those described above and other effects of the present disclosure will be apparent to those skilled in the art from the following descriptions.

DETAILED DESCRIPTION

Figure 1:
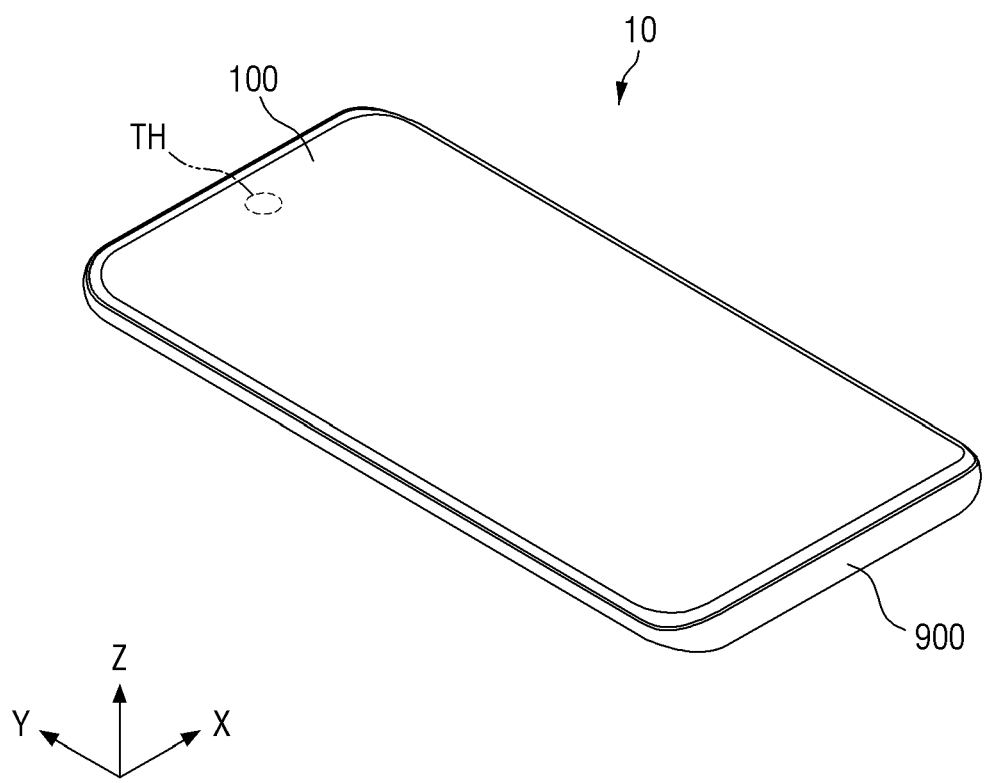
FIG. 1 is a perspective view showing a display device according to some example embodiments of the present disclosure.

In the following description, for the purposes of explanation, numerous specific details are set forth in order to provide a thorough understanding of various example embodiments or implementations of the invention. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of some example embodiments may be used or implemented in other example embodiments without departing from the inventive concepts according to the present disclosure.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
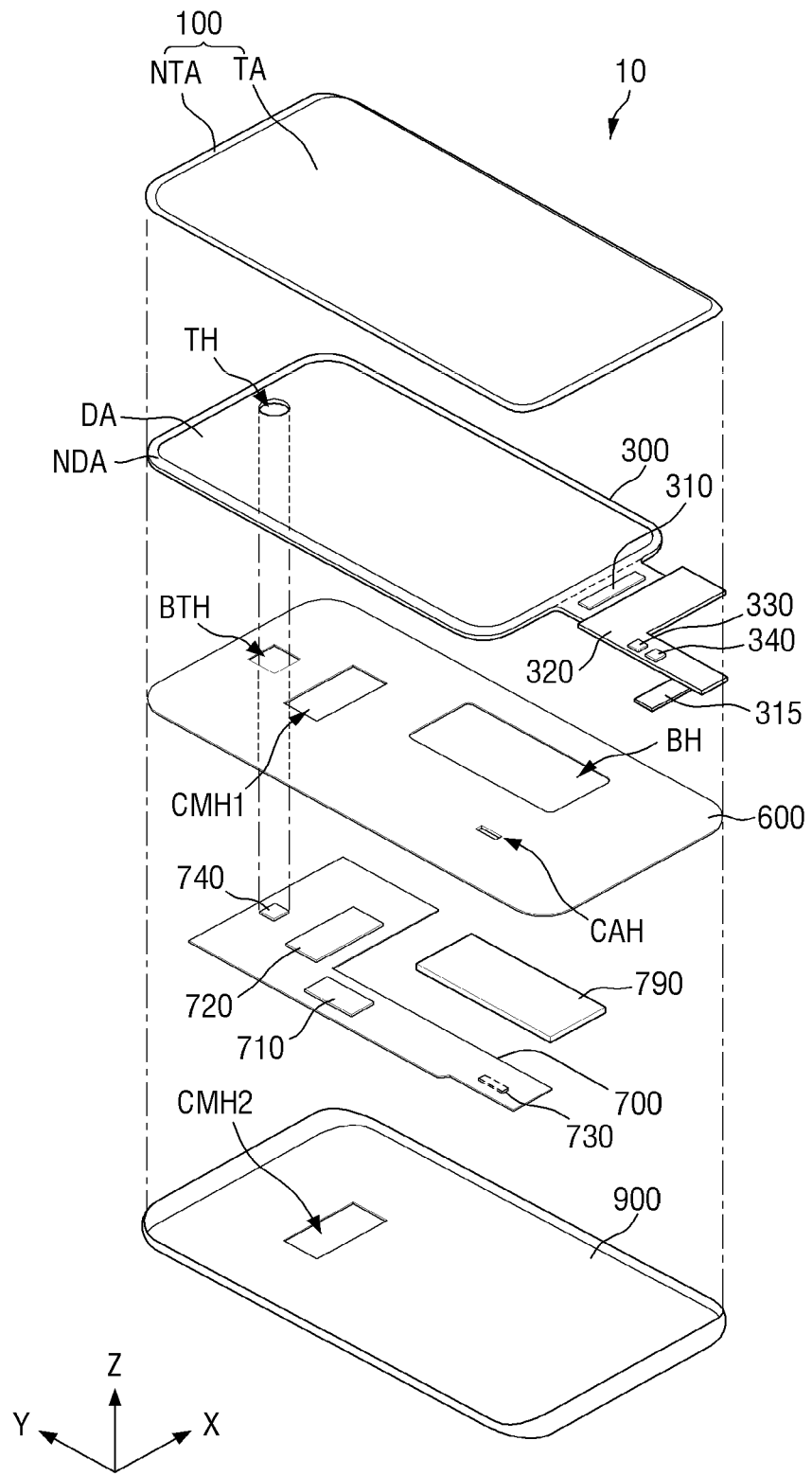
FIG. 2 is an exploded, perspective view of a display device according to some example embodiments of the present disclosure.

FIG. 1 is a perspective view showing a display device according to some example embodiments of the present disclosure. FIG. 2 is an exploded, perspective view of a display device according to some example embodiments of the present disclosure.

Referring to FIGS. 1 and 2, the display device 10 may include a cover window 100, a display panel 300, a bracket 600, a main circuit board 700, and a bottom cover 900.

As used herein, the terms "above," "top" and "upper surface" refer to the upper side of the display device 10, i.e., the side indicated by the arrow in the z-axis direction, whereas the terms "below," "bottom" and "lower surface" refer to the lower side of the display device 10, i.e., the opposite side in the z-axis direction. As used herein, the terms "left," "right," "upper" and "lower" sides indicate relative positions when the display device 10 is viewed from the top. For example, the "left side" refers to the opposite side of the arrow of the x-axis direction, the "right side" refers to the side indicated by the arrow of the x-axis direction, the "upper side" refers to the side indicated by the arrow of the y-axis direction, and the "lower side" refers to the opposite side of the arrow of the y-axis direction.

The display device 10 is for displaying video or still image. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a laptop computer, a monitor, a billboard and the Internet of Things.

The display device 10 may have a rectangular shape when viewed from the top. For example, the display device 10 may have a rectangular shape having shorter sides in a first direction (x-axis direction) and longer sides in a second direction (y-axis direction) when viewed from the top as shown in FIGS. 1 and 2. Each of the corners where the short side in the first direction (x-axis direction) meets the longer side in the second direction (y-axis direction) may be rounded with a curvature (e.g., a set or predetermined curvature) or may be a right angle. The shape of the display device 10 when viewed from the top is not limited to a rectangular shape but may be formed in another polygonal shape, a circular shape, or an elliptical shape.

The cover window 100 may be located on the display panel 300 to cover the upper surface of the display panel 300. The cover window 100 can protect the upper surface of the display panel 300.

The cover window 100 may include a transmissive area TA corresponding to a display area DA of the display panel 300 and a non-transmissive area NTA corresponding to a non-display area NDA of the display panel 300. For example, the non-transmissive area NTA may be opaque. For another example, when the non-transmissive area does not display images, it may be formed as a decorative layer having a pattern that can be shown to a user.

The display panel 300 may be located under the cover window 100. Accordingly, images displayed by the display panel 300 can be seen from the upper surface of the display device 10 through the cover window 100.

The display panel 300 may be a light-emitting display panel including light-emitting elements. For example, the display panel 300 may be an organic light-emitting display panel using organic light-emitting elements including organic emissive layer, a micro light-emitting element display panel using micro LEDs, a quantum-dot light-emitting display panel using quantum-dot light-emitting elements including an quantum-dot emissive layer, or an inorganic light-emitting display panel using inorganic light-emitting elements including an inorganic semiconductor. In the following description, an organic light-emitting display panel is employed as the display panel 300.

The display panel 300 may include a display area DA and a non-display area NDA.

The display area DA may be arranged such that it overlaps with the transmissive area TA of the cover window 100. The display area DA may include a plurality of pixels displaying images, and the non-display area NDA may be located around the display area DA and may not display images. For example, the non-display area NDA may surround the display area DA, but embodiments according to the present disclosure are not limited thereto. The display area DA may occupy most of the area of the display panel 300.

The display panel 300 may include a through hole TH. The through hole TH may penetrate through the display panel 300 in a third direction (z-axis direction). The through hole TH may be surrounded by the display area DA when viewed from the top.

The through hole TH may overlap a bracket hole BTH of a bracket and a light-receiving sensor 740 in the third direction (z-axis direction). After light passes through the through hole TH of the display panel 300, the light may be incident on the light-receiving sensor 740 through the bracket hole BTH. Accordingly, the light-receiving sensor 740 can detect light incident from the front surface of the display device 10 even though it is located under the display panel 300.

For example, the display panel 300 may include the single through hole TH, but the number of through holes TH is not limited to one. When the display panel 300 includes a plurality of through holes TH, some of the plurality of through holes TH may overlap with the bracket hole BTH and the light-receiving sensor 740 in the third direction (z-axis direction) while some others of the plurality of through holes TH may overlap with another bracket hole and a sensor device other than the light-receiving sensor 740. For example, the sensor device may be a proximity sensor, an illuminance sensor, or a front camera sensor.

For example, the display panel 300 may include a touch electrode layer capable of sensing an object such as a person's finger and a pen. The touch electrode layer may include a plurality of touch electrodes, which may be located on a display layer on which a plurality of pixels is located.

The display panel 300 may include a display driver 310, a circuit board 320, a power supply 330, and a touch driver 340.

The display driver 310 may output signals and voltages for driving the display panel 300. For example, the display driver 310 may apply data voltages to data lines. The display driver 310 may supply a driving voltage or a supply voltage to a driving voltage line, and may supply a gate control signal to a gate driver.

The circuit board 320 may be attached to pads using an anisotropic conductive film (ACF). Lead lines of the circuit board 320 may be electrically connected to the pads of the display panel 300. For example, the circuit board 320 may be a flexible printed circuit board (FPCB), a printed circuit board (PCB), or a flexible film such as a chip-on-film (COF).

The power supply 330 may be located on the circuit board 320 to apply driving voltages to the display driver 310 and the display panel 300. Specifically, the power supply 330 may generate the driving voltage to apply it to the driving voltage line, and may generate a low-level voltage to apply it to the cathode electrode of the light-emitting element of each of the pixels. For example, the driving voltage may be a high-level voltage for driving a light-emitting element, e.g., an organic light-emitting element, and the low-level voltage may be a low-level voltage for driving an organic light-emitting element.

The touch driver 340 may be located on the circuit board 320 to measure the capacitance of the touch electrodes. For example, the touch driver 340 may determine whether there is a user's touch and the position of the user's touch, if any, based on a change in the capacitance of the touch electrodes. As used herein, a user's touch refers to that an object such as the user's finger or a pen is brought into contact with a surface of the display device 10 located on the touch electrode layer. The touch driver 340 can determine the position of the user's touch by distinguishing some of the touch electrodes where the user's touch is made from the others.

The bracket 600 may be located under the display panel 300. The bracket 600 may include plastic, metal, or the combination thereof. For example, the bracket 600 may include a first camera hole CMH1 into which a first camera sensor 720 is inserted, a battery hole BH in which a battery is located, a cable hole CAH through which a cable 315 connected to the display driver 310 or the circuit board 320 pass, and a bracket hole BTH overlapping the light-receiving sensor 740. As another example, the bracket 600 may not include the bracket hole BTH and may not overlap the light-receiving sensor 740.

The main circuit board 700 and the battery 790 may be located under the bracket 600. The main circuit board 700 may be either a printed circuit board (PCB)or a flexible printed circuit board.

The main circuit board 700 may include a main processor 710, the first camera sensor 720, a main connector 730 and the light-receiving sensor 740. The first camera sensor 720 may be located on both the upper and lower surfaces of the main circuit board 700, the main processor 710 may be located on the upper surface of the main circuit board 700, and the main connector 730 may be located on the lower surface of the main circuit board 700. The light-receiving sensor 740 may be located on the upper surface of the display circuit board 700.

The light-receiving sensor 740 may include a light-receiving element capable of detecting light incident through the through hole TH. The light-receiving element may be a photo-diode or a photo-transistor. For example, the light-receiving sensor 740 may be a CMOS image sensor or CCD sensor capable of detecting light.

The bottom cover 900 may be located under the main circuit board 700 and the battery 790. The bottom cover 900 may be fastened and fixed to the bracket 600. The bottom cover 900 may form the exterior of the lower surface of the display device 10. The bottom cover 900 may be made of plastic, metal, or the combination thereof.

The bottom cover 900 may include a second camera hole CMH2 via which the lower surface of the first camera sensor 720 is exposed. The position of the first camera sensor 720 and the positions of the first and second camera holes CMH1 and CMH2 in line with the first camera sensor 720 are not limited to those according to the example embodiment shown in FIG. 2.

Figure 3:
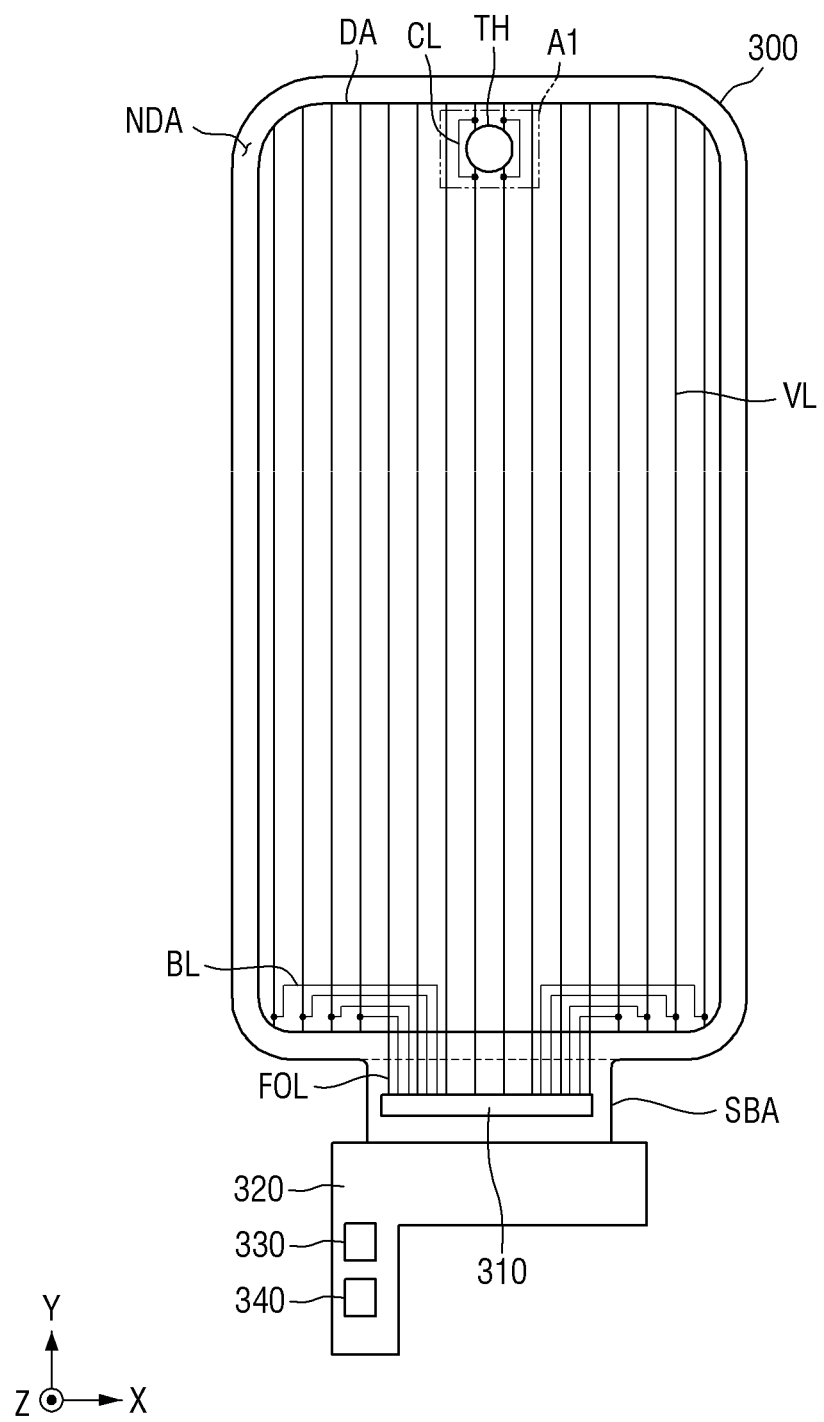
FIG. 3 is a plan view showing connection relationships of first lines of a display panel according to some example embodiments of the present disclosure.
Figure 4:
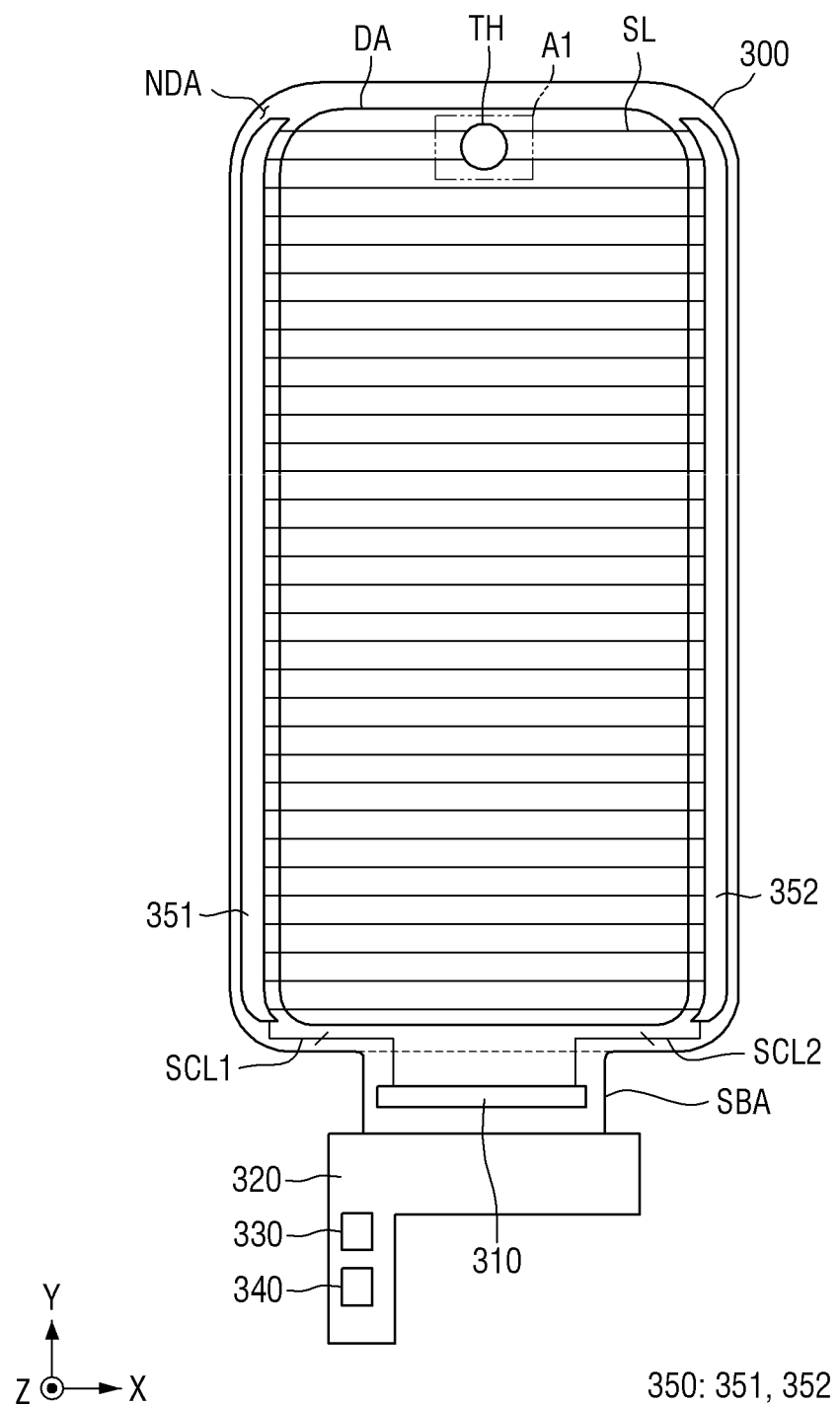
FIG. 4 is a plan view showing connection relationships of second lines of a display panel according to some example embodiments of the present disclosure.

FIG. 3 is a plan view showing connection relationships of first lines of a display panel according to some example embodiments of the present disclosure. FIG. 4 is a plan view showing connection relationships of second lines of a display panel according to some example embodiments of the present disclosure.

Referring to FIGS. 3 and 4, the display panel 300 may be a rigid display panel or a flexible display panel. A rigid display panel has rigidity and thus may not be easily bent. A flexible display panel has flexibility and thus can be easily bent, folded, or rolled. For example, the display panel 300 may be a foldable display panel that can be folded and unfolded, a curved display panel having a curved display surface, a bended display panel having a bent area other than the display surface, a rollable display panel that can be rolled and unrolled, and a stretchable display panel that can be stretched.

For another example, the display panel 300 may be implemented as a transparent display panel to allow a user to see an object or a background under the display panel from the front surface of the display panel 300 through it. In addition, the display panel 300 may be implemented as a reflective display panel that can reflect an object or a background off the front surface of the display panel 300.

The display panel 300 may include the through hole TH, the display area DA, and the non-display area NDA.

The through hole TH may be formed at the central portion of the display area DA in the first direction (x-axis direction). For example, the distance between the through hole TH and the first gate driver 351 may be substantially equal to the distance between the through hole TH and the second gate driver 352. The distance between the through hole TH and one edge of the display area DA may be substantially equal to the distance between the through hole TH and the other edge of the display area DA. The through hole TH may penetrate through the display panel 300 in the third direction (z-axis direction). The through hole TH may be surrounded by the display area DA when viewed from the top.

The display area DA may include a plurality of pixels SP, a plurality of first lines VL, and a plurality of second lines SL.

Each of the plurality of pixels may be connected to the respective first lines VL and the respective second lines SL. Each of the plurality of pixels may be connected to at least one data line, at least one driving voltage line, at least one gate line, and at least one emission control line. For example, each of the plurality of pixels may be connected to, but is not limited to, a single data line, a single driving voltage line, two gate lines, and a single emission control line. For another example, each of the plurality of pixels may be connected to three or more gate lines.

The plurality of first lines VL may be connected to the display driver 310 and may traverse the display area DA in the second direction (y-axis direction). The plurality of first lines VL may extend in the second direction (y-axis direction) and may be spaced apart from one another in the first direction (x-axis direction) crossing the second direction (y-axis direction). Some of the first lines VL which face the display driver 310 may be connected to the display driver 310 through fan-out lines FOL, and some others of the first lines VL which do not face the display driver 310 may be connected to the display driver 310 through bypass lines BL. For example, the plurality of first lines VL may include a plurality of data lines and a plurality of driving voltage lines. The data lines may apply data voltages to the pixels, and the driving voltage lines may apply driving voltages to the pixels.

The bypass lines BL may connect the display driver 310 with some of the first lines VL. The bypass line BL may pass through one side of the non-display area NDA and one side of the display area DA which are adjacent to the display driver 310 to be connected to some of the first lines VL in the display area DA. The bypass lines BL are located in a different layer from the plurality of first lines VL, so that they can bypass the through hole TH and can be extended in the display area DA in which the plurality of first lines VL are extended.

Some of the first lines VL may not pass through the through hole TH while some others of the first lines VL may be disconnected by the through hole TH. For example, some of the first lines VL which do not pass through the through hole TH may extend from the side of the display area DA which faces the display driver 310 to the opposite side of the display area DA. Some others of the plurality of first lines VL which are disconnected by the through hole TH may be connected by connection lines CL.

The connection lines CL may bypass the through hole TH and extended in the display area DA to connect between the first lines VL which are spaced apart from each other by the through hole TH. The connection lines CL may be located in a different layer from the plurality of first lines VL, so that they can bypass the through hole and can be extended in the display area DA in which the plurality of pixels is located. The connection lines CL may connect the first lines VL terminated at one side of the through hole TH to the first lines VL terminated at the other side of the through hole TH. As the display device 10 includes the connection lines CL bypassing the through hole TH in the display area DA, it does not require any additional line area or wiring area connecting between the first lines VL located on the both sides of the through hole TH. As a result, it is possible to reduce the dead space area created by the through hole TH.

The plurality of second lines SL may extend in the first direction (x-axis direction), and may be spaced apart from each other in the second direction (y-axis direction). The plurality of second lines SL may be connected to the first gate driver 351 or the second gate driver 352. Some of the second lines SL may not pass through the through hole TH while some others of the second lines SL may be disconnected by the through hole TH. For example, some of the second lines SL which do not pass through the through hole TH may be connected to both the first and second gate drivers 351 and 352. Alternatively, some of the second lines SL which do not pass through the through hole TH may be alternately connected to one of the first and second gate drivers 351 and 352. Some others of the second lines SL which are disconnected by the through hole TH may be connected to one of the first and second gate drivers 351 and 352. The second lines SL terminated at one side of the through hole TH may be connected to the first gate driver 351 located on one side of the non-display area NDA, while the second lines SL terminated at the other side of the through hole TH may be connected to the second gate driver 352 located on the opposite side of the non-display area NDA. For example, the plurality of second lines SL may include a plurality of gate lines and a plurality of emission control lines. The gate lines may supply gate signals to the pixels, and the emission control line may supply emission signals to the pixels.

The non-display area NDA may be formed around the display area DA, and may not display images. For example, the non-display area NDA may surround the display area DA, but embodiments according to the present disclosure are not limited thereto. The display area DA may occupy most of the area of the display panel 300.

The non-display area NDA may include the gate drivers 350 applying gate signals or emission signals to the second lines SL, the first and second gate control lines SCL1 and SCL2 connecting first and second gate drivers 351 and 352 with the display driver 310, the fan-out lines FOL connecting some of the first lines VL with the display driver 310, and the bypass lines BL connecting some others of the first lines VL with the display driver 310.

The gate drivers 350 may include first and second gate drivers 351 and 352. The first gate driver 351 may be located on one outer side of the display area DA or on one side of the non-display area NDA. The first gate driver 351 may generate gate signals or emission signals based on the gate control signal received from the first gate control line SCL1. The second gate driver 352 may be located on the other outer side of the display area DA or on the other side of the non-display area NDA. The second gate driver 352 may generate gate signals or emission signals based on the gate control signal received from the second gate control line SCL2. For another example, the gate drivers 350 may be may be implemented as a single gate driver and may be located on one side of the non-display area NDA.

The gate drivers 350 may include a plurality of thin-film transistors. The plurality of thin-film transistors of the gate drivers 350 may generate gate signals or emission signals based on the gate control signal. For example, the thin-film transistors of the gate drivers 350 may be located on the same layer as the thin-film transistors of each of the pixels.

The non-display area NDA may include a sub-area SBA protruding from one side of the non-display area NDA.

The sub-area SBA may protrude from one side of the non-display area NDA in the second direction (y-axis direction). For example, the length of the sub-area SBA in the first direction (x-axis direction) may be smaller than the length of the display area DA in the first direction (x-axis direction). The length of the sub-area SBA in the second direction (y-axis direction) may be smaller than the length of the display area DA in the second direction (y-axis direction). It is, however, to be understood that embodiments according to the present disclosure are not limited thereto. The sub-area SBA may be bent and may be located under the display panel 300. In such case, the sub-area SBA may overlap the display area DA in the third direction (z-axis direction).

The display driver 310 and the circuit board 320 may be located in the sub-area SBA of the display panel 300. The circuit board 320 may be attached on the pads of the sub-area SBA of the display panel 300 using a low-resistance, high-reliability material such as an anisotropic conductive film (SAP) and self assembly anisotropic conductive paste (SAP).

Figure 5:
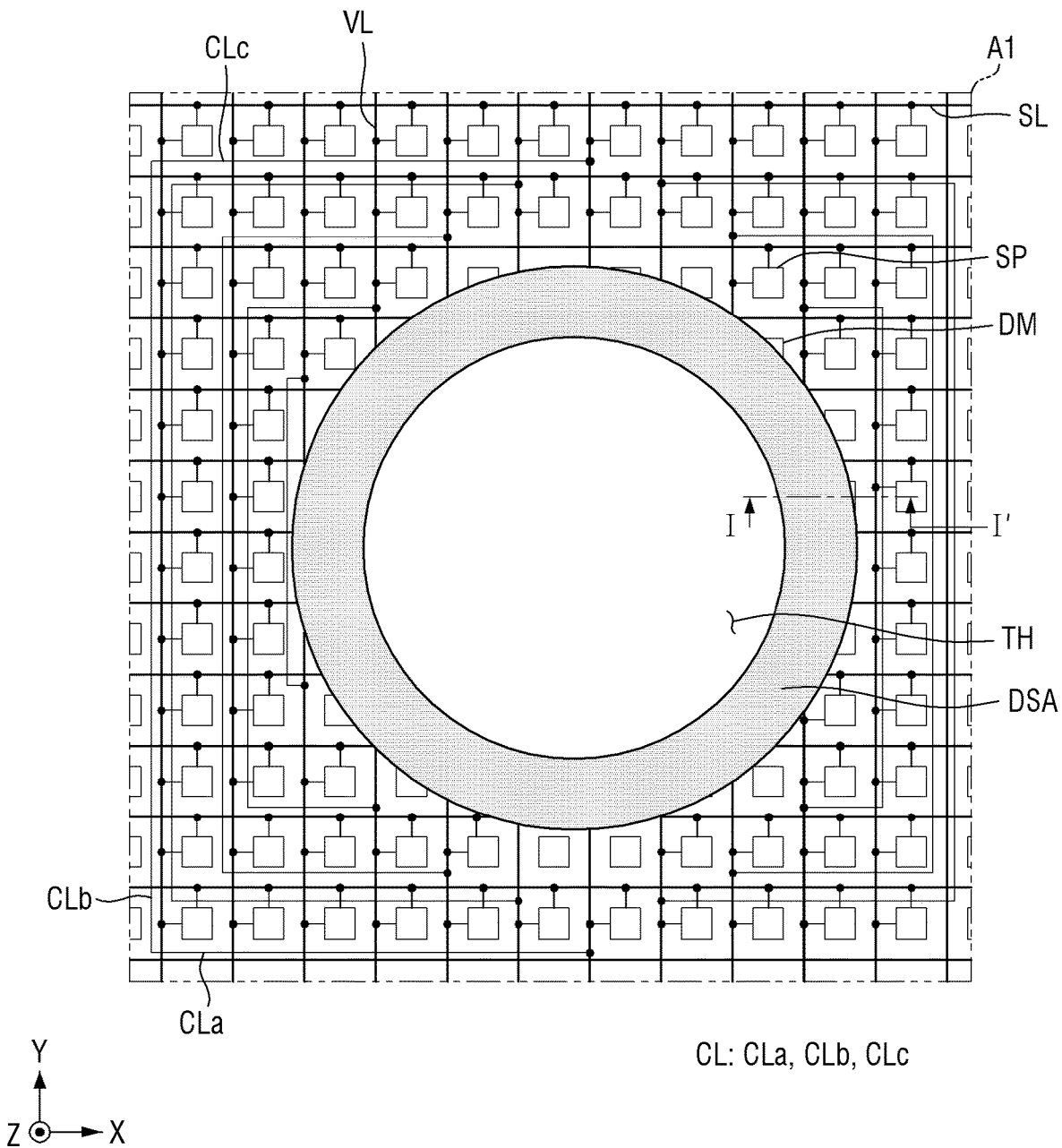
FIG. 5 is an enlarged view of the area A1 of FIGS. 3 and 4.

FIG. 5 is an enlarged view of area A1 of FIGS. 3 and 4.

Referring to FIG. 5, the display panel 300 may include a through hole TH, a dead space area DSA, and a display area DA.

The through hole TH may penetrate through the display panel 300 in the third direction (z-axis direction). The through hole TH may be surrounded by the dead space area DSA and the display area DA when viewed from the top.

The dead space area DSA may surround the through hole TH. In the dead space area DSA, the plurality of pixels SP, the plurality of first lines VL and the plurality of second lines SL may not be located. The dead space area DSA may be the non-display area where no image is displayed. The dead space area DSA can prevent electrodes located in the display area DA from extending to the through hole TH. For example, the dead space area DSA includes a groove having an undercut structure in the base part, so that an emissive layer or a cathode electrode of the light-emitting element of the display area DA can be disconnected. Therefore, the dead space area DSA can prevent or reduce air or moisture permeating into the display area DA through the through hole TH.

The display area DA may surround the dead space area DSA. The display area DA may be spaced apart from the through hole TH with the dead space area DSA therebetween.

The connection lines CL may extend around the through hole to connect the first lines VL spaced apart from each other. The connection lines CL may be located in a different layer from the plurality of first lines VL, so that they can bypass the through hole TH and can be extended in the display area DA in which the plurality of pixels is located. The connection lines CL may connect the first lines VL terminated at one side of the through hole TH with the first lines VL terminated at the other side of the through hole TH. As the display device 10 includes the connection lines CL bypassing the through hole TH in the display area DA, it does not require a separate line area or a wiring area connecting the lines located on both sides of the through hole TH. As a result, it is possible to reduce the dead space area DSA created by the through hole TH. By reducing the dead space area DSA in the display device 10, it is possible to avoid the number of the pixels from reducing due to the dead space area DSA and thus the image quality can be improved.

Each of the connection lines CL may include first to third portions CLa, CLb, and CLc.

The first portion CLa of the connection line CL may be connected to the first line VL terminated at one side of the through hole TH. The first portion CLa of the connection line CL may extend in a direction crossing the direction in which the first lines VL are extended. For example, the first portion CLa of the connection line CL may extend in the first direction (x-axis direction) in the display area DA. The connection lines CL may have longer first portions CLa as the respective first lines VL connected thereto have the coordinates in the first direction (x-axis direction) closer to the center of the through hole TH. The first portions CLa of the connection lines CL may be located adjacent to and extending in parallel with the second lines SL when viewed from the top. For example, the first portion CLa of the connection line CL may be located adjacent to and may extend in parallel with the gate line or the emission control line when viewed from the top.

The second portion CLb of the connection line CL may be connected between the first portion CLa and the third portion CLc. The second portion CLb of the connection line CL may be bent from the first portion CLa and may extend in a direction parallel to the first lines VL. For example, the second portion CLb of the connection line CL may extend in the second direction (y-axis direction) in the display area DA. The second portion CLb of the connection line CL may be located adjacent to and may extend in parallel with the first lines VL which are not disconnected by the through hole TH when viewed from the top. For example, the second portion CLb of the connection line CL may be located adjacent to and may extend in parallel with the data line or the driving voltage line when viewed from the top.

The third portion CLc of the connection line CL may be connected to the first line VL terminated at the other side of the through hole TH. The third portion CLc of the connection line CL may extend in a direction crossing the direction in which the first lines VL are extended. For example, the third portion CLc of the connection line CL may extend in the first direction (x-axis direction) in the display area DA. The connection lines CL may have longer third portions CLc as the respective first lines VL connected thereto have the coordinates in the first direction (x-axis direction) closer to the center of the through hole TH. The third portions CLc of the connection lines CL may be located adjacent to and extended in parallel with the second lines SL when viewed from the top. For example, the third portion CLc of the connection line CL may be located adjacent to and may extend in parallel with the gate line or the emission control line when viewed from the top.

For another example, the first to third portions CLa, CLb and CLc of each of the connection lines CL may be connected to one another to form a curved line. The configuration of the connection lines CL is not limited to the first to third portions CLa, CLb and CLc shown in FIG. 5 but may have a variety of shapes to connect between the first lines VL located on the both sides of the through hole TH.

The plurality of second lines SL may extend in the first direction (x-axis direction), and may be spaced apart from each other in the second direction (y-axis direction). The plurality of second lines SL may be connected to the first gate driver 351 or the second gate driver 352. Some of the second lines SL may not pass through the through hole TH while some others of the second lines SL may be disconnected by the through hole TH. For example, some of the second lines SL which do not pass through the through hole TH may be connected to both the first and second gate drivers 351 and 352. Some others of the second lines SL which are disconnected by the through hole TH may be connected to one of the first and second gate drivers 351 and 352. The second lines SL terminated at one side of the through hole TH may be connected to the first gate driver 351 located on one side of the non-display area NDA, while the second lines SL terminated at the other side of the through hole TH may be connected to the second gate driver 352 located on the opposite side of the non-display area NDA. For example, the plurality of second lines SL may include a plurality of gate lines and a plurality of emission control lines. The gate lines may supply gate signals to the pixels, and the emission control line may supply emission signals to the pixels.

For example, the display panel 300 may further include a dummy electrode DM located between the display area DA and the dead space area DSA. The dummy electrode DM may be made of the same material on the same layer as the first electrode of the light-emitting element of each of the plurality of pixels SP. The dummy electrode DM may not be connected to the first lines VL or the second lines SL. For example, the dummy electrode DM may be electrically floating. For another example, the dummy electrode DM may be grounded to a specific voltage. The dummy electrode DM can prevent or reduce instances of static electricity being generated or introduced between the through hole TH or the dead space area DSA and the display area DA.

Figure 6:
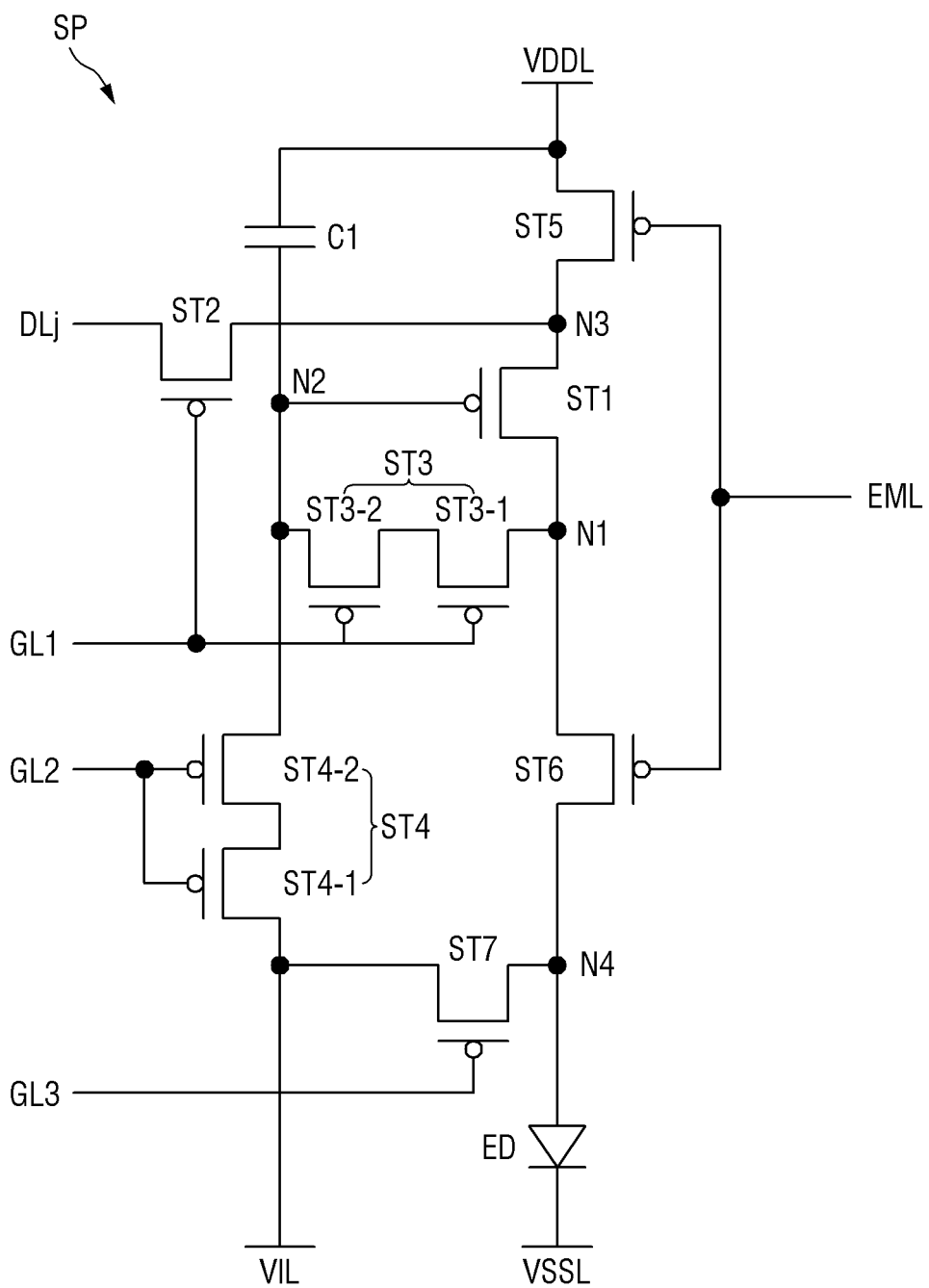
FIG. 6 is a circuit diagram showing one of the pixels shown in FIG. 5.

FIG. 6 is a circuit diagram showing one of the pixels shown in FIG. 5.

Referring to FIG. 6, the display panel 300 may include a plurality of pixels SP arranged along k rows and j columns, where k and j are natural numbers. Each of the plurality of pixels SP may be connected to a first gate line GL1, a second gate line GL2, a third gate line GL3, an emission control line EML, a data line DL, and a driving voltage line VDDL, and an initialization voltage line VIL. The data line DL and the driving voltage line VDDL may be the first lines VL extended in the second direction (y-axis direction) in the display area DA. The first gate line GL1, the second gate line GL2, the third gate line GL3 and the emission control line EML may be the second lines SL extended in the first direction (x-axis direction) in the display area DA.

Each of the plurality of pixels SP may include a light-emitting element ED, a plurality of switching elements, and a capacitor C1. The switching elements may include first to seventh transistors ST1, ST2, ST3, ST4, ST5, ST6 and ST7.

The first transistor ST1 may include a gate electrode, a source electrode, and a drain electrode. The drain electrode of the first transistor ST1 may be connected to a first node N1, the gate electrode thereof may be connected to a second node N2, and the source electrode thereof may be connected to a third node N3. The first transistor ST1 may control the source-drain current Isd (hereinafter referred to as a driving current) in response to the data voltage applied to the gate electrode (hereinafter referred to as Vdata).

The light-emitting element ED may receive the driving current to emit light. The amount or the brightness of the light emitted from the light-emitting element ED may be proportional to the magnitude of the driving current.

The light-emitting element ED may be an organic light-emitting element including an anode electrode, a cathode electrode, and an organic emissive layer located between the anode electrode and the cathode electrode. Alternatively, the light-emitting element ED may be an inorganic light-emitting element including an anode electrode, a cathode electrode, and an inorganic semiconductor located between the anode electrode and the cathode electrode. Alternatively, the light-emitting element ED may be a quantum-dot light-emitting element including an anode electrode, a cathode electrode, and a quantum-dot emissive layer located between the anode electrode and the cathode electrode. Alternatively, the light-emitting element ED may be a micro light-emitting element.

The anode electrode of the light-emitting element ED may be connected to a fourth node N4. The anode electrode of the light-emitting element ED may be connected to the drain electrode of the sixth transistor ST6 and the drain electrode of the seventh transistor ST7 through the fourth node N4. The cathode electrode of the light-emitting element ED may be connected to a low-level voltage line VSSL. A parasitic capacitance may be formed between the anode electrode and the cathode electrode of the light-emitting element ED.

The second transistor ST2 may be turned on by the gate signal of the first gate line GL1 to connect the data line DL with the third node N3 which is the source electrode of the first transistor ST1. The second transistor ST2 may be turned on in response to the gate signal to apply data voltage Vdata to the third node N3. The gate electrode of the second transistor ST2 may be connected to the first gate line GL1, the source electrode thereof may be connected to the data line DL, and the drain electrode thereof may be connected to the third node N3. The drain electrode of the second transistor ST2 may be connected to the source electrode of the first transistor ST1 and the drain electrode of the fifth transistor ST5 through the third node N3.

The third transistor ST3 may be turned on by the gate signal of the first gate line GL1 to connect the first node N1 which is the drain electrode of the first transistor ST1 with the second node N2 which is the gate electrode of the first transistor ST1. For example, the third transistor ST3 may be a dual transistor including a (3-1) transistor ST3-1 and a (3-2) transistor ST3-2. The gate electrode of the (3-1) transistor ST3-1 may be connected to the first gate line GL1, the source electrode thereof may be connected to the first node N1, and the drain electrode thereof may be connected to the source electrode of the (3-2) transistor ST3-2. The gate electrode of the (3-2) transistor ST3-2 may be connected to the first gate line GL1, the source electrode thereof may be connected to the drain electrode of the (3-1) transistor ST3-1, and the drain electrode thereof may be connected to the second node N2.

The fourth transistor ST4 may be turned on by the gate signal of the second gate line GL2 to connect the initialization voltage line VIL with the second node N2 which is the gate electrode of the first transistor ST1. For example, the fourth transistor ST4 may be a dual transistor including a (4-1) transistor ST4-1 and a (4-2) transistor ST4-2. The (4-1) transistor ST4-1 and the (4-2) transistor ST4-2 may be turned on in response to the gate signal of the second gate line GL2 to thereby discharge the gate electrode of the first transistor ST1 to an initialization voltage VI. The gate electrode of the (4-1) transistor ST4-1 may be connected to the second gate line GL2, the source electrode thereof may be connected to the initialization voltage line VIL, and the drain electrode thereof may be connected to the source electrode of the (4-2) transistor ST4-2. The gate electrode of the (4-2) transistor ST4-2 may be connected to the second gate line GL2, the source electrode thereof may be connected to the drain electrode of the (4-1) transistor ST4-1, and the drain electrode thereof may be connected to the second node N2.

The fifth transistor ST5 may be turned on by an emission signal of the emission control line EML and may connect the driving voltage line VDDL with the third node N1 which is the source electrode of the first transistor ST1. The gate electrode of the fifth transistor ST5 may be connected to the emission control line EML, the source electrode thereof may be connected to the driving voltage line VDDL, and the drain electrode thereof may be connected to the third node N3. The drain electrode of the fifth transistor ST5 may be connected to the source electrode of the first transistor ST1 and the drain electrode of the second transistor ST2 through the third node N3.

The sixth transistor ST6 may be turned on by the emission signal of the emission control line EML to connect the first node N1 which is the drain electrode of the first transistor ST1 with the fourth node N4 which is the anode electrode of the light-emitting element ED. The gate electrode of the sixth transistor ST6 may be connected to the emission control line EML, the source electrode thereof may be connected to the first node N1, and the drain electrode thereof may be connected to the fourth node N4. The source electrode of the sixth transistor ST6 may be connected to the drain electrode of the first transistor ST1 and the source electrode of the (3-1) transistor ST3-1 through the first node N1. The drain electrode of the sixth transistor ST6 may be connected to the anode electrode of the light-emitting element ED and the drain electrode of the seventh transistor ST7 through the fourth node N4.

When all of the fifth transistor ST5, the first transistor ST1 and the sixth transistor ST6 are turned on, the driving current may be supplied to the light-emitting element ED.

The seventh transistor ST7 may be turned on by the gate signal of the third gate line GL3 to connect the initialization voltage line VIL with the fourth node N4 which is the anode electrode of the light-emitting element ED. The seventh transistor ST7 may be turned on in response to the gate signal, thereby discharging the anode electrode of the light-emitting element ED to the initialization voltage VI. The gate electrode of the seventh transistor ST7 may be connected to the third gate line GL3, the source electrode thereof may be connected to the initialization voltage line VIL, and the drain electrode thereof may be connected to the fourth node N4. The drain electrode of the seventh transistor ST7 may be connected to the anode electrode of the light-emitting element ED and the drain electrode of the sixth transistor ST6 through the fourth node N4.

Each of the first to seventh transistors ST1 to ST7 may include a silicon-based active layer. For example, each of the first to seventh transistors ST1 to ST7 may include an active layer made of low-temperature polycrystalline silicon (LTPS). The active layer made of low-temperature polycrystalline silicon may have a high electron mobility and excellent turn-on characteristics. Therefore, the display device 10 includes the first to seventh transistors ST1 to ST7 having excellent turn-on characteristics, so that the plurality of pixels SP can be driven stably and efficiently.

Each of the first to seventh transistors ST1 to ST7 may be a p-type transistor. For example, each of the first to seventh transistors ST1 to ST7 may output a current flowing into the source electrode to the drain electrode in response to a gate-low voltage applied to the gate electrode.

The capacitor C1 may be connected between the second node N2 which is the gate electrode of the first transistor ST1 and the driving voltage line VDDL. For example, the first electrode of the capacitor C1 is connected to the second node N2, and the second electrode of the capacitor C1 is connected to the driving voltage line VDDL, so that the potential difference between the driving voltage line VDDL and the gate electrode of the first transistor ST1 can be held.

Figure 7:
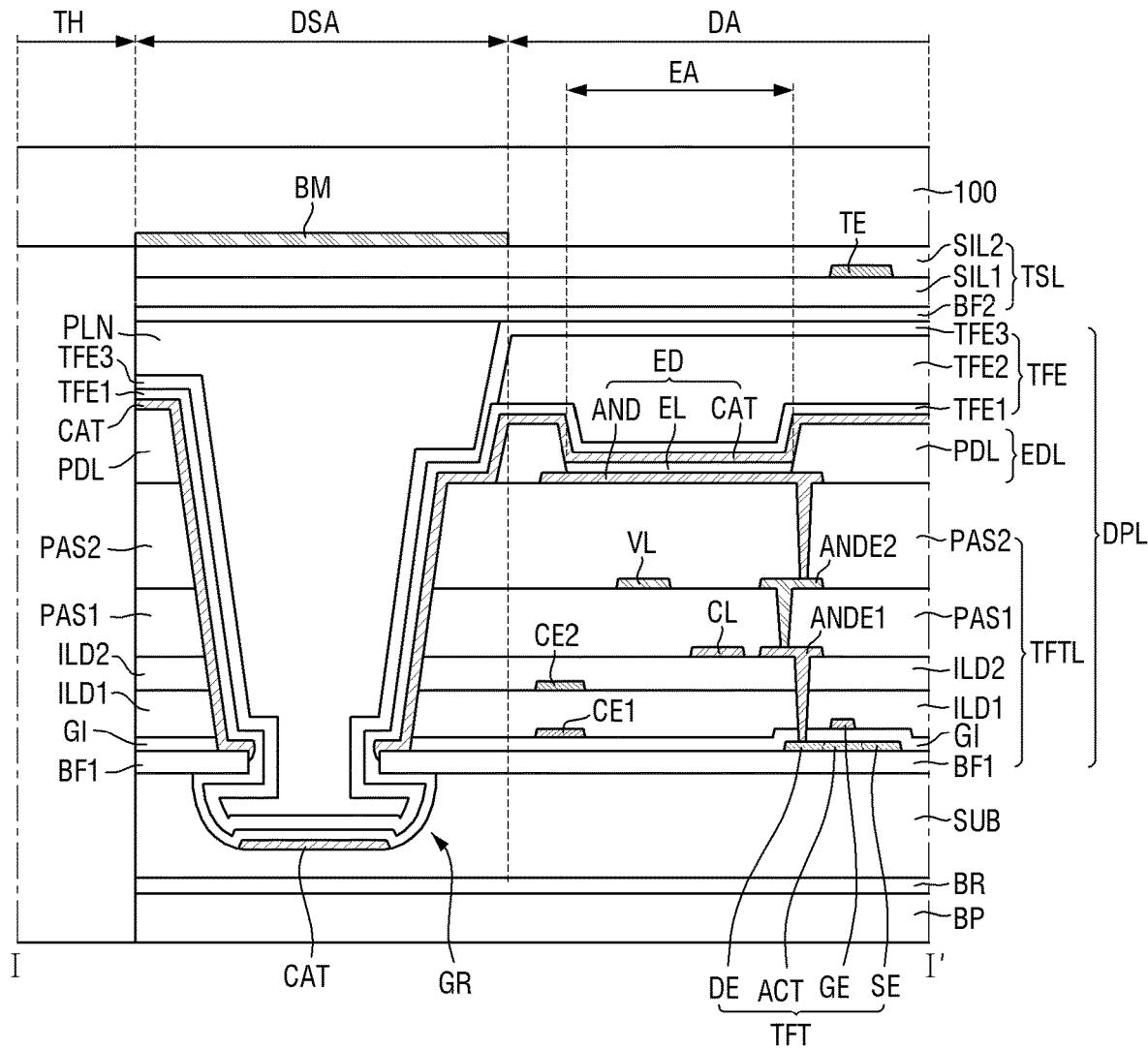
FIG. 7 is a cross-sectional view, taken along the line I-I' of FIG. 5.

FIG. 7 is a cross-sectional view, taken along line I-I' of FIG. 5.

Referring to FIG. 7, the display panel 300 may include a substrate SUB, a barrier layer BR, a bottom panel part BP, a display layer DPL, and a touch electrode layer TSL.

The substrate SUB may be a base substrate or a base part and may be made of an insulating material such as a polymer resin. For example, the substrate SUB may be a flexible substrate that can be bent, folded, or rolled.

The barrier layer BR may be located under the substrate SUB. The barrier layer BR can prevent or reduce instances of outside air or moisture permeating into the substrate SUB.

The bottom panel part BP may be located under the barrier layer BR. The bottom panel part BP may include at least one of a heat-dissipating layer for efficiently discharging heat from the display panel 300, an electromagnetic wave blocking layer for blocking light incident from the outside, and a buffer layer for absorbing impact from the outside.

The display layer DPL may include a thin-film transistor layer TFTL, a light-emitting element layer EDL, an encapsulation layer TFE.

The thin-film transistor layer TFTL may include a first buffer layer BF1, a thin-film transistor TFT, a gate insulating layer GI, a first interlayer dielectric layer ILD1, first and second capacitor electrodes CE1 and CE2, and a second interlayer dielectric layer ILD2, a first conductive layer SDL1, a first passivation layer PAS1, a second conductive layer SDL2, and a second passivation layer PAS2.

The first buffer layer BF1 may be located on the substrate SUB. For example, the first buffer layer BF1 may include at least one inorganic layer, and may be formed on the entire upper surface of the substrate SUB in order to block moisture permeating into the light-emitting element ED through the substrate SUB.

The thin-film transistor TFT may be located on the first buffer layer BF1, and may form a pixel circuit of each of a plurality of pixels SP. For example, the thin-film transistor TFT may be a switching element of the pixel circuit. The thin-film transistor TFT may include a semiconductor layer ACT, a gate electrode GE, a source electrode SE, and a drain electrode DE.

The semiconductor layer ACT may include polycrystalline silicon, single crystal silicon, low-temperature polycrystalline silicon, amorphous silicon, or an oxide semiconductor. When the semiconductor layer ACT is made of polycrystalline, the ion-doped semiconductor layer ACT can have conductivity. Accordingly, the source electrode SE and the drain electrode DE may be formed by doping ions into the semiconductor layer ACT.

The gate electrode GE may be located on the gate insulating layer GI. The gate electrode GE may overlap the semiconductor layer ACT with the gate insulating layer GI interposed therebetween.

The gate insulating layer GI may be located on the semiconductor layer ACT. For example, the gate insulating layer GI may cover the semiconductor layer ACT, the source electrode SE, the drain electrode DE ff the first buffer layer BF1, and may insulate the semiconductor layer ACT from the gate electrode GE. The gate insulating layer GI may include a contact hole through which a first anode connection electrode ANDE1 passes.

The first interlayer dielectric layer ILD1 may be located over the gate electrode GE. The first interlayer dielectric layer ILD1 may cover the gate electrode GE and the first capacitor electrode CE1. For example, the first interlayer dielectric layer ILD1 may include a contact hole through which the first anode connection electrode ANDE1 passes. The contact hole of the first interlayer dielectric layer ILD1 may be connected to the contact hole of the gate insulating layer GI and the contact hole of the second interlayer dielectric layer ILD2.

The first capacitor electrode CE1 may be located on the gate insulating layer GI, and the second capacitor electrode CE2 may be located on the first interlayer dielectric layer ILD1. The first and second capacitor electrodes CE1 and CE2 may overlap in the third direction (z-axis direction).

The second interlayer dielectric layer ILD2 may cover the second capacitor electrode CE2 and the first interlayer dielectric layer ILD1. For example, the second interlayer dielectric layer ILD2 may include a contact hole through which the first anode connection electrode ANDE1 passes. The contact hole of the s e interlayer dielectric layer ILD2 may be connected to the contact hole of the first interlayer dielectric layer ILD1 and the contact hole of the gate insulating layer GI.

The first conductive layer SDL1 may be located on the second interlayer insulating layer ILD2. The first conductive layer SDL1 may include a first anode connection electrode ANDE1 and a connection line CL. Each of the first anode connection electrode ANDE1 and the connection line CL may be made up of a single layer or multiple layers of at least one of molybdenum (Mo), aluminum (Al), chromium (Cr), gold (Au), titanium (Ti), nickel (Ni), neodymium (Nd) and copper (Cu).

The first anode connection electrode ANDE1 may be connected to the drain electrode DE of the thin-film transistor TFT through a contact hole penetrating through the gate insulating layer GI and the first and second interlayer dielectric layers ILD1 and ILD2.

The connection lines CL may be located in a different layer from the plurality of first lines VL and may connect between the first lines VL spaced apart from one another by the through hole TH among the plurality of first lines VL. The connection lines CL may connect the first lines VL terminated at one side of the through hole TH with the first lines VL terminated at the other side of the through hole TH.

The first passivation layer PAS1 may be located above the thin-film transistor TFT to protect the thin-film transistor TFT. The first passivation layer PAS1 may cover the first conductive layer SDL1 and may include a contact hole through which the second anode connection electrode ANDE2 passes.

The second conductive layer SDL2 may be located on the first passivation layer PAS1. The second conductive layer SDL2 may include the second anode connection electrode ANDE2 and the plurality of first lines VL. Each of the second anode connection electrode ANDE2 and the first lines VL may be made up of a single layer or multiple layers of at least one of molybdenum (Mo), aluminum (Al), chromium (Cr), gold (Au), titanium (Ti), nickel (Ni), neodymium (Nd) and copper (Cu).

The second anode connection electrode ANDE2 may be connected to the first anode connection electrode ANDE1 through a contact hole penetrating through the first passivation layer PAS1.

The plurality of first lines VL may be connected to the display driver 310 and may traverse the display area DA in the second direction (y-axis direction). The plurality of first lines VL may include a plurality of data lines DL and a plurality of driving voltage lines VDDL. For example, some of the first lines VL which do not pass through the through hole TH may extend from the side of the display area DA which faces the display driver 310 to the opposite side of the display area DA. Some others of the first lines VL which are disconnected by the through hole TH may be connected with one another by the connection lines CL.

The display device 10 includes the connection lines CL located in a different layer from the first lines VL, thereby connecting between the first lines VL located on the both sides of the through hole TH around the through hole in the display area DA. Accordingly, the display device 10 does not require any additional line area or wiring area for connecting between the first lines VL located on the both sides of the through hole TH, thereby reducing the dead space area created by the through hole TH.

For another example, the plurality of first lines VL may be located in the first conductive layer SDL1, and the connection lines CL may be located in the second conductive layer SDL2. Therefore, the arrangement relationship between the plurality of first lines VL and the connection lines CL is not limited to that shown in FIG. 7.

The second passivation layer PAS2 may be located on the first passivation layer PAS1 to cover the second conductive layer SDL2 and the first passivation layer PAS1. The second passivation PAS2 may include a contact hole through which the first electrode AND of the light-emitting element ED passes.

The light-emitting element layer EDL may be located on the thin-film transistor layer TFTL. The light-emitting element layer EDL may include a light-emitting element ED and a pixel-defining layer PDL. The light-emitting element ED may include a first electrode AND, an emissive layer EL, and a second electrode CAT.

The first electrode AND may be located on the second passivation layer PAS2. For example, the first electrode AND may be located to overlap at least one emission area EA defined by the pixel-defining layer PDL. The first electrode AND may be connected to the drain electrode DE of the thin-film transistor TFT through the first and second anode connection electrodes ANDE1 and ANDE2.

The emissive layer EL may be located on the first electrode AND. The emissive layer EL may include a hole injecting layer, a hole transporting layer, a light-receiving layer, an electron blocking layer, an electron transporting layer, an electron injecting layer, etc. For example, the emissive layer EL may be, but is not limited to, an organic emission layer made of an organic material. If the emissive layer EL is an organic emissive layer, when the thin-film transistor applies a voltage (e.g., a set or predetermined voltage) to the first electrode AND of the light-emitting element ED and the second electrode CAT of the light-emitting element ED receives a common voltage or cathode voltage, the holes and electrons may move to the organic emissive layer EL through the hole transporting layer and the electron transporting layer, respectively, and they combine in the organic layer E to emit light.

The second electrode CAT may be located on the emissive layer EL. For example, the second electrode CAT may be implemented as an electrode common to all pixels, instead of being located as a separated electrode for each of the pixels. For example, the second electrode CAT may be located on the emissive layer EL in the emission area EA and may be located on the pixel-defining layer PDL except for the emission area EA.

The pixel-defining layer PDL may define a plurality of emission areas EA. The pixel-defining layer PDL may separate and insulate the first electrode AND of one of the plurality of light-emitting elements ED from the anode electrode of another one of the light-emitting elements ED.

The encapsulation layer TFE may be located on the light-emitting element layer EDL. The encapsulation layer TFE may include at least one inorganic layer to prevent or reduce permeation of oxygen or moisture into the light-emitting element layer EDL. The encapsulation layer TFEL may include at least one organic layer to protect the light-emitting element layer EDL from foreign substances such as dust.

The encapsulation layer TFE may include first to third encapsulation layers TFE1, TFE2 and TFE3. The first encapsulation layer TFE1 may be located on the second electrode CAT of the light-emitting element ED, the second encapsulation layer TFE2 may be located on the first encapsulation layer TFE1, and the third encapsulation layer TFE3 may be located on the second encapsulation layer TFE2. For example, each of the first and third encapsulation layers TFE1 and TFE3 may include at least one inorganic layer of a silicon nitride layer, a silicon oxynitride layer, a silicon oxide layer, a titanium oxide layer, and an aluminum oxide layer. The second encapsulation layer TFE2 may be an organic layer including at least one of an acrylic resin, an epoxy resin, a phenol resin, a polyamide resin, or a polyimide resin.

The touch electrode layer TSL may include a second buffer layer BF2, a first touch insulating layer SIL1, a plurality of touch electrodes TE, and a second touch insulating layer SIL2.

The second buffer layer BF2 may be located on the display layer DPL. For example, the second buffer layer BF2 may include at least one inorganic layer, and may be formed on the entire upper surface of the display layer DPL in order to block moisture permeating into the light-emitting element ED. Optionally, the second buffer layer BF2 may be eliminated.

The first touch insulating layer SIL1 may be located on the second buffer layer BF2. For example, the first touch insulating layer SIL1 may be formed of an inorganic layer, for example, a silicon nitride layer, a silicon oxynitride layer, a silicon oxide layer, a titanium oxide layer, or an aluminum oxide layer. Alternatively, the first touch insulating layer SIL1 may be an organic layer including at least one an acryl resin, an epoxy resin, a phenolic resin, a polyamide resin and a polyimide resin.

The plurality of touch electrodes TE may be located on the first touch insulating layer SIL1. The touch driver 340 may determine whether there is a user's touch and the position of the user's touch, if any, based on a change in the capacitance of the touch electrodes TE.

The second touch insulating layer SIL2 may cover the plurality of touch electrodes TE and the first touch insulating layer SIL1. The second touch insulating layer SIL2 may be made of one of the above-listed materials as the material of the first touch insulating layer SIL1.

The cover window 100 may be located on the touch electrode layer TSL. Optionally, a polarizing film or shock-absorbing layer may be located between the cover window 100 and the touch electrode layer TSL.

The dead space area DSA may be located between the through hole TH and the display area DA. In the dead space area DSA, the plurality of pixels SP, the plurality of first lines VL and the plurality of second lines SL may not be located. The dead space area DSA may be the non-display area where no image is displayed. The dead space area DSA can prevent electrodes located in the display area DA from extending to the through hole TH.

The dead space area DSA may include a groove GR having an undercut structure in the substrate SUB. For example, the thin-film transistor layer TFTL and the pixel-defining layer PDL may be formed throughout the entire surface of the substrate SUB, and parts of the thin-film transistor layer TFTL and the pixel-defining layer PDL overlapping at least a part of the dead space area DSA may be etched. The groove GR may be formed after the thin-film transistor layer TFTL is etched to the first buffer layer BF1, and the groove GR may have an undercut structure in the upper portion of the substrate SUB. Therefore, the etched area of the upper portion of the substrate SUB may be larger than the etched area of the first buffer layer BF1.

The second electrode CAT of the light-emitting element ED may be implemented as an electrode common to all pixels SP, instead of being located as a separated electrode for each of the pixels SP. For example, the second electrode CAT of the light-emitting element ED is formed throughout on the entire display area DA and dead space area DSA after the groove GR of the dead space area DSA is formed. In such case, the second electrode CAT of the light-emitting element ED may be disconnected by the groove GR in the dead space area DSA. Therefore, the dead space area DSA can prevent or reduce instances of air or moisture permeating into the display area DA through the second electrode CAT adjacent to the through hole TH.

The first and third encapsulation layers TFE1 and TFE3 may be sequentially stacked on the second electrode CAT of the light-emitting element ED in the dead space area DSA.

A planarization layer PLN may be located on the third encapsulation layer TFE3, so that the space etched by the groove GR may be filled with it, and the display area DA and the dead space area DSA may have a flat upper surface.

The dead space area DSA may further include a light-blocking pattern BM. The light-blocking pattern BM can prevent or reduce outside light from being incident on the display area DA through the through hole TH or the dead space area DSA. The light-blocking pattern BM may be located on the touch electrode layer TSL, and may overlap the groove GR of the dead space area DSA.

Figure 8:
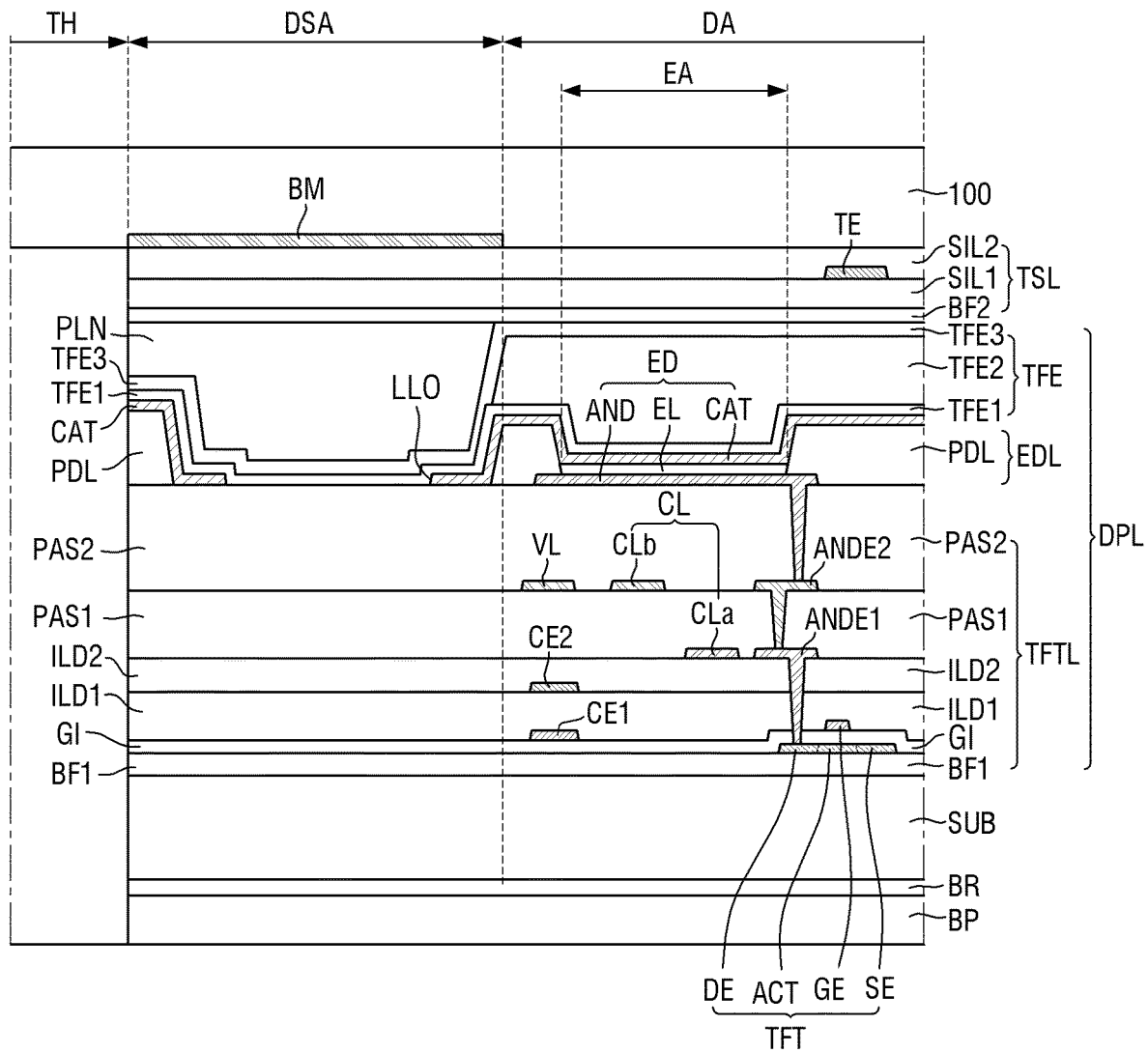
FIG. 8 is another cross-sectional view of a display panel according to some example embodiments of the present disclosure.

FIG. 8 is another cross-sectional view of a display panel according to some example embodiments of the present disclosure. The display panel of FIG. 8 is substantially identical to the display panel of FIG. 7 except for the configuration of connection lines CL and the configuration of a laser cut LLO; and, therefore, some redundant description may be omitted Referring to FIG. 8, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a thin-film transistor TFT, a gate insulating layer GI, a first interlayer dielectric layer ILD1, first and second capacitor electrodes CE1 and CE2, and a second interlayer dielectric layer ILD2, a first conductive layer SDL1, a first passivation layer PAS1, a second conductive layer SDL2, and a second passivation layer PAS2.

Each of the connection lines CL may include first to third portions CLa, CLb, and CLc.

The first portion CLa of the connection line CL may be connected to the respective first line VL terminated at one side of the through hole TH. The first portion CLa of the connection line CL may extend in a direction crossing the direction in which the first lines VL are extended.

The second portion CLb of the connection line CL may be connected between the first portion CLa and the third portion CLc. The second portion CLb of the connection line CL may be bent from the first portion CLa and may extend in a direction parallel to the first line VL.

The third portion CLc of the connection line CL may be connected to the respective first line VL terminated at the other side of the through hole TH. The third portion CLc of the connection line CL may extend in a direction crossing the direction in which the first line VL is extended. According to some example embodiments, a third portion CLc of the connection line CL may be spaced apart from the first portion CLa of the connection line CL and may be located in the same layer as the first portion CLa of the connection line CL. The plurality of first lines VL and the second portions CLb of the connection lines CL may be located in one of the first and second conductive layers SDL1 and SDL2, while the first portions CLa and the third portions CLc of the connection lines CL may be located in the other one of the first and second conductive layers SDL1 and SDL2. For example, the plurality of first lines VL and the second portions CLb of the connection lines CL may be located in the first conductive layer SDL1, while the first portions CLa and the third portions CLc of the connection lines CL may be located in the second conductive layer SDL2.

For another example, the plurality of first lines VL and the second portions CLb of the connection lines CL may be located on the second conductive layer SDL2, while the first portions CLa and the third portions CLc of the connection lines CL may be located in the first conductive layer SDL1. The first portions CLa and the third portions CLc of the connection lines CL intersecting the plurality of first lines VL may be located in a different layer from the plurality of first lines VL and thus may be insulated from the plurality of first lines VL. The second portions CLb of the connection lines CL in parallel with the plurality of first lines VL may be located on the same layer as the plurality of first lines VL and thus may be insulated from the plurality of first lines VL. Accordingly, the connection lines CL may connect between the first lines VL spaced apart from one another by the through hole TH.

The dead space area DSA may be located between the through hole TH and the display area DA. In the dead space area DSA, the plurality of pixels SP, the plurality of first lines VL and the plurality of second lines SL may not be located. The dead space area DSA may be the non-display area where no image is displayed. The dead space area DSA can prevent the electrodes located in the display area DA from extending to the through hole TH.

The dead space area DSA may include the laser cut LLO that disconnects the second electrode CAT of the light-emitting element ED. For example, the second electrode CAT of the light-emitting element ED may be implemented as an electrode common to all pixels SP, instead of being located as a separated electrode for each of the pixels SP. The second electrode CAT may cover the entire surface of the display area DA and may extend to the dead space area DSA. The second electrode CAT of the dead space area DSA may be located on the second passivation layer PAS2 of the thin-film transistor layer TFTL. For example, the laser cut LLO may be formed by removing a part of the second electrode CAT using a laser before the encapsulation layer TFE is formed on the second electrode CAT. As the dead space area DSA includes the laser cut LLO, the cathode electrode CAT of the light-emitting element ED in the display area DA may be disconnected. Therefore, the dead space area DSA can prevent or reduce instances of air or moisture permeating into the display area DA through the through hole TH.

The dead space area DSA may optionally include the groove GR of FIG. 7 or the laser cut LLO of FIG. 8, and embodiments according to the present disclosure are not limited to those shown in the drawings.

Figure 9:
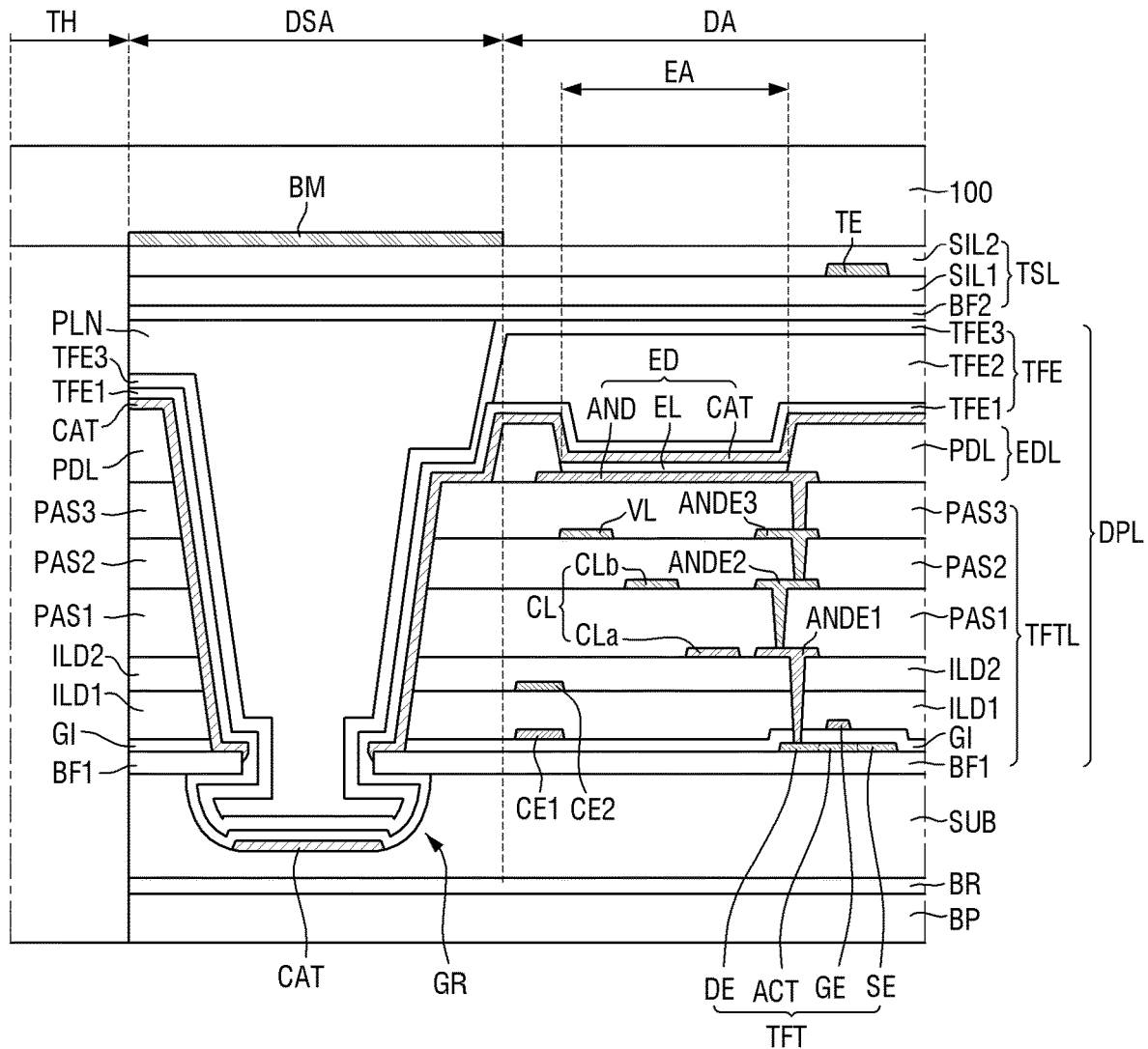
FIG. 9 is yet another cross-sectional view of a display panel according to some example embodiments of the present disclosure.

FIG. 9 is yet another cross-sectional view of a display panel according to some example embodiments of the present disclosure. The display panel of FIG. 9 is substantially identical to the display panel of FIG. 8 except for the stacked structure of the first line VL and the connection line CL; and, therefore, some redundant description may be omitted.

Referring to FIG. 9, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a thin-film transistor TFT, a gate insulating layer GI, a first interlayer dielectric layer ILD1, first and second capacitor electrodes CE1 and CE2, and a second interlayer dielectric layer ILD2, a first conductive layer SDL1, a first passivation layer PAS1, a second conductive layer SDL2, a second passivation layer PAS2, a third conductive layer SDL3, a third passivation layer PAS3.

Each of the connection lines CL may include first to third portions CLa, CLb, and CLc.

The first conductive layer SDL1 may be located on the second interlayer insulating layer ILD2. The first conductive layer SDL1 may include a first anode connection electrode ANDE1 and a first portion CLa of a connection line CL. Each of the first anode connection electrode ANDE1 and the first portion CLa of the connection line CL may be made up of a single layer or multiple layers of at least one of molybdenum (Mo), aluminum (Al), chromium (Cr), gold (Au), titanium (Ti), nickel (Ni), neodymium (Nd), or copper (Cu).

The first passivation layer PAS1 may be located above the thin-film transistor TFT to protect the thin-film transistor TFT. The first passivation layer PAS1 may cover the first conductive layer SDL1 and may include a contact hole through which the second anode connection electrode ANDE2 passes.

The second conductive layer SDL2 may be located on the first passivation layer PAS1. The second conductive layer SDL2 may include a second anode connection electrode ANDE2 and a second portion CLb of the connection line CL. Each of the second anode connection electrode ANDE2 and the second portion CLb of the connection line CL may be made up of a single layer or multiple layers of at least one of molybdenum (Mo), aluminum (Al), chromium (Cr), gold (Au), titanium (Ti), nickel (Ni), neodymium (Nd), or copper (Cu).

The second passivation layer PAS2 may be located on the first passivation layer PAS1 to cover the second conductive layer SDL2 and the first passivation layer PAS1. The second passivation layer PAS2 may include a contact hole through which a third anode connection electrode ANDE3 passes.

The third conductive layer SDL3 may be located on the second passivation layer PAS2. The third conductive layer SDL3 may include the third anode connection electrode ANDE3 and the plurality of first lines VL. Each of the third anode connection electrode ANDE3 and the first lines VL may be made up of a single layer or multiple layers of at least one of molybdenum (Mo), aluminum (Al), chromium (Cr), gold (Au), titanium (Ti), nickel (Ni), neodymium (Nd), or copper (Cu).

The plurality of first lines VL may be connected to the display driver 310 and may traverse the display area DA in the second direction (y-axis direction). The plurality of first lines VL may include a plurality of data lines DL and a plurality of driving voltage lines VDDL. For example, some of the first lines VL which do not pass through the through hole TH may extend from the side of the display area DA which faces the display driver 310 to the opposite side of the display area DA. Some others of the first lines VL which are disconnected by the through hole TH may be connected with one another by the connection lines CL.

The plurality of first lines VL may be located in one of the first to third conductive layers SDL1 to SDL3, the first portions CLa and the third portions CLc of the connection lines CL may be located in another one of the first to third conductive layer SDL1 to SDL3, and the second portions CLb of the connection lines CL may be located in the other one of the first to third conductive layers SDL1 to SDL3. According to some example embodiments, a third portion CLc of the connection line CL may be spaced apart from the first portion CLa of the connection line CL and may be located in the same layer as the first portion CLa of the connection line CL. For example, the first portion CLa and the third portion CLc of the connection line CL may be located in the first conductive layer SDL1, the second portions CLb of the connection line CL may be located on the second conductive layer SDL2, and the plurality of first lines VL may be located on the third conductive layer SDL3. As the first to third portions CLa, CLb and CLc of the connection line CL may be located in a different layer from the plurality of first lines VL and thus may be insulated from the plurality of first lines VL. Accordingly, the connection lines CL may connect between the first lines VL spaced apart from one another by the through hole TH.

The display device 10 includes the connection lines CL located in a different layer from the first lines VL, thereby connecting between the first lines VL located on the both sides of the through hole TH around the through hole in the display area DA. Accordingly, the display device 10 does not require any additional line area or wiring area for connecting between the first lines VL located on the both sides of the through hole TH, thereby reducing the dead space area created by the through hole TH.

Figure 10:
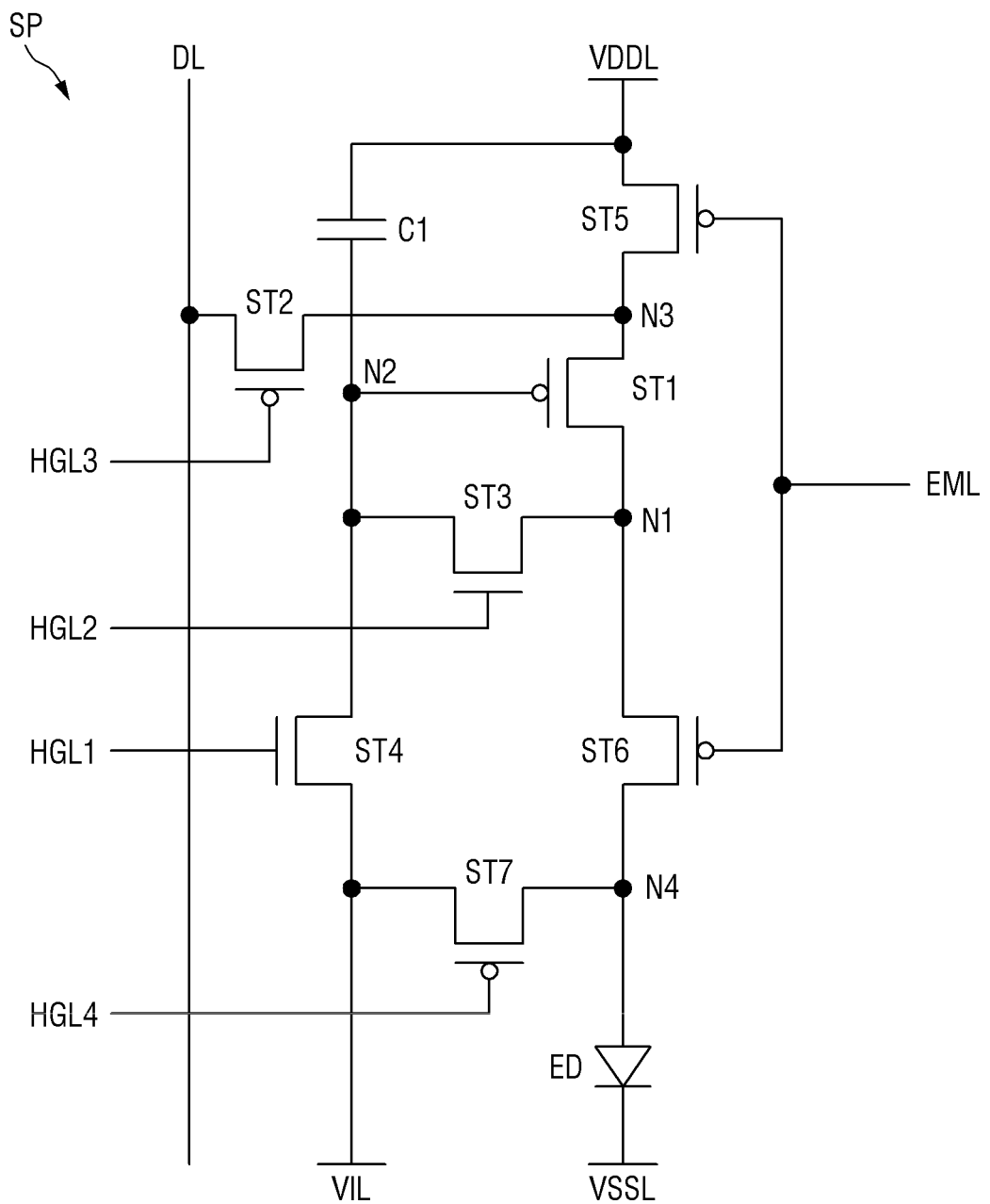
FIG. 10 is another circuit diagram showing one of the pixels shown in FIG. 5.

FIG. 10 is another circuit diagram showing one of the pixels shown in FIG. 5.

Referring to FIG. 10, the display panel 300 may include a plurality of pixels SP arranged along k rows and j columns, where k and j are natural numbers. Each of the plurality of pixels SP may be connected to a first scan line HGL1, a second scan line HGL2, a third scan line HGL3, a fourth scan line HGL4, an emission control line EML, a data line DL, a driving voltage line VDDL, and an initialization voltage line VIL. The data line DL and the driving voltage line VDDL may be the first lines VL extended in the second direction (y-axis direction) in the display area DA. The first to fourth scan lines HGL1 to HGL4 and the emission control line EML may be the second lines SL extended in the first direction (x-axis direction) in the display area DA.

Each of the plurality of pixels SP may include a light-emitting element ED, a plurality of switching elements, and a capacitor C1. The switching elements may include first to seventh transistors ST1, ST2, ST3, ST4, ST5, ST6 and ST7.

The first transistor ST1 may include a gate electrode, a source electrode, and a drain electrode. The gate electrode of the first transistor ST1 may be connected to a first node N1, the drain electrode thereof may be connected to a second node N2, and the source electrode thereof may be connected to a third node N3. The first transistor ST1 may control the source-drain current Isd (hereinafter referred to as "driving current") according to the data voltage applied to the gate electrode.

The light-emitting element ED may receive the driving current to emit light. The amount or the brightness of the light emitted from the light-emitting element ED may be proportional to the magnitude of the driving current.

The light-emitting element ED may be an organic light-emitting element including an anode electrode, a cathode electrode, and an organic emissive layer located between the anode electrode and the cathode electrode. Alternatively, the light-emitting element ED may be an inorganic light-emitting element including an anode electrode, a cathode electrode, and an inorganic semiconductor located between the anode electrode and the cathode electrode. Alternatively, the light-emitting element ED may be an quantum-dot light-emitting element including an anode electrode, a cathode electrode, and a quantum-dot emissive layer located between the anode electrode and the cathode electrode. Alternatively, the light-emitting element ED may be a micro light-emitting element.

The anode electrode of the light-emitting element ED may be connected to a fourth node N4. The anode electrode of the light-emitting element ED may be connected to the drain electrode of the sixth transistor ST6 and the drain electrode of the seventh transistor ST7 through the fourth node N4. The cathode electrode of the light-emitting element ED may be connected to the low-level voltage line VSSL. A parasitic capacitance may be formed between the anode electrode and the cathode electrode of the light-emitting element ED.

The second transistor ST2 may be turned on by the third scan signal of the third scan line HGL3 to connect the data line DL with the third node N3 which is the source electrode of the first transistor ST1. The second transistor ST2 may be turned on in response to the third scan signal to apply data voltage Vdata to the third node N3. The gate electrode of the second transistor ST2 may be connected to the third scan line HGL3, the source electrode thereof may be connected to the data line DL, and the drain electrode thereof may be connected to the third node N3. The drain electrode of the second transistor ST2 may be connected to the source electrode of the first transistor ST1 and the drain electrode of the fifth transistor ST5 through the third node N3.

The third transistor ST3 may be turned on by the second scan signal of the second scan line HGL2 to connect the second node N2 which is the drain electrode of the first transistor ST1 with the first node N1 which is the gate electrode of the first transistor ST1. The gate electrode of the third transistor ST3 may be connected to the second scan line HGL2, the drain electrode thereof may be connected to the second node N2, and the source electrode thereof may be connected to the first node N1. The drain electrode of the third transistor ST3 may be connected to the drain electrode of the first transistor ST1 and the source electrode of the sixth transistor ST6 through the second node N2. The source electrode of the third transistor ST3 may be connected to the gate electrode of the first transistor ST1, the source electrode of the fourth transistor ST4, and the first electrode of the first capacitor C1 through the first node N1.

The fourth transistor ST4 may be turned on by a first scan signal of a first scan line HGL1 to connect the initialization voltage line VIL with the first node N1 which is the gate electrode of the first transistor ST1. The fourth transistor ST4 may be turned on in response to the first scan signal, thereby discharging the gate electrode of the first transistor ST1 to the initialization voltage VI. The gate electrode of the fourth transistor ST4 may be connected to the first scan line HGL1, the drain electrode thereof may be connected to the initialization voltage line VIL, and the source electrode thereof may be connected to the first node N1. The source electrode of the fourth transistor ST4 may be connected to the gate electrode of the first transistor ST1, the source electrode of the third transistor ST3, and the first electrode of the first capacitor C1 through the first node N1.

The fifth transistor ST5 may be turned on by an emission signal of the emission control line EML and may connect the driving voltage line VDDL with the third node N1 which is the source electrode of the first transistor ST1. The gate electrode of the fifth transistor ST5 may be connected to the emission control line EML, the source electrode thereof may be connected to the driving voltage line VDDL, and the drain electrode thereof may be connected to the third node N3. The drain electrode of the fifth transistor ST5 may be electrically connected to the source electrode of the first transistor ST1 and the drain electrode of the second transistor ST2 through the third node N3.

The sixth transistor ST6 may be turned on by the emission signal of the emission control line EML to connect the second node N2 which is the drain electrode of the first transistor ST1 with the fourth node N4 which is the anode electrode of the light-emitting element ED. The gate electrode of the sixth transistor ST6 may be connected to the emission control line EML, the source electrode thereof may be connected to the second node N2, and the drain electrode thereof may be connected to the fourth node N4. The source electrode of the sixth transistor ST6 may be connected to the drain electrode of the first transistor ST1 and the drain electrode of the third transistor ST3 through the second node N2. The drain electrode of the sixth transistor ST6 may be connected to the anode electrode of the light-emitting element ED and the drain electrode of the seventh transistor ST7 through the fourth node N4.

When all of the fifth transistor ST5, the first transistor ST1 and the sixth transistor ST6 are turned on, the driving current may be supplied to the light-emitting element ED.

The seventh transistor ST7 may be turned on by the fourth scan signal of the fourth scan line HGL4 to connect the initialization voltage line VIL with the fourth node N4 which is the anode electrode of the light-emitting element ED. The seventh transistor ST7 may be turned on in response to the fourth scan signal, thereby discharging the anode electrode of the light-emitting element ED to the initialization voltage VI. The gate electrode of the seventh transistor ST7 may be connected to the fourth scan line HGL4, the source electrode thereof may be connected to the initialization voltage line VIL, and the drain electrode thereof may be connected to the fourth node N4. The drain electrode of the seventh transistor ST7 may be connected to the anode electrode of the light-emitting element ED and the drain electrode of the sixth transistor ST6 through the fourth node N4.

Each of the first, second and fifth to seventh transistors ST1, ST2, and ST5 to ST7 may include a silicon-based active layer. For example, each of the first, second and fifth to seventh transistors ST1, ST2 and ST5 to ST7 may include an active layer made of low-temperature polycrystalline silicon (LTPS). The active layer made of low-temperature polycrystalline silicon may have a high electron mobility and excellent turn-on characteristics. Therefore, the display device 10 includes the first, second and the fifth to seventh transistors ST1, ST2 and ST5 to ST7 having excellent turn-on characteristics, so that the plurality of pixels SP can be driven stably and efficiently.

Each of the first, second, and fifth to seventh transistors ST1, ST2 and ST5 to ST7 may be a p-type transistor. For example, each of the first, second and fifth to seventh transistors ST1, ST2 and ST5 to ST7 may output a current flowing into the source electrode to the drain electrode in response to a gate-low voltage applied to the gate electrode.

Each of the third and fourth transistors ST3 and ST4 may include an oxide-based active layer. For example, each of the third and fourth transistors ST3 and ST4 may have a coplanar structure in which a gate electrode is located above an oxide-based active layer. A transistor having such a coplanar structure has excellent leakage current characteristics and allows for low-frequency driving, thereby reducing power consumption. Accordingly, the display device 10 includes the third and fourth transistors ST3 and ST4 having good off-current characteristics, so that it is possible to prevent or reduce instances of leakage current flowing inside the pixels SP, and to maintain the voltage inside the pixels SP.

Each of the third and fourth transistors ST3 and ST4 may be an n-type transistor. For example, each of the third and fourth transistors ST3 and ST4 may output a current flowing into the drain electrode to the source electrode in response to a gate-high voltage applied to the gate electrode.

The first capacitor C1 may be connected between the first node N1 which is the gate electrode of the first transistor ST1 and the driving voltage line VDDL. For example, the first electrode of the second capacitor C1 may be connected to the first node N1, the second electrode of the first capacitor C1 may be connected to the driving voltage line VDDL, such that the potential difference between the supply voltage VDDL and the gate electrode of the first transistor ST1 can be held.

Figure 11:
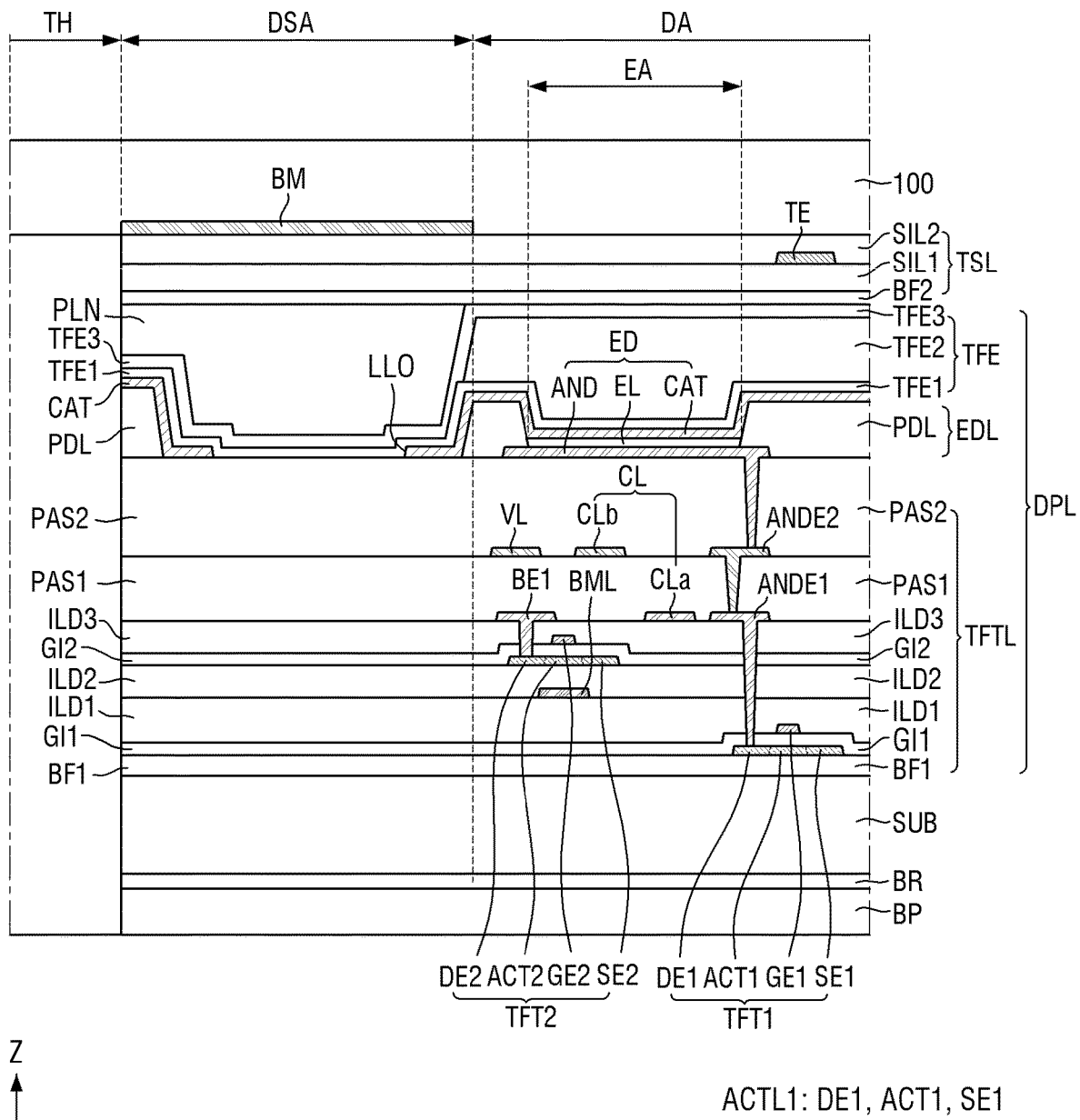
FIG. 11 is yet another cross-sectional view of a display panel according to some example embodiments of the present disclosure.

FIG. 11 is yet another cross-sectional view of a display panel according to some example embodiments of the present disclosure. The display panel of FIG. 11 is substantially identical to the display device of FIG. 8 except for the configuration of the thin-film transistor TFTL; and, therefore, some redundant description may be omitted.

Referring to FIG. 11, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a first thin-film transistor TFT1, a first gate insulating layer GI1, a first gate layer GTL1, a first interlayer dielectric layer ILD1, a second gate layer GTL2, a second interlayer dielectric layer ILD2, a second gate insulating layer GI2, a third gate layer GTL3, a third interlayer insulating layer ILD3, a first conductive layer SDL1, a first passivation layer PAS1, a second conductive layer SDL2, and a second passivation layer PAS2.

The first buffer layer BF1 may be located on the substrate SUB. For example, the first buffer layer BF1 may include at least one inorganic layer, and may be formed on the entire upper surface of the substrate SUB in order to block moisture permeating into the light-emitting element ED through the substrate SUB.

The first thin-film transistor TFT1 may be located on the first buffer layer BF1, and may form a pixel circuit of each of a plurality of pixels SP. The first thin-film transistor TFT1 may be a switching element of a pixel circuit, and may include a silicon-based active layer. For example, the first thin-film transistor TFT1 may be the sixth or seventh transistor ST6 or ST7 shown in FIG. 10. The first thin-film transistor TFT1 may include a first semiconductor layer ACT1, a first gate electrode GE1, a first source electrode SE1, and a first drain electrode DE1. The first semiconductor layer ACT1 may include polycrystalline silicon, monocrystalline silicon, low temperature polycrystalline silicon, or amorphous silicon. When the first semiconductor layer ACT1 is made of polycrystalline silicon, a part of the first semiconductor layer ACT1 may be doped with ions to have conductivity. Accordingly, the first source electrode SE1 and the first drain electrode DE1 may be formed by doping ions into the first semiconductor layer ACT1.

The first gate insulating layer GI1 may cover the first buffer layer BF and the first semiconductor layer ACT1, and may insulate the first semiconductor layer ACT1 from the first gate electrode GE1.

The first gate layer GTL1 may be located on the first gate insulating layer GI1. The first gate layer GTL1 may include the first gate electrode GE1 of the first thin-film transistor TFT1. The first gate electrode GE1 may overlap the first semiconductor layer ACT1 with the first gate insulating layer GI1 therebetween. For example, the first gate electrode GE1 of the first thin-film transistor TFT1 may be a part of the third scan line HGL3, the fourth scan line HGL4, or the emission control line EML shown in FIG. 10. Accordingly, the third scan line HGL3, the fourth scan line HGL4, and the emission control line EML may be located on the first gate layer GTL1.

The first interlayer dielectric layer ILD1 may cover the first gate layer GTL1 and the first gate insulating layer GI1. The first interlayer dielectric layer ILD1 may insulate the first gate layer GTL1 from the second gate layer GTL2.

The second gate layer GTL2 may be located on the first interlayer dielectric layer ILD1. The second gate layer GTL2 may include a light-blocking part BML, may overlap the second semiconductor layer ACT2 of the second thin-film transistor TFT2 in the thickness direction, and may block the light incident on the second thin-film transistor TFT2.

The second interlayer dielectric layer ILD2 may cover the second gate layer GTL2 and the first interlayer dielectric layer ILD1. The second interlayer dielectric layer ILD2 may insulate the second gate layer GTL2 from the second thin-film transistor TFT2.

The second thin-film transistor TFT2 may be located on the second interlayer dielectric layer ILD2 and may form the pixel circuit of each of the plurality of pixels SP. The second thin-film transistor TFT2 may be a switching element of the pixel circuit, and may include a oxide-based active layer. For example, the second thin-film transistor TFT2 may be the third or fourth transistor ST3 or ST4 shown in FIG. 10. The second thin-film transistor TFT2 may include a second semiconductor layer ACT2, a second gate electrode GE2, a second source electrode SE2, and a second drain electrode DE2. A part of the second semiconductor layer ACT2 may be doped with ions to have conductivity. Accordingly, the second source electrode SE2 and the second drain electrode DE2 may be formed by doping ions into the second semiconductor layer ACT2.

The second gate insulating layer GI2 may cover the second interlayer dielectric layer ILD2 and the second active layer ACTL2 and may insulate the second semiconductor layer ACT2 from the third gate layer GTL3.

The third gate layer GTL3 may be located on the second gate insulating layer GI2. The third gate layer GTL3 may include the second gate electrode GE2 of the second thin-film transistor TFT2. For example, the second gate electrode GE2 of the second thin-film transistor TFT2 may be a part of the first scan line HGL1 or the second can line HGL2 shown in FIG. 10. Accordingly, the first scan line HGL1 and the second scan line HGL2 may be located on the third gate layer GTL3.

The third interlayer dielectric layer ILD3 may cover the third gate layer GTL3 and the second gate insulating layer GI2. The third interlayer dielectric layer ILD3 may insulate the third gate layer GTL3 from the first conductive layer SDL1.

The first conductive layer SDL1 may be located on the third interlayer insulating layer ILD3. The first conductive layer SDL1 may include a first anode connection electrode ANDE1, a first connection electrode BE1, and a first portion CLa of the connection line CL.

The first anode connection electrode ANDE1 may be connected to the first drain electrode DE1 of the first thin-film transistor TFT1 through a contact hole penetrating through the first gate insulating layer GI, the first and second interlayer dielectric layers ILD1 and ILD2, the second gate insulating layer GI2 and the third interlayer dielectric layer ILD3.

The first connection electrode BE1 may be connected to the second drain electrode DE2 of the second thin-film transistor TFT2 through a contact hole penetrating through the second gate insulating layer GI2 and the third interlayer dielectric layer ILD3.

The first portion CLa of the connection line CL may be located in a different layer from the plurality of first lines VL and the second portion CLb of the connection line CL.

The first passivation layer PAS1 may be located over the first conductive layer SDL1 to protect the first and second thin-film transistors TFT1 and TFT2. The first passivation layer PAS1 may cover the first conductive layer SDL1 and may include a contact hole through which the second anode connection electrode ANDE2 passes.

The second conductive layer SDL2 may be located on the first passivation layer PAS1. The second conductive layer SDL2 may include a second anode connection electrode ANDE2, a plurality of first lines VL, and a second portion CLb of the connection line CL.

The second anode connection electrode ANDE2 may be connected to the first anode connection electrode ANDE1 through a contact hole penetrating through the first passivation layer PAS1.

The plurality of first lines VL and the second portion CLb of the connection line CL may be located in one of the first and second conductive layers SDL1 and SDL2, and the first portion CLa and the third portion CLc of the connection line CL may be located in the other one. According to some example embodiments, a third portion CLc of the connection line CL may be spaced apart from the first portion CLa of the connection line CL and may be located in the same layer as the first portion CLa of the connection line CL. For example, the plurality of first lines VL and the second portions CLb of the connection lines CL may be located in the first conductive layer SDL1, while the first portions CLa and the third portions CLc of the connection lines CL may be located in the second conductive layer SDL2. For another example, the plurality of first lines VL and the second portions CLb of the connection lines CL may be located in the second conductive layer SDL2, while the first portions CLa and the third portions CLc of the connection lines CL may be located in the first conductive layer SDL1. The first portions CLa and the third portions CLc of the connection lines CL intersecting the plurality of first lines VL may be located in a different layer from the plurality of first lines VL and thus may be insulated from the plurality of first lines VL. The second portions CLb of the connection lines CL in parallel with the plurality of first lines VL may be located on the same layer as the plurality of first lines VL and thus may be insulated from the plurality of first lines VL. Accordingly, the connection lines CL may connect between the first lines VL spaced apart from one another by the through hole TH.

Figure 12:
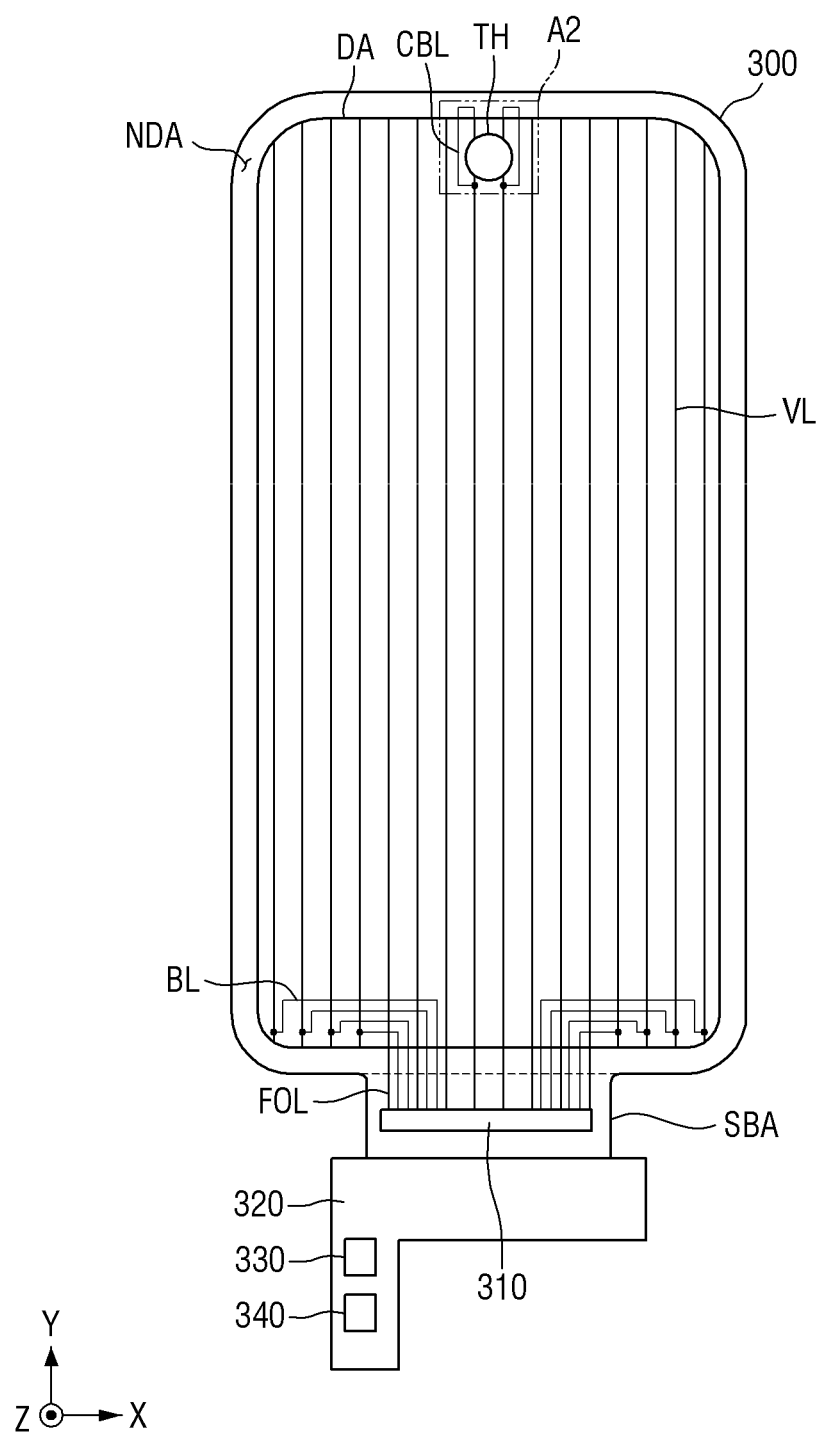
FIG. 12 is a plan view showing a connection relationship of first lines of a display panel according to some example embodiments of the present disclosure.

FIG. 12 is a plan view showing connection relationships of first lines of a display panel according to some example embodiments. The display panel of FIG. 12 is substantially identical to the display panel of FIG. 3 except for the configuration of bypass connection lines CBL; and, therefore, some redundant description may be omitted. In addition, the display panel of FIG. 12 may include the plurality of second lines SL shown in FIG. 4.

Referring to FIG. 12, a display panel 300 may include a display area DA and a non-display area NDA.

The display area DA may include a plurality of pixels SP, a plurality of first lines VL, and a plurality of second lines SL.

Each of the plurality of pixels may be connected to the respective first lines VL and the respective second lines SL. Each of the plurality of pixels may be connected to at least one data line, at least one driving voltage line, at least one gate line, and at least one emission control line.

The plurality of first lines VL may be connected to the display driver 310 and may traverse the display area DA in the second direction (y-axis direction). The plurality of first lines VL may extend in the second direction (y-axis direction) and may be spaced apart from one another in the first direction (x-axis direction) crossing the second direction (y-axis direction). Some of the first lines VL which face the display driver 310 may be connected to the display driver 310 through fan-out lines FOL, and some others of the first lines VL which do not face the display driver 310 may be connected to the display driver 310 through bypass lines BL. For example, the plurality of first lines VL may include a plurality of data lines and a plurality of driving voltage lines. The data lines may apply data voltages to the pixels, and the driving voltage lines may apply driving voltages to the pixels.

Some of the first lines VL may not pass through the through hole TH while some others of the first lines VL may be disconnected by the through hole TH. For example, some of the first lines VL which do not pass through the through hole TH may extend from the side of the display area DA which faces the display driver 310 to the opposite side of the display area DA. Some others of the plurality of first lines VL which are disconnected by the through hole TH may be connected by the bypass connection lines CBL.

The bypass connection lines CBL may bypass the through hole TH through the display area DA and the non-display area NDA to connect between the first lines VL spaced apart from each other by the through hole TH. For example, the bypass connection lines CBL may be connected to the first lines VL on the lower side of the through hole TH, and may pass through the display area DA on the left or right side of the through hole TH to be extended to the upper side of the non-display area NDA relatively adjacent to the through hole TH. The bypass connection lines CBL may be bent at least once on the upper side of the non-display area NDA, and may be connected to the first lines VL extended to the upper side of the non-display area NDA.

The bypass connection lines CBL may be located in a different layer from the plurality of first lines VL, so that they can bypass the through hole TH and can be extended in the display area DA in which the plurality of pixels is located. The bypass connection lines CBL may connect the first lines VL terminated at one side of the through hole TH with the first lines VL terminated at the other side of the through hole TH. As the display device 10 includes the bypass connection lines CBL bypassing the through hole TH and extended in the display area DA and the non-display area NDA, it does not require any additional line area or wiring area connecting between the first lines VL located on the both sides of the through hole TH. As a result, it is possible to reduce the dead space area created by the through hole TH.

The bypass connection lines CBL may be connected to the first lines VL on the side of the non-display area NDA relatively adjacent to the through hole TH, and thus the distance between the through hole TH and the non-display area NDA can be reduced. Accordingly, the bypass connection lines CBL included in the display device 10 allow more degree of freedom for the position of the through hole TH.

Figure 13:
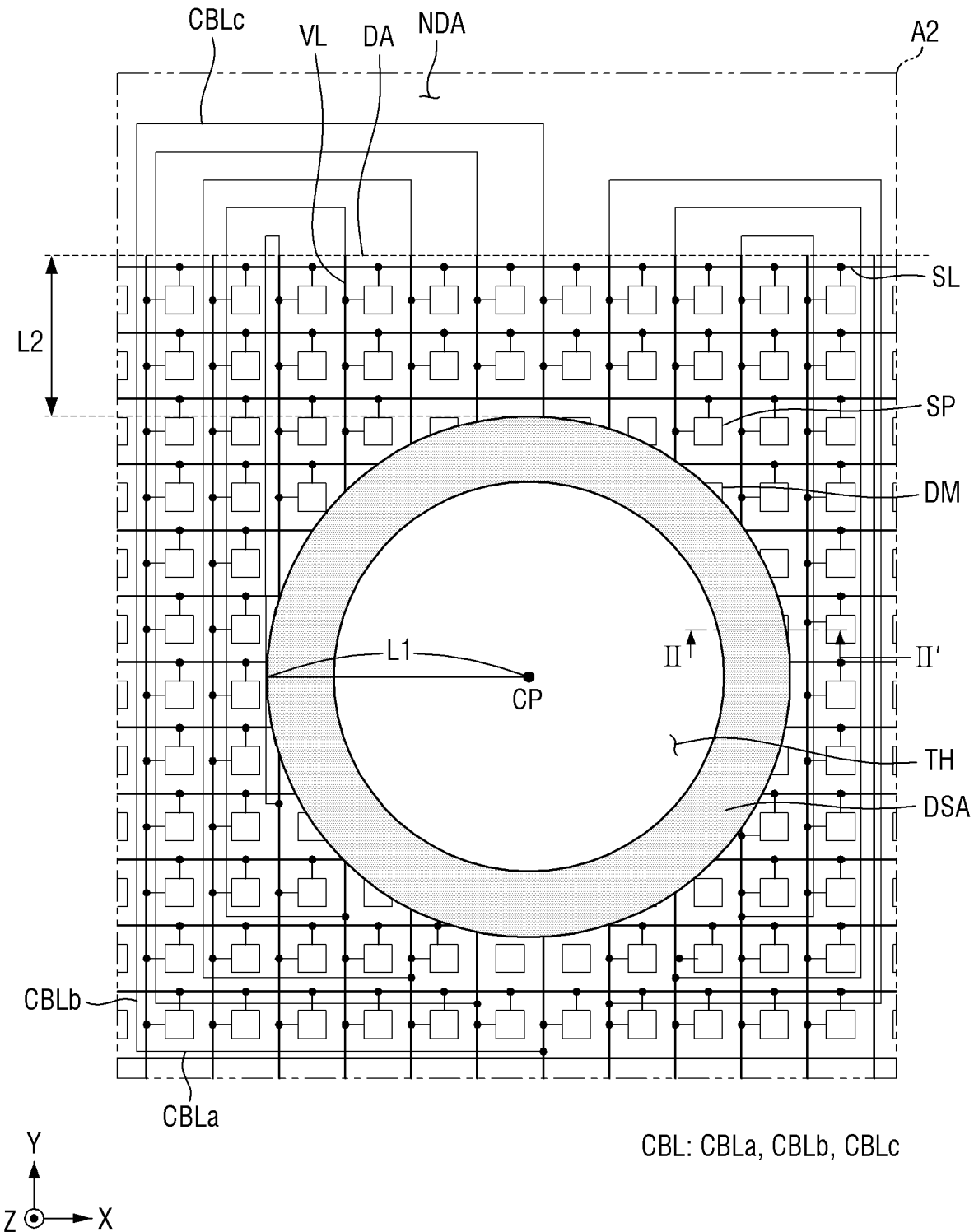
FIG. 13 is an enlarged view of the area A2 of FIG. 12.

FIG. 13 is an enlarged view of area A2 of FIG. 12.

Referring to FIG. 13, the display panel 300 may include a through hole TH, a dead space area DSA, and a display area DA.

The bypass connection lines CL may extend in the display area DA and the non-display area NDA around the through hole to connect the first lines VL spaced apart from each other. The bypass connection lines CBL may be located in a different layer from the plurality of first lines VL, so that they can bypass the through hole TH and can be extended in the display area DA in which the plurality of pixels is located. The bypass connection lines CBL may connect the first lines VL terminated at one side of the through hole TH with the first lines VL terminated at the other side of the through hole TH. As the display device 10 includes the bypass connection lines CBL bypassing the through hole TH in the display area DA, it does not require a separate line area or a wiring area connecting the lines located on both sides of the through hole TH. As a result, it is possible to reduce the dead space area DSA created by the through hole TH. By reducing the dead space area DSA in the display device 10, it is possible to avoid the number of the pixels from reducing due to the dead space area DSA and thus the image quality can be improved.

Each of the bypass connection lines CBL may include first to third portions CBLa, CBLb, and CBLc.

The first portions CBLa of the bypass connection lines CL may be connected to the respective first lines VL terminated at one side of the through hole TH. The first portions CBLa of the bypass connection lines CBL may extend in a direction crossing the direction in which the first lines VL are extended. For example, the first portions CLa of the bypass connection lines CBL may extend in the first direction (x-axis direction) in the display area DA. The bypass connection lines CBL may have longer first portions CBLa as the respective first lines VL connected thereto have the coordinates in the first direction (x-axis direction) closer to the center of the through hole TH. The first portions CLa of the bypass connection lines CBL may be located adjacent to and extended in parallel with the second lines SL when viewed from the top. For example, the first portions CBLa of the bypass connection lines CBL may be located adjacent to and extended in parallel with the gate lines or the emission control lines when viewed from the top.

The second portion CBLb of each of the bypass connection lines CBL may be connected between the first portion CBLa and the third portion CBLc. The second portion CBLb of the bypass connection line CBL may be bent from the first portion CLa and may extend in a direction parallel to the first line VL. For example, the second portion CBLb of the bypass connection lines CBL may extend to the upper side of the non-display area NDA passing through the display area DA on the left side or right side of the through hole TH. The second portions CBLb of the bypass connection lines CBL may be located adjacent to and may extend in parallel with the first lines VL which are not disconnected by the through hole TH when viewed from the top. For example, the second portion CBLb of the bypass connection line CBL may be located adjacent to and may extend in parallel with the data line or the driving voltage line when viewed from the top.

The third portion CBLc of the bypass connection line CBL may be connected to the respective first line VL terminated at the other side of the through hole TH. The third portions CBLc of the bypass connection line CBL may be located on one side of the non-display area NDA relatively adjacent to the through hole TH, and may extend in a direction crossing the direction in which the first lines VL are extended. One end of the third portion CBLc of the bypass connection line CBL may be connected to the second portion CBLb extending to the non-display area NDA, and the other end of the third portion CBLc of the bypass connection line CBL may be connected to the first line VL extended to the non-display area NDA. The third portions CBLc of the bypass connection lines CBL may extend in parallel with the direction in which the second lines VL are extended.

For another example, the first to third portions CBLa, CBLb and CBLc of each of the bypass connection lines CBL may be connected to one another to form a curved line. The configuration of the bypass connection lines CBL is not limited to the first to third portions CBLa, CBLb and CBLc shown in FIG. 13 but may have a variety of shapes to connect between the first lines VL located on the both sides of the through hole TH.

The plurality of second lines SL may extend in the first direction (x-axis direction), and may be spaced apart from each other in the second direction (y-axis direction). Some of the second lines SL may not pass through the through hole TH while some others of the second lines SL may be disconnected by the through hole TH. For example, some of the second lines SL which do not pass through the through hole TH may be connected to both the first and second gate drivers 351 and 352. The second lines SL terminated at one side of the through hole TH may be connected to the first gate driver 351 located on one side of the non-display area NDA, while the second lines SL terminated at the other side of the through hole TH may be connected to the second gate driver 352 located on the opposite side of the non-display area NDA.

The bypass connection lines CBL may be connected to the first lines VL on the side of the non-display area NDA relatively adjacent to the through hole TH, and thus the distance between the through hole TH and the non-display area NDA can be reduced. The boundary between the display area DA and the non-display area NDA may be defined with respect to the pixel electrodes of the pixels SP located at the outermost position among the plurality of pixels SP. The area where the pixel electrodes of the pixels SP located at the outermost position are located may fall in the display area DA, while the area outside the pixel electrodes of the pixels SP located at the outermost position may fall in the non-display area NDA. Since the third portions CBLc of the bypass connection lines CBL are not connected to the first lines VL in the display area DA located on the other side of the through hole TH, the distance between the through hole TH and the non-display area NDA can be reduced. For example, the distance L2 between the dead space area DSA and the non-display area NDA may be less than half the distance L1 between the center CP of the through hole TH and the display area DA (L2≤(L1)/2). Accordingly, the bypass connection lines CBL included in the display device 10 allow more degree of freedom for the position of the through hole TH.

Figure 14:
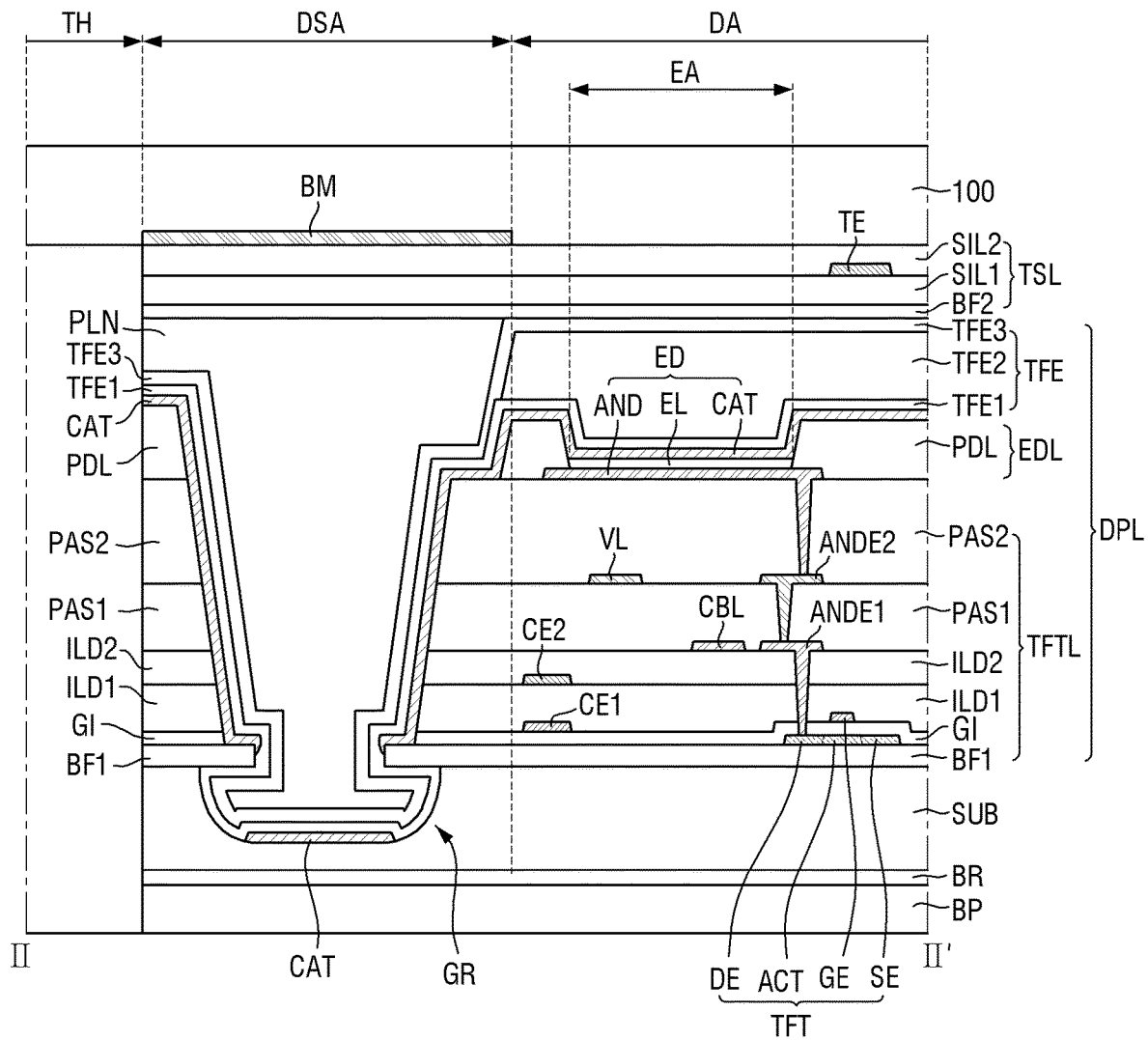
FIG. 14 is a cross-sectional view taken along the line II-II' of FIG. 13.

FIG. 14 is a cross-sectional view taken along line II-II' of FIG. 13. The display panel of FIG. 14 is substantially identical to the display panel of FIG. 7 except for the configuration of bypass connection lines CBL; and, therefore, some redundant description may be omitted.

Referring to FIG. 14, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a thin-film transistor TFT, a gate insulating layer GI, a first interlayer dielectric layer ILD1, first and second capacitor electrodes CE1 and CE2, and a second interlayer dielectric layer ILD2, a first conductive layer SDL1, a first passivation layer PAS1, a second conductive layer SDL2, and a second passivation layer PAS2.

The first conductive layer SDL1 may be located on the second interlayer insulating layer ILD2. The first conductive layer SDL1 may include a first anode connection electrode ANDE1 and a bypass connection line CL. Each of the first anode connection electrode ANDE1 and the bypass connection line CBL may be made up of a single layer or multiple layers of at least one of molybdenum (Mo), aluminum (Al), chromium (Cr), gold (Au), titanium (Ti), nickel (Ni), neodymium (Nd), or copper (Cu).

The bypass connection lines CBL may be located in a different layer from the plurality of first lines VL and may connect between the first lines VL spaced apart from one another by the through hole TH among the plurality of first lines VL. The bypass connection lines CBL may connect the first lines VL terminated at one side of the through hole TH with the first lines VL terminated at the other side of the through hole TH.

The second conductive layer SDL2 may be located on the first passivation layer PAS1. The second conductive layer SDL2 may include the second anode connection electrode ANDE2 and the plurality of first lines VL. Each of the second anode connection electrode ANDE2 and the first lines VL may be made up of a single layer or multiple layers of at least one of molybdenum (Mo), aluminum (Al), chromium (Cr), gold (Au), titanium (Ti), nickel (Ni), neodymium (Nd), or copper (Cu).

The plurality of first lines VL may be connected to the display driver 310 and may traverse the display area DA in the second direction (y-axis direction). The plurality of first lines VL may include a plurality of data lines DL and a plurality of driving voltage lines VDDL. For example, some of the first lines VL which do not pass through the through hole TH may extend from the side of the display area DA facing the display driver 310 to the opposite side of the display area DA. Some others of the plurality of first lines VL which are disconnected by the through hole TH may be connected by the bypass connection lines CBL.

The display device 10 includes the bypass connection lines CBL located in a different layer from the first lines VL, thereby connecting between the first lines VL located on the both sides of the through hole TH around the through hole in the display area DA and the non-display area NDA. Accordingly, the display device 10 does not require any additional line area or wiring area for connecting between the first lines VL located on the both sides of the through hole TH, thereby reducing the dead space area created by the through hole TH.

For another example, the plurality of first lines VL may be located in the first conductive layer SDL1, and the bypass connection lines CBL may be located in the second conductive layer SDL2. Therefore, the arrangement relationship between the plurality of first lines VL and the bypass connection lines CBL is not limited to that shown in FIG. 14.

Figure 15:
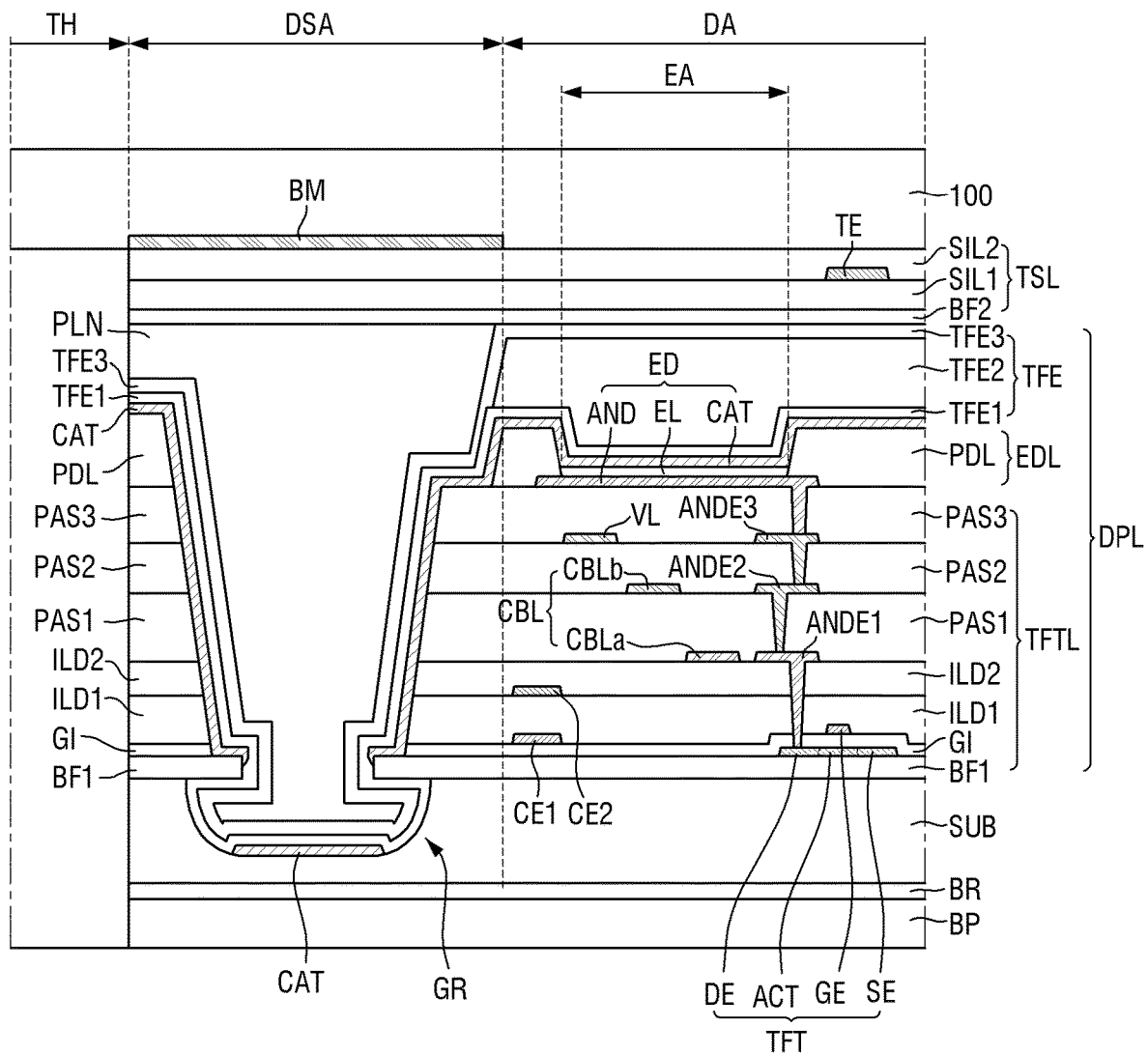
FIG. 15 is another cross-sectional view of a display panel according to some example embodiments of the present disclosure.

FIG. 15 is another cross-sectional view of a display panel according to some example embodiments of the present disclosure. The display panel of FIG. 15 is substantially identical to the display panel of FIG. 9 except for the configuration of bypass connection lines CBL; and, therefore, some redundant description may be omitted.

Referring to FIG. 15, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a thin-film transistor TFT, a gate insulating layer GI, a first interlayer dielectric layer ILD1, first and second capacitor electrodes CE1 and CE2, and a second interlayer dielectric layer ILD2, a first conductive layer SDL1, a first passivation layer PAS1, a second conductive layer SDL2, a second passivation layer PAS2, a third conductive layer SDL3, a third passivation layer PAS3.

Each of the bypass connection lines CBL may include first to third portions CBLa, CBLb, and CBLc.

The first conductive layer SDL1 may be located on the second interlayer insulating layer ILD2. The first conductive layer SDL1 may include a first anode connection electrode ANDE1 and a first portion CBLa of a bypass connection line CBL. Each of the first anode connection electrode ANDE1 and the first portion CBLa of the bypass connection line CBL may be made up of a single layer or multiple layers of at least one of molybdenum (Mo), aluminum (Al), chromium (Cr), gold (Au), titanium (Ti), nickel (Ni), neodymium (Nd), or copper (Cu).

The second conductive layer SDL2 may be located on the first passivation layer PAS1. The second conductive layer SDL2 may include a second anode connection electrode ANDE2 and the second portion CBLb of the bypass connection line CBL. Each of the second anode connection electrode ANDE2 and the second portion CBLb of the bypass connection line CBL may be made up of a single layer or multiple layers of at least one of molybdenum (Mo), aluminum (Al), chromium (Cr), gold (Au), titanium (Ti), nickel (Ni), neodymium (Nd), or copper (Cu).

The third conductive layer SDL3 may be located on the second passivation layer PAS2. The third conductive layer SDL3 may include the third anode connection electrode ANDE3 and the plurality of first lines VL. Each of the third anode connection electrode ANDE3 and the first lines VL may be made up of a single layer or multiple layers of at least one of molybdenum (Mo), aluminum (Al), chromium (Cr), gold (Au), titanium (Ti), nickel (Ni), neodymium (Nd), or copper (Cu).

The plurality of first lines VL may be connected to the display driver 310 and may traverse the display area DA in the second direction (y-axis direction). The plurality of first lines VL may include a plurality of data lines DL and a plurality of driving voltage lines VDDL. For example, some of the first lines VL which do not pass through the through hole TH may extend from the side of the display area DA facing the display driver 310 to the opposite side of the display area DA. Some others of the plurality of first lines VL which are disconnected by the through hole TH may be connected by the bypass connection lines CBL.

The plurality of first lines VL may be located in one of the first to third conductive layers SDL1 to SDL3, the first portions CBLa and the third portions CBLc of the bypass connection lines CL may be located in another one of the first to third conductive layer SDL1 to SDL3, and the second portions CLb of the connection lines CL may be located in the other one of the first to third conductive layers SDL1 to SDL3. According to some example embodiments, a third portions CBLc of the bypass connection line CBL may be spaced apart from the first portions CBLa of the bypass connection lines CBL and may be located in the same layer as the first portions CBLa of the bypass connection lines CBL. For example, the first portions CBLa and the third portions CBLc of the bypass connection lines CBL may be located in the first conductive layer SDL1, the second portions CBLb of the bypass connection lines CBL may be located in the second conductive layer SDL2, and the plurality of first lines VL may be located in the third conductive layer SDL3. As the first to third portions CBLa, CBLb and CBLc of the connection lines CL may be located in a different layer from the plurality of first lines VL and thus may be insulated from the plurality of first lines VL. Accordingly, the bypass connection lines CBL may connect between the first lines VL spaced apart from one another by the through hole TH.

The display device 10 includes the bypass connection lines CBL located in a different layer from the first lines VL, thereby connecting between the first lines VL located on the both sides of the through hole TH around the through hole in the display area DA and the non-display area NDA. Accordingly, the display device 10 does not require any additional line area or wiring area for connecting between the first lines VL located on the both sides of the through hole TH, thereby reducing the dead space area created by the through hole TH.

Figure 16:
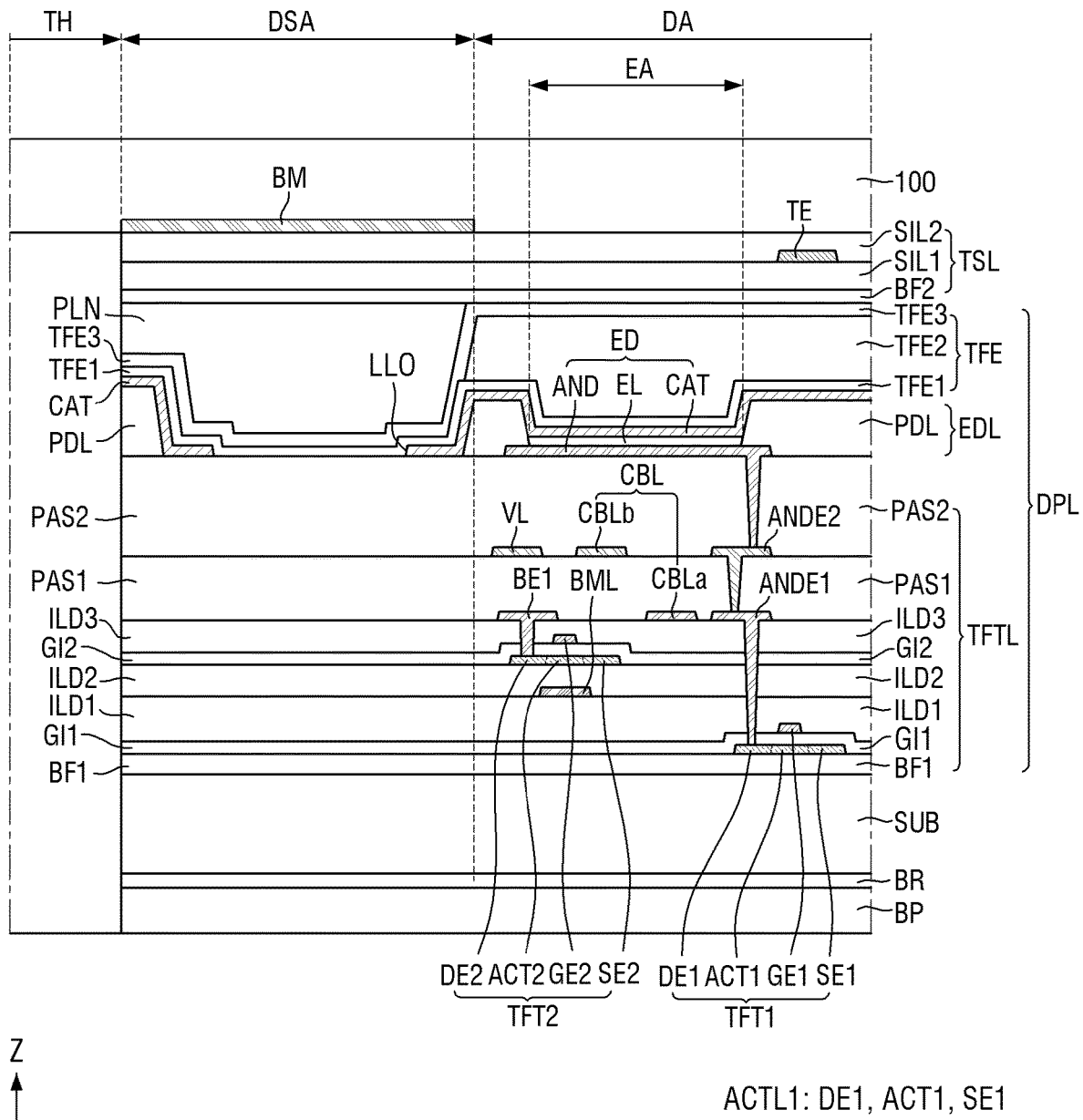
FIG. 16 is yet another cross-sectional view of a display panel according to some example embodiments of the present disclosure.

FIG. 16 is yet another cross-sectional view of a display panel according to some example embodiments of the present disclosure. The display panel of FIG. 16 is substantially identical to the display panel of FIG. 11 except for the configuration of bypass connection lines CBL; and, therefore, some redundant description may be omitted.

Referring to FIG. 16, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a first thin-film transistor TFT1, a first gate insulating layer GI1, a first gate layer GTL1, a first interlayer dielectric layer ILD1, a second gate layer GTL2, a second interlayer dielectric layer ILD2, a second gate insulating layer GI2, a third gate layer GTL3, a third interlayer insulating layer ILD3, a first conductive layer SDL1, a first passivation layer PAS1, a second conductive layer SDL2, and a second passivation layer PAS2.

The first conductive layer SDL1 may be located on the third interlayer insulating layer ILD3. The first conductive layer SDL1 may include a first anode connection electrode ANDE1, a first connection electrode BE1, and a first portion CBLa of the bypass connection line CBL.

The first portions CBLa of the bypass connection lines CBL may be located in a different layer from the plurality of first lines VL and the second portions CBLb of the bypass connection lines CBL.

The second conductive layer SDL2 may be located on the first passivation layer PAS1. The second conductive layer SDL2 may include a second anode connection electrode ANDE2, a plurality of first lines VL, and second portions CBLb of the bypass connection lines CBL.

The plurality of first lines VL and the second portions CLb of the bypass connection lines CBL may be located in one of the first and second conductive layers SDL1 and SDL2, while the first portions CBLa and the third portions CBLc of the bypass connection lines CBL may be located in the other one of the first and second conductive layers SDL1 and SDL2. According to some example embodiments, a third portions CBLc of the bypass connection line CBL may be spaced apart from the first portions CBLa of the bypass connection lines CBL and may be located in the same layer as the first portions CBLa of the bypass connection lines CBL. For example, the plurality of first lines VL and the second portions CBLb of the bypass connection lines CBL may be located in the first conductive layer SDL1, while the first portions CBLa and the third portions CBLc of the bypass connection lines CBL may be located in the second conductive layer SDL2. For another example, the plurality of first lines VL and the second portions CBLb of the bypass connection lines CBL may be located in the second conductive layer SDL2, while the first portions CBLa and the third portions CBLc of the bypass connection lines CBL may be located in the first conductive layer SDL1. The first portions CBLa and the third portions CBLc of the bypass connection lines CBL crossing the plurality of first lines VL may be located in a different layer from the plurality of first lines VL and thus may be insulated from the plurality of first lines VL. The second portions CBLb of the bypass connection lines CBL in parallel with the plurality of first lines VL may be located on the same layer as the plurality of first lines VL and thus may be insulated from the plurality of first lines VL. Accordingly, the bypass connection lines CBL may connect between the first lines VL spaced apart from one another by the through hole TH.

Figure 17:
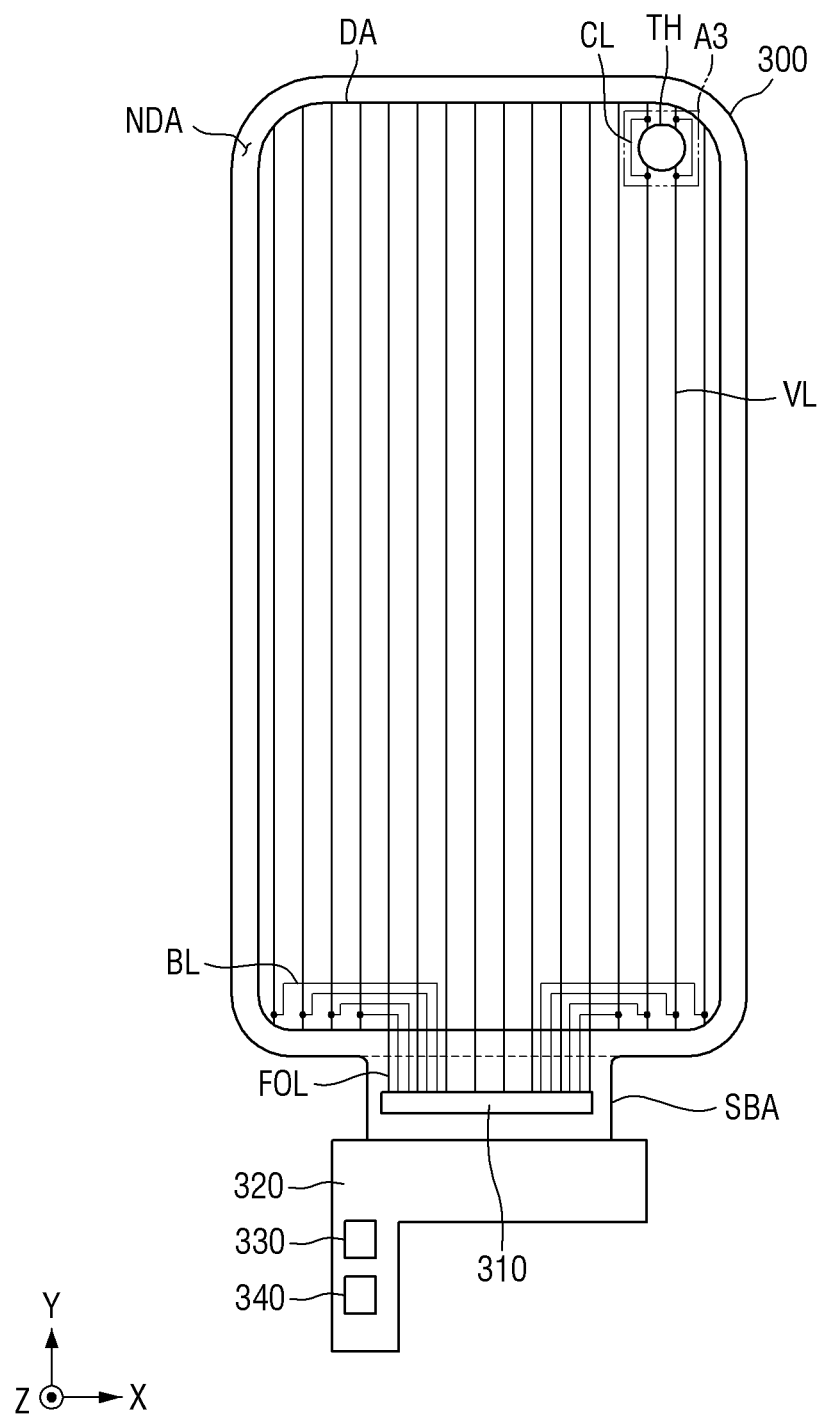
FIG. 17 is a plan view showing connection relationships of first lines of a display panel according to some example embodiments of the present disclosure.
Figure 18:
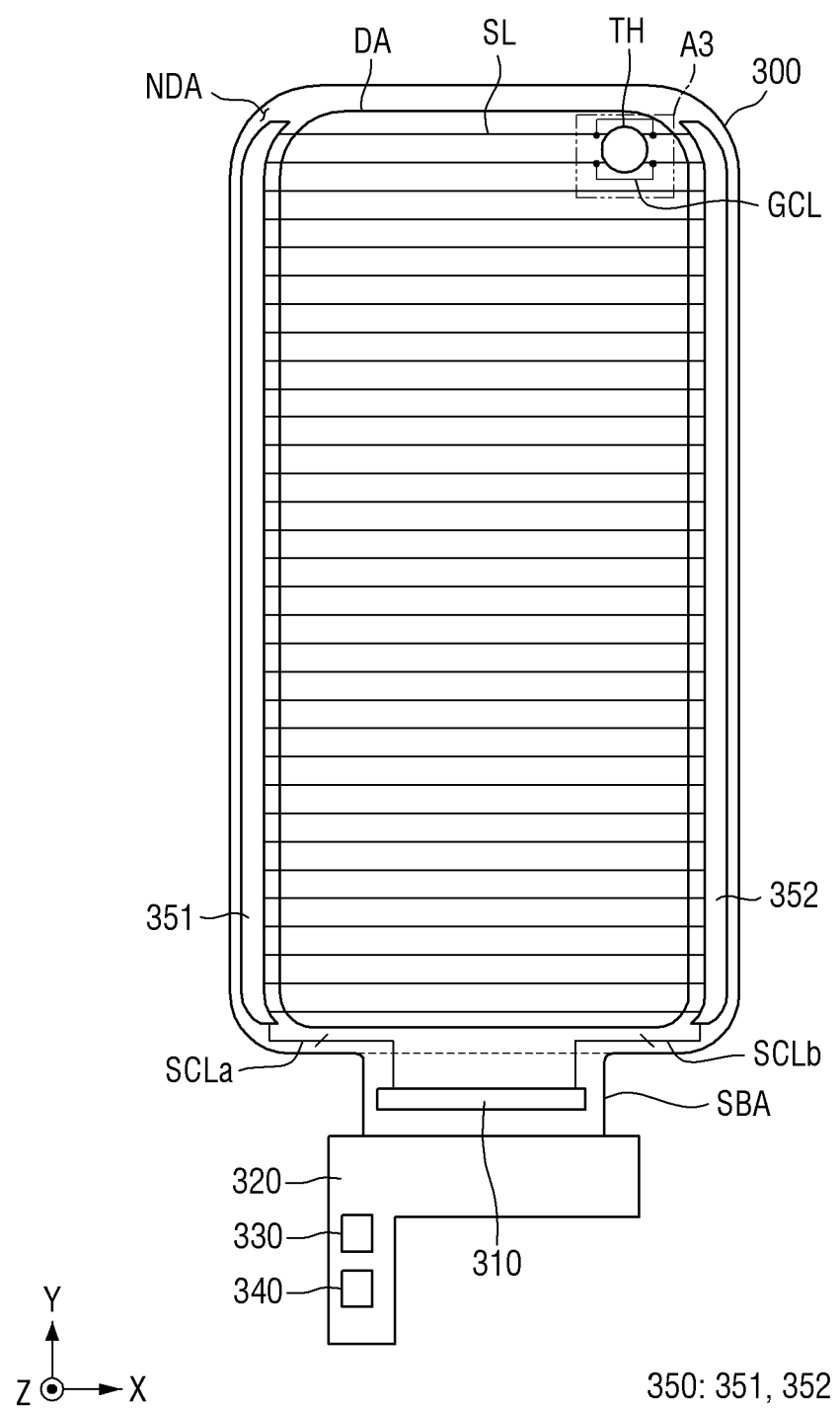
FIG. 18 is a plan view showing connection relationships of second lines of a display panel according to some example embodiments of the present disclosure.

FIG. 17 is a plan view showing connection relationships of first lines of a display panel according to some example embodiments of the present disclosure. FIG. 18 is a plan view showing connection relationships of second lines of a display panel according to some example embodiments of the present disclosure. The display panels of FIGS. 17 and 18 are substantially identical to the display panels of FIGS. 3 and 4 except for the position of a through hole TH and the configuration of gate connection lines GCL; and, therefore, some redundant description may be omitted.

Referring to FIGS. 17 and 18, the display panel 300 may include the through hole TH, the display area DA, and the non-display area NDA.

The through hole TH may be formed on one side of the display area DA in the first direction (x-axis direction). The through hole TH may be located closer to the second gate driver 352 than to the first gate driver 351. For example, the distance between the through hole TH and the first gate driver 351 may be larger than the distance between the through hole TH and the second gate driver 352. The distance between the through hole TH and the left edge of the display area DA may be larger than the distance between the through hole TH and the right edge of the display area DA. The through hole TH may penetrate through the display panel 300 in the third direction (z-axis direction). The through hole TH may be surrounded by the display area DA when viewed from the top.

The display area DA may include a plurality of pixels SP, a plurality of first lines VL, and a plurality of second lines SL.

Each of the plurality of pixels may be connected to the respective first lines VL and the respective second lines SL. Each of the plurality of pixels may be connected to at least one data line, at least one driving voltage line, at least one gate line, and at least one emission control line.

The plurality of first lines VL may be connected to the display driver 310 and may traverse the display area DA in the second direction (y-axis direction). The plurality of first lines VL may extend in the second direction (y-axis direction) and may be spaced apart from one another in the first direction (x-axis direction) crossing the second direction (y-axis direction). Some of the first lines VL which face the display driver 310 may be connected to the display driver 310 through fan-out lines FOL, and some others of the first lines VL which do not face the display driver 310 may be connected to the display driver 310 through bypass lines BL. For example, the plurality of first lines VL may include a plurality of data lines and a plurality of driving voltage lines. The data lines may apply data voltages to the pixels, and the driving voltage lines may apply driving voltages to the pixels.

Some of the first lines VL may not pass through the through hole TH while some others of the first lines VL may be disconnected by the through hole TH. For example, some of the first lines VL which do not pass through the through hole TH may extend from the side of the display area DA which faces the display driver 310 to the opposite side of the display area DA. Some others of the plurality of first lines VL which are disconnected by the through hole TH may be connected by connection lines CL.

The connection lines CL may bypass the through hole TH and extended in the display area DA to connect between the first lines VL which are spaced apart from each other by the through hole TH. The connection lines CL may be located in a different layer from the plurality of first lines VL, so that they can bypass the through hole TH and can be extended in the display area DA in which the plurality of pixels is located. The connection lines CL may connect the first lines VL terminated at one side of the through hole TH with the first lines VL terminated at the other side of the through hole TH. As the display device 10 includes the connection lines CL bypassing the through hole TH in the display area DA, it does not require any additional line area or wiring area connecting between the first lines VL located on the both sides of the through hole TH. As a result, it is possible to reduce the dead space area created by the through hole TH.

The plurality of second lines SL may extend in the first direction (x-axis direction), and may be spaced apart from each other in the second direction (y-axis direction). The plurality of second lines SL may be connected to the first and second gate drivers 351 and 352. Some of the second lines SL may not pass through the through hole TH while some others of the second lines SL may be disconnected by the through hole TH. For example, some of the second lines SL which do not pass through the through hole TH may extend from the left edge to the right edge of the display area DA. Some others of the plurality of second lines SL which are disconnected by the through hole TH may be connected by the gate connection lines GCL. For example, the plurality of second lines SL may include a plurality of gate lines and a plurality of emission control lines. The gate lines may supply gate signals to the pixels, and the emission control line may supply emission signals to the pixels.

The gate connection lines GCL may bypass the through hole TH and may extend in the display area DA to connect between the second lines SL which are spaced apart from each other by the through hole TH. The gate connection lines GCL may be located in a different layer from the plurality of second lines SL, so that they can bypass the through hole TH and can be extended in the display area DA in which the plurality of pixels SP is located. The gate connection lines GCL may connect the second lines SL terminated at one side of the through hole TH with the second lines SL terminated at the other side of the through hole TH. As the display device 10 includes the gate connection lines GCL bypassing the through hole TH in the display area DA, it does not require any additional line area or wiring area connecting between the second lines SL located on the both sides of the through hole TH. As a result, it is possible to reduce the dead space area created by the through hole TH.

Figure 19:
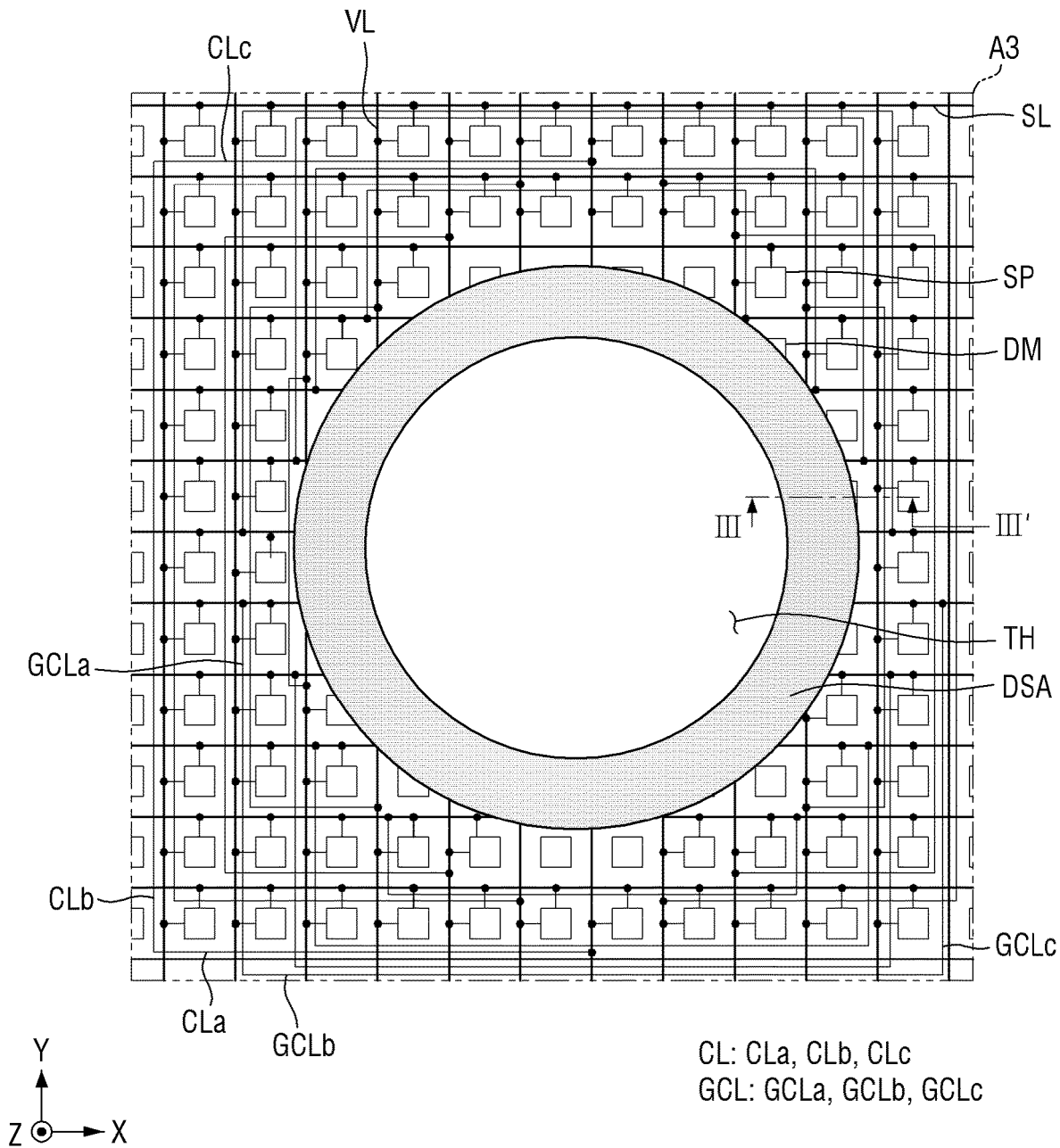
FIG. 19 is an enlarged view of the area A3 of FIGS. 17 and 18.

FIG. 19 is an enlarged view of area A3 of FIGS. 17 and 18. The display panel of FIG. 19 is substantially identical to the display panel of FIG. 5 except that the former further includes gate connection lines GCL; and, therefore, some redundant description may be omitted.

Referring to FIG. 19, the display panel 300 may include a through hole TH, a dead space area DSA, and a display area DA.

The connection lines CL may bypass the through hole TH and extended in the display area DA to connect between the first lines VL which are spaced apart from each other by the through hole TH. The connection lines CL may be located in a different layer from the plurality of first lines VL, so that they can bypass the through hole TH and can be extended in the display area DA in which the plurality of pixels is located. The connection lines CL may connect the first lines VL terminated at one side of the through hole TH with the first lines VL terminated at the other side of the through hole TH. As the display device 10 includes the connection lines CL bypassing the through hole TH in the display area DA, it does not require a separate line area or a wiring area connecting the lines located on both sides of the through hole TH. As a result, it is possible to reduce the dead space area DSA created by the through hole TH. By reducing the dead space area DSA in the display device 10, it is possible to avoid the number of the pixels from reducing due to the dead space area DSA and thus the image quality can be improved. Each of the connection lines CL may include first to third portions CLa, CLb, and CLc.

The plurality of second lines SL may extend in the first direction (x-axis direction), and may be spaced apart from each other in the second direction (y-axis direction). The plurality of second lines SL may be connected to the first and second gate drivers 351 and 352. Some of the second lines SL may not pass through the through hole TH while some others of the second lines SL may be disconnected by the through hole TH. For example, some of the second lines SL which do not pass through the through hole TH may extend from the left edge to the right edge of the display area DA. Some others of the plurality of second lines SL which are disconnected by the through hole TH may be connected by the gate connection lines GCL. For example, the plurality of second lines SL may include a plurality of gate lines and a plurality of emission control lines. The gate lines may supply gate signals to the pixels, and the emission control line may supply emission signals to the pixels.

The gate connection lines GCL may bypass the through hole TH and may extend in the display area DA to connect between the second lines SL which are spaced apart from each other by the through hole TH. The gate connection lines GCL may be located in a different layer from the plurality of second lines SL, so that they can bypass the through hole TH and can be extended in the display area DA in which the plurality of pixels SP is located. The gate connection lines GCL may connect the second lines SL terminated at one side of the through hole TH with the second lines SL terminated at the other side of the through hole TH. As the display device 10 includes the gate connection lines GCL bypassing the through hole TH in the display area DA, it does not require any additional line area or wiring area connecting between the second lines SL located on the both sides of the through hole TH. As a result, it is possible to reduce the dead space area created by the through hole TH.

Each of the gate connection lines GCL may include first to third portions GCLa, GCLb, and GCLc.

The first portions GCLa of the gate connection lines GCL may be connected to the respective second lines SL terminated at one side of the through hole TH. The first portions GCLa of the gate connection lines GCL may extend in a direction crossing the direction in which the second lines SL are extended. For example, the first portion GCLa of the gate connection line GCL may extend in the second direction (y-axis direction) in the display area DA. The gate connection lines GCL may have longer first portions GCLa as the respective second lines SL connected thereto have the coordinates in the second direction (y-axis direction) closer to the center of the through hole TH. The first portion CLa of the gate connection line GCL may be located adjacent to and may extend in parallel with the first line VL when viewed from the top. For example, the first portion GCLa of the gate connection line GCL may be located adjacent to and may extend in parallel with the data line or the driving voltage line when viewed from the top.

The second portion GCLb of the gate connection line GCL may be connected between the first portion GCLa and the third portion GCLc. The second portion GCLb of the gate connection line GCL may be bent from the first portion GCLa and may extend in a direction parallel to the second line SL. For example, the second portion GCLb of the gate connection line GCL may extend in the first direction (x-axis direction) in the display area DA. The second portions GCLb of the gate connection lines GCL may be located adjacent to and may extend in parallel with the second lines SL which are not disconnected by the through hole TH when viewed from the top. For example, the second portions GCLb of the gate connection lines GCL may be located adjacent to and extended in parallel with the gate lines or the emission control lines when viewed from the top.

The third portions GCLc of the gate connection lines GCL may be connected to the respective second lines SL terminated at the other side of the through hole TH. The third portions GCLc of the gate connection lines GCL may extend in a direction crossing the direction in which the second lines SL are extended. For example, the third portion GCLc of the gate connection line GCL may extend in the second direction (y-axis direction) in the display area DA. The gate connection lines GCL may have longer third portions GCLc as the respective second lines SL connected thereto have the coordinates in the second direction (y-axis direction) closer to the center of the through hole TH. The third portion GCLc of the gate connection line GCL may be located adjacent to and may extend in parallel with the first line VL when viewed from the top. For example, the third portion GCLc of the gate connection line GCL may be located adjacent to and may extend in parallel with the data line or the driving voltage line when viewed from the top.

For another example, the first to third portions GCLa, GCLb and GCLc of each of the gate connection lines GCL may be connected to one another to form a curved line. The configuration of the gate connection lines GCL is not limited to the first to third portions GCLa, GCLb and GCLc shown in FIG. 19 but may have a variety of shapes to connect between the second lines SL located on the both sides of the through hole TH.

Figure 20:
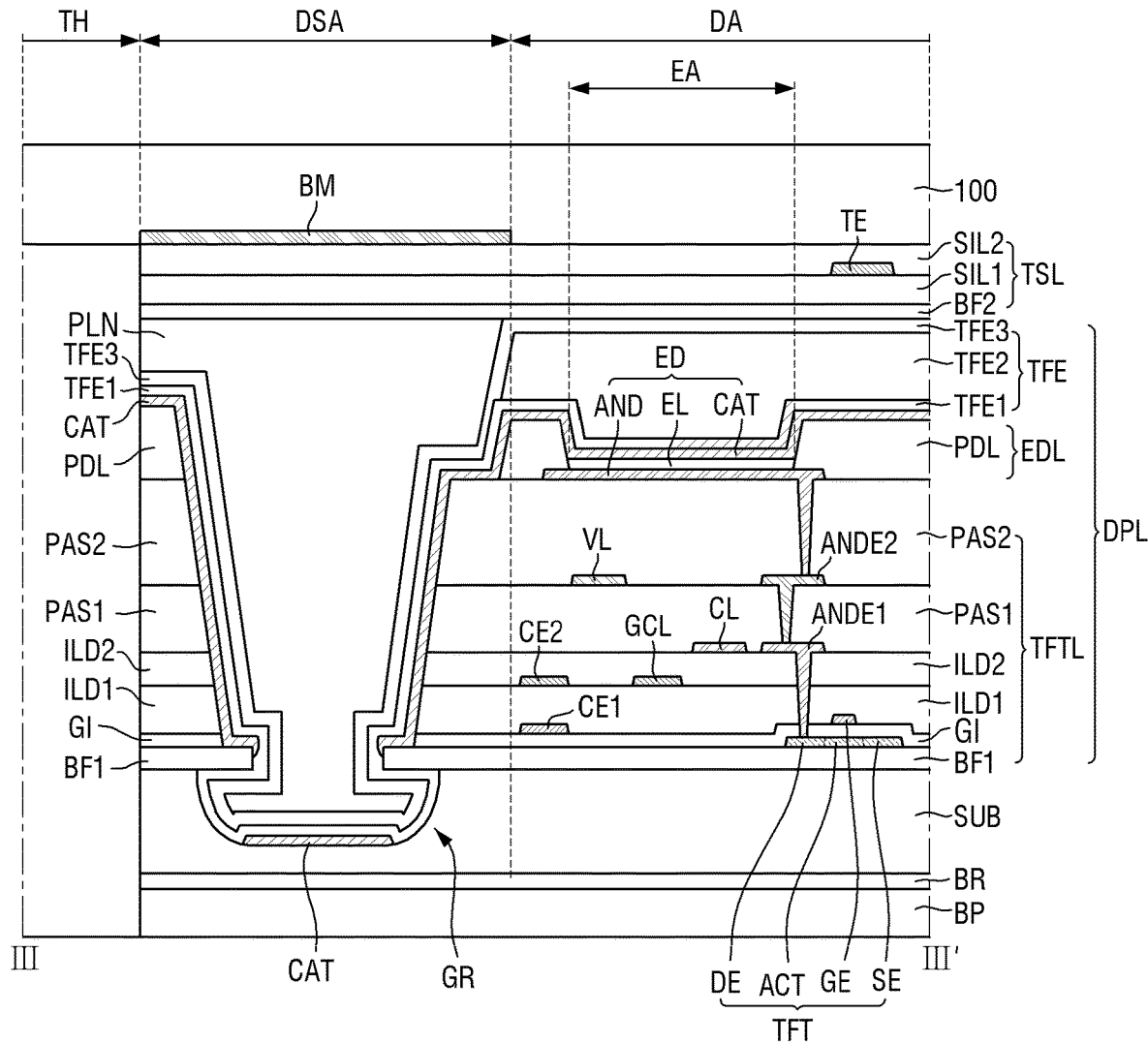
FIG. 20 is a cross-sectional view, taken along the line III-III' of FIG. 19.

FIG. 20 is a cross-sectional view, taken along line III-III' of FIG. 19. The display panel of FIG. 20 is substantially identical to the display panel of FIG. 7 except that the former further includes gate connection lines GCL; and, therefore, some redundant description may be omitted.

Referring to FIG. 20, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a thin-film transistor TFT, a gate insulating layer GI, a first gate layer GTL1, a first interlayer dielectric layer ILD1, a second gate layer GTL2, a second interlayer dielectric layer ILD2, a first conductive layer SDL1, a first passivation layer PAS1, a second conductive layer SDL2, and a second passivation layer PAS2.

The first gate layer GTL1 may be located on the gate insulating layer GI. The first gate layer GTL1 may include the first capacitor electrode CE1 and a gate electrode GE of the thin-film transistor TFT. The gate electrode GE of the thin-film transistor TFT may be a part of the second line SL. For example, the gate electrode GE of the thin-film transistor TFT may be a part of the first gate line GL1, the second gate line GL2, the third gate line GL3, or the emission control line shown in FIG. 6. Therefore, the plurality of second lines SL may be located on the first gate layer GTL1. Each of the first capacitor electrode CE1 and the gate electrode GE of the thin-film transistor TFT may be made up of a single layer or multiple layers of at least one of molybdenum (Mo), aluminum (Al), chromium (Cr), gold (Au), titanium (Ti), nickel (Ni), neodymium (Nd), or copper (Cu).

The second gate layer GTL2 may be located on the first interlayer dielectric layer ILD1. The second gate layer GTL2 may include a second capacitor electrode CE2 and a gate connection line GCL. Each of the second capacitor electrode CE2 and the gate connection line GCL may be made up of a single layer or multiple layers of at least one of molybdenum (Mo), aluminum (Al), chromium (Cr), gold (Au), titanium (Ti), nickel (Ni), neodymium (Nd), or copper (Cu).

The display device 10 includes the gate connection lines GCL located in a different layer from the second lines SL, thereby connecting between the second lines SL located on the both sides of the through hole TH around the through hole in the display area DA. Accordingly, the display device 10 does not require any additional line area or wiring area for connecting between the second lines SL located on the both sides of the through hole TH, thereby reducing the dead space area created by the through hole TH.

For another example, the plurality of second lines SL may be located on the second gate layer GTL, and the gate connection lines GCL may be located on the first gate layer GTL. Therefore, the arrangement relationship between the plurality of first lines VL and the gate connection lines GCL is not limited to that shown in FIG. 20.

Figure 21:
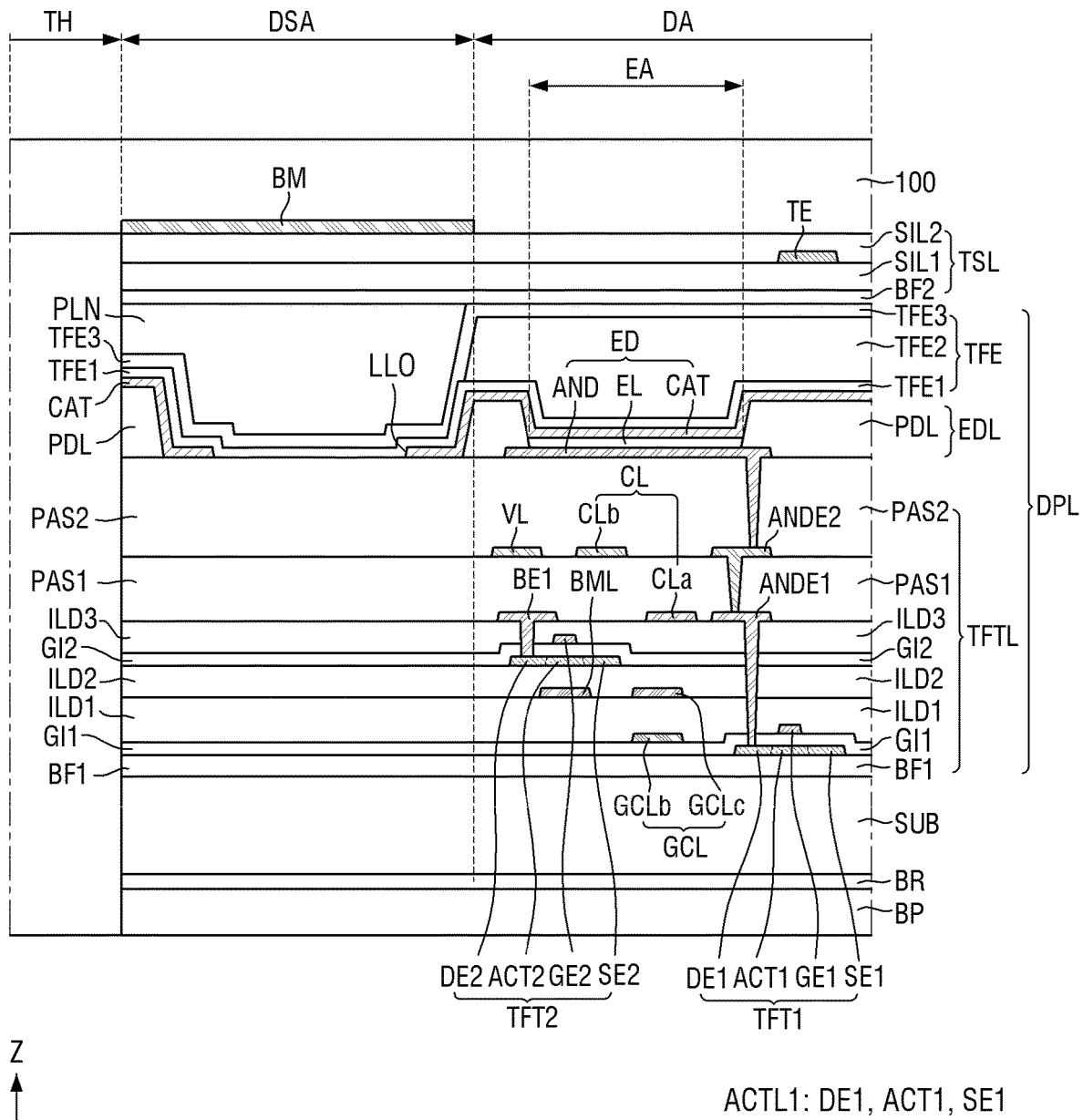
FIG. 21 is another cross-sectional view of a display panel according to some example embodiments of the present disclosure.

FIG. 21 is another cross-sectional view of a display panel according to some example embodiments of the present disclosure. The display panel of FIG. 21 is substantially identical to the display panel of FIG. 11 except that the former further includes gate connection lines GCL; and, therefore, some redundant description may be omitted.

Referring to FIG. 21, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a first thin-film transistor TFT1, a first gate insulating layer GI1, a first gate layer GTL1, a first interlayer dielectric layer ILD1, a second gate layer GTL2, a second interlayer dielectric layer ILD2, a second gate insulating layer GI2, a third gate layer GTL3, a third interlayer insulating layer ILD3, a first conductive layer SDL1, a first passivation layer PAS1, a second conductive layer SDL2, and a second passivation layer PAS2.

Each of the gate connection lines GCL may include first to third portions GCLa, GCLb, and GCLc.

The first portions GCLa of the gate connection lines GCL may be connected to the respective second lines SL terminated at one side of the through hole TH. The first portions GCLa of the gate connection lines GCL may extend in a direction crossing the direction in which the second lines SL are extended. The first portion CLa of the gate connection line GCL may be located adjacent to and may extend in parallel with the first line VL when viewed from the top.

The second portion GCLb of the gate connection line GCL may be connected between the first portion GCLa and the third portion GCLc. The second portion GCLb of the gate connection line GCL may be bent from the first portion GCLa and may extend in a direction parallel to the second line SL. For example, the second portion GCLb of the gate connection line GCL may extend in the first direction (x-axis direction) in the display area DA. The second portions GCLb of the gate connection lines GCL may be located adjacent to and may extend in parallel with the second lines SL which are not disconnected by the through hole TH when viewed from the top.

The third portions GCLc of the gate connection lines GCL may be connected to the respective second lines SL terminated at the other side of the through hole TH. The third portions GCLc of the gate connection lines GCL may extend in a direction crossing the direction in which the second lines SL are extended. The third portion GCLc of the gate connection line GCL may be located adjacent to and may extend in parallel with the first line VL when viewed from the top. For example, the third portion GCLc of the gate connection line GCL may be located adjacent to and may extend in parallel with the data line or the driving voltage line when viewed from the top.

The first gate layer GTL1 may be located on the first gate insulating layer GI1. The first gate layer GTL1 may include the first gate electrode GE1 of the first thin-film transistor TFT1 and the second portion GCLb of the gate connection line GCL. For example, the first gate electrode GE1 of the first thin-film transistor TFT1 may be a part of the third scan line HGL3, the fourth scan line HGL4, or the emission control line EML shown in FIG. 10. Accordingly, the third scan line HGL3, the fourth scan line HGL4, and the emission control line EML may be located on the first gate layer GTL1.

The second gate layer GTL2 may be located on the first interlayer dielectric layer ILD1. The second gate layer GTL2 may include a light-blocking layer BML and a third portion GCLc of the gate connection line GCL.

The third gate layer GTL3 may be located on the second gate insulating layer GI2. The third gate layer GTL3 may include the second gate electrode GE2 of the second thin-film transistor TFT2. For example, the second gate electrode GE2 of the second thin-film transistor TFT2 may be a part of the first scan line HGL1 or the second can line HGL2 shown in FIG. 10. Accordingly, the first scan line HGL1 and the second scan line HGL2 may be located on the third gate layer GTL3.

Accordingly, the plurality of second lines SL may be located on the first gate layer GTL1 or the third gate layer GTL3.

The first portion GCLa and the third portion GCLc of the gate connection line GCL may be located on the second gate layer GTL2, and the second portion GCLb of the gate connection line GCL may be located one of the first to third gate layers GTL1 to GTL3. According to some example embodiments, a first portion GCLa of the gate connection line GCL may be spaced apart from the third portion CBLa of the gate connection line GCL and may be located in the same layer as the third portion CBLc of the gate connection line GCL. For example, the first portion GCLa and the third portion GCLc of the gate connection line GCL may be located on the second gate layer GTL2, and the second portion GCLb of the gate connection line GCL may be located on the first gate layer GTL1. The first portions GCLa and the third portions GCLc of the gate connection lines GCL crossing the plurality of second lines SL may be located in a different layer from the plurality of first lines VL and thus may be insulated from the plurality of second lines SL. The second portions GCLb of the gate connection lines GCL parallel to the plurality of second lines SL may be located on the same layer as or on a different layer from the plurality of second lines SL. Accordingly, the gate connection lines CBL may connect between the second lines SL spaced apart from one another by the through hole TH.

The display device 10 includes the gate connection lines GCL, thereby connecting between the second lines SL located on the both sides of the through hole TH around the through hole in the display area DA. Accordingly, the display device 10 does not require any additional line area or wiring area for connecting between the second lines SL located on the both sides of the through hole TH, thereby reducing the dead space area created by the through hole TH.

Figure 22:
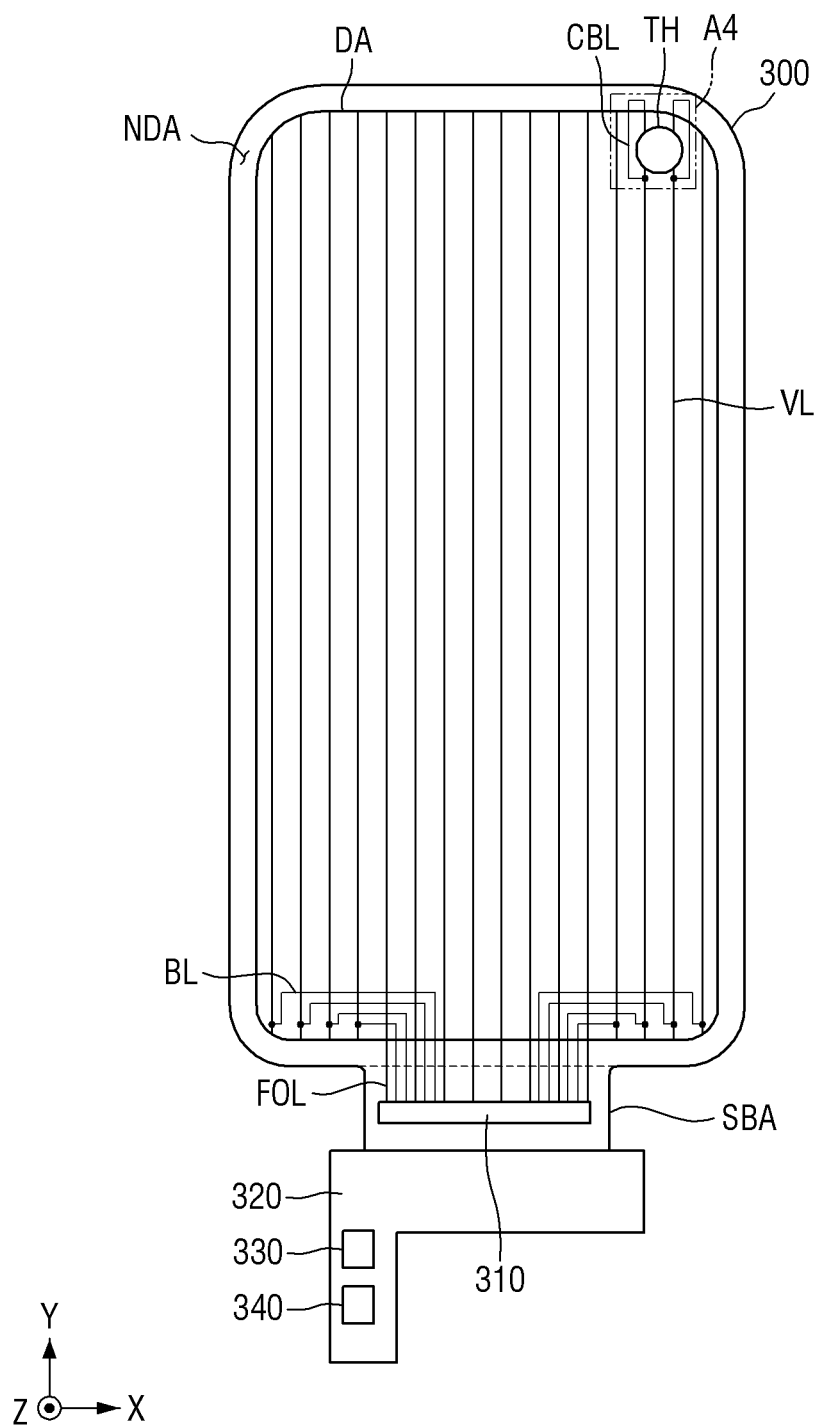
FIG. 22 is a plan view showing connection relationships of first lines of a display panel according to some example embodiments of the present disclosure.
Figure 23:
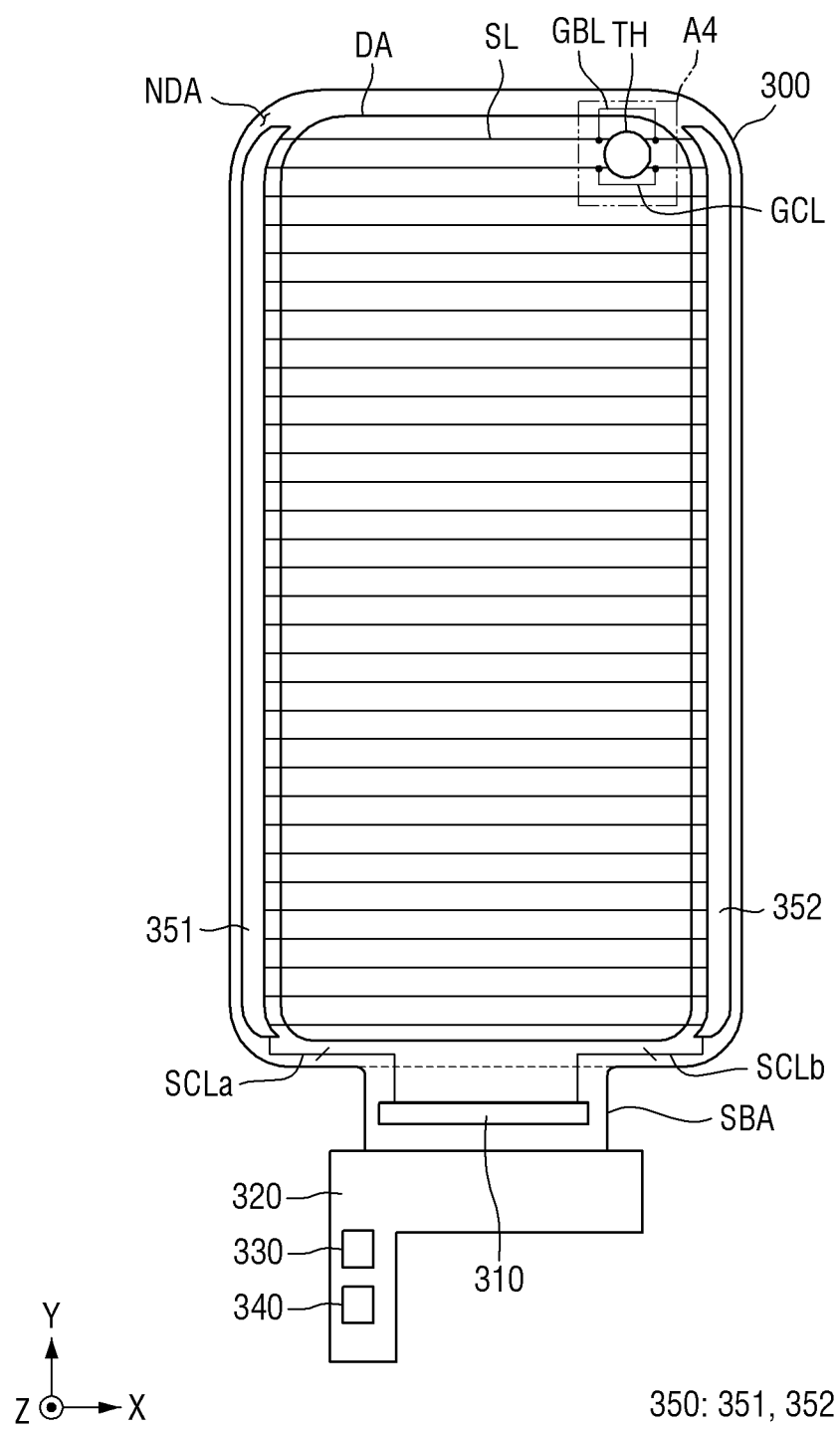
FIG. 23 is a plan view showing connection relationships of second lines of a display panel according to some example embodiments of the present disclosure.

FIG. 22 is a plan view showing connection relationships of first lines of a display panel according to some example embodiments of the present disclosure. FIG. 23 is a plan view showing connection relationships of second lines of a display panel according to some example embodiments of the present disclosure. The display panel of FIG. 22 is substantially identical to the display panel of FIG. 17 except for the configuration of bypass connection lines CBL, and the display panel of FIG. 23 is substantially identical to the display panel of FIG. 18 except for the configuration of bypass connection lines CBL; and, therefore, some redundant description may be omitted.

Referring to FIGS. 22 and 23, the display panel 300 may include the through hole TH, the display area DA, and the non-display area NDA.

The display area DA may include a plurality of pixels SP, a plurality of first lines VL, and a plurality of second lines SL.

The plurality of first lines VL may be connected to the display driver 310 and may traverse the display area DA in the second direction (y-axis direction). The plurality of first lines VL may extend in the second direction (y-axis direction) and may be spaced apart from one another in the first direction (x-axis direction) crossing the second direction (y-axis direction). Some of the first lines VL which face the display driver 310 may be connected to the display driver 310 through fan-out lines FOL, and some others of the first lines VL which do not face the display driver 310 may be connected to the display driver 310 through bypass lines BL. For example, the plurality of first lines VL may include a plurality of data lines and a plurality of driving voltage lines. The data lines may apply data voltages to the pixels, and the driving voltage lines may apply driving voltages to the pixels.

Some of the first lines VL may not pass through the through hole TH while some others of the first lines VL may be disconnected by the through hole TH. For example, some of the first lines VL which do not pass through the through hole TH may extend from the side of the display area DA which faces the display driver 310 to the opposite side of the display area DA. Some others of the plurality of first lines VL which are disconnected by the through hole TH may be connected by the bypass connection lines CBL.

The bypass connection lines CL may extend in the display area DA and the non-display area NDA around the through hole to connect the first lines VL spaced apart from each other. For example, the bypass connection lines CBL may be connected to the first lines VL on the lower side of the through hole TH, and may pass through the display area DA on the left or right side of the through hole TH to be extended to the upper side of the non-display area NDA relatively adjacent to the through hole TH. The bypass connection lines CBL may be bent at least once on the upper side of the non-display area NDA, and may be connected to the first lines VL extended to the upper side of the non-display area NDA.

The bypass connection lines CBL may be located in a different layer from the plurality of first lines VL, so that they can bypass the through hole TH and can be extended in the display area DA in which the plurality of pixels is located. The bypass connection lines CBL may connect the first lines VL terminated at one side of the through hole TH with the first lines VL terminated at the other side of the through hole TH. As the display device 10 includes the bypass connection lines CBL bypassing the through hole TH and extended in the display area DA and the non-display area NDA, it does not require any additional line area or wiring area connecting between the first lines VL located on the both sides of the through hole TH. As a result, it is possible to reduce the dead space area created by the through hole TH.

The bypass connection lines CBL may be connected to the first lines VL on the side of the non-display area NDA relatively adjacent to the through hole TH, and thus the distance between the through hole TH and the non-display area NDA can be reduced. Accordingly, the bypass connection lines CBL included in the display device 10 allow more degree of freedom for the position of the through hole TH.

The plurality of second lines SL may extend in the first direction (x-axis direction), and may be spaced apart from each other in the second direction (y-axis direction). The plurality of second lines SL may be connected to the first and second gate drivers 351 and 352. Some of the second lines SL may not pass through the through hole TH while some others of the second lines SL may be disconnected by the through hole TH. For example, some of the second lines SL which do not pass through the through hole TH may extend from the left edge to the right edge of the display area DA. Some others of the plurality of second lines SL which are disconnected by the through hole TH may be connected by the gate bypass lines GBL or the gate connection lines GCL. Some of the second lines SL may be connected by the gate bypass connection lines GBL passing through the upper side of the non-display area NDA adjacent to the upper side of the through hole TH, while some other second lines SL may be connected by the gate connection lines GCL passing through the lower side of the through hole TH. For example, the plurality of second lines SL may include a plurality of gate lines and a plurality of emission control lines. The gate lines may supply gate signals to the pixels, and the emission control line may supply emission signals to the pixels.

The gate bypass connection lines GBL may bypass the through hole TH and may extend in the display area DA and the non-display area NDA to connect between the second lines SL which are spaced apart from each other by the through hole TH. For example, the gate bypass connection lines GBL may be connected to the second lines SL on the left side of the through hole TH, and may pass through the display area DA on the upper side of the through hole TH to be extended to the upper side of the non-display area NDA. The gate bypass connection lines GBL may be bent at least once on the upper side of the non-display area NDA, extended back to the display area DA, and connected to the second lines SL on the right side of the through hole TH.

The gate bypass connection lines GBL may be located in a different layer from the plurality of second lines SL, so that they can bypass the through hole TH and can be extended in the display area DA in which the plurality of pixels is located. The gate bypass connection lines GBL may connect the second lines SL terminated at one side of the through hole TH with the second lines SL terminated at the other side of the through hole TH. As the display device 10 includes the gate bypass connection lines GBL bypassing the through hole TH and extended in the display area DA and the non-display area NDA, it does not require any additional line area or wiring area connecting between the second lines SL located on the both sides of the through hole TH. As a result, it is possible to reduce the dead space area created by the through hole TH.

The gate bypass connection lines GBL may be connected to the second lines SL passing through one side of the non-display area NDA relatively adjacent to the through hole TH, and thus the distance between the through hole TH and the non-display area NDA can be reduced. Accordingly, the gate bypass connection lines GBL included in the display device 10 allow more degree of freedom for the position of the through hole TH.

Figure 24:
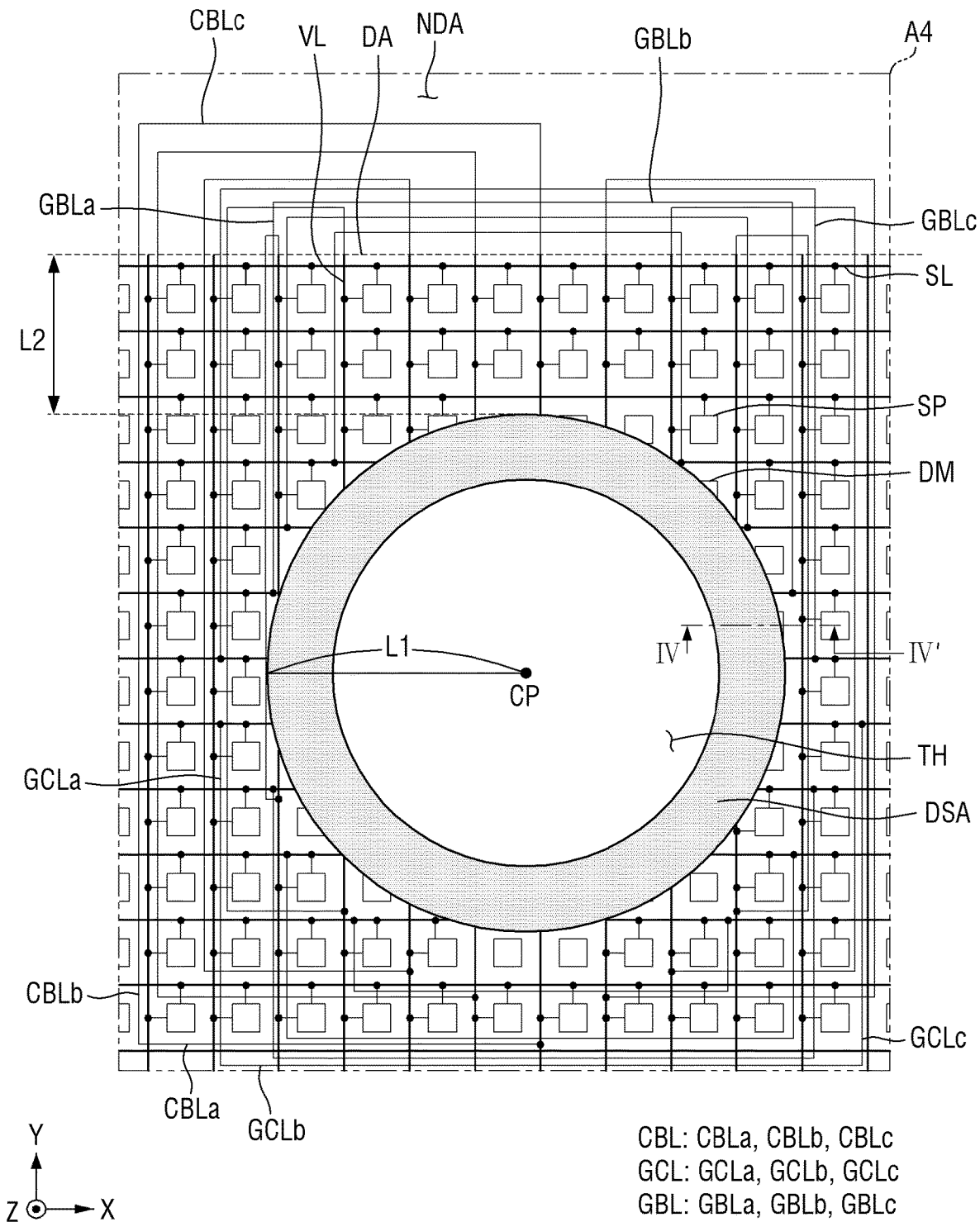
FIG. 24 is an enlarged view of the area A4 of FIGS. 22 and 23.

FIG. 24 is an enlarged view of area A4 of FIGS. 22 and 23. The display panel of FIG. 24 is substantially identical to the display panel of FIG. 13 except that the former further includes gate bypass connection lines GBL and gate connection lines GCL; and, therefore, some redundant description may be omitted.

Referring to FIG. 24, the display panel 300 may include a through hole TH, a dead space area DSA, and a display area DA.

The bypass connection lines CL may extend in the display area DA and the non-display area NDA around the through hole to connect the first lines VL spaced apart from each other. The bypass connection lines CBL may be located in a different layer from the plurality of first lines VL, so that they can bypass the through hole TH and can be extended in the display area DA in which the plurality of pixels is located. The bypass connection lines CBL may connect the first lines VL terminated at one side of the through hole TH with the first lines VL terminated at the other side of the through hole TH. As the display device 10 includes the bypass connection lines CBL bypassing the through hole TH in the display area DA, it does not require a separate line area or a wiring area connecting the lines located on both sides of the through hole TH. As a result, it is possible to reduce the dead space area DSA created by the through hole TH. By reducing the dead space area DSA in the display device 10, it is possible to avoid the number of the pixels from reducing due to the dead space area DSA and thus the image quality can be improved. Each of the bypass connection lines CBL may include first to third portions CBLa, CBLb, and CBLc.

The gate bypass connection lines GBL may bypass the through hole TH and may extend in the display area DA and the non-display area NDA to connect between the second lines SL which are spaced apart from each other by the through hole TH. For example, the gate bypass connection lines GBL may be connected to the second lines SL on the left side of the through hole TH, and may pass through the display area DA on the upper side of the through hole TH to be extended to the upper side of the non-display area NDA. The gate bypass connection lines GBL may be bent at least once on the upper side of the non-display area NDA, extended back to the display area DA, and connected to the second lines SL on the right side of the through hole TH.

Each of the gate bypass connection lines GBL may include first to third portions GBLa, GBLb, and GBLc.

The first portions GBLa of the gate bypass connection lines GBL may be connected to the respective second lines SL terminated at one side of the through hole TH. The first portions GBLa of the gate bypass connection lines GBL may extend in a direction crossing the direction in which the second lines SL are extended. For example, the first portion GBLa of the gate bypass connection lines GBL may pass through the display area DA on the upper side of the through hole TH to be extended to the upper side of the non-display area NDA. The first portion GBLa of the gate bypass connection line GBL may be located adjacent to and may extend in parallel with the first line VL when viewed from the top. For example, the first portion GBLa of the gate bypass connection line GBL may be located adjacent to and may extend in parallel with the data line or the driving voltage line when viewed from the top.

The second portion GBLb of the gate bypass connection line GBL may be connected between the first portion GBLa and the third portion GBLc. The second portion GBLb of the gate bypass connection line GBL may be bent from the first portion GBLa and may extend in a direction parallel to the second line SL. For example, one end of the second portion GBLb of the gate bypass connection line GBL may be connected to the first portion GBLa on the upper side of the non-display area NDA, and the other end of the second portion GBLb of the gate bypass connection line GBL may be connected to the third portion GBLc on the upper side of the non-display area NDA.

The third portions GBLc of the gate bypass connection lines GBL may be connected to the respective second lines SL terminated at the other side of the through hole TH. The third portion GBLc of the gate bypass connection line GBL may extend from the upper side of the non-display area NDA to the respective second line VL terminated at the other side of the through hole TH.

For another example, the first to third portions GBLa, GBLb and GBLc of each of the gate bypass connection lines GBL may be connected to one another to form a curved line. The configuration of the gate bypass connection lines GBL is not limited to the first to third portions GBLa, GBLb and GBLc shown in FIG. 24 but may have a variety of shapes to connect between the second lines SL located on the both sides of the through hole TH.

The gate bypass connection lines GBL may be located in a different layer from the plurality of second lines SL, so that they can bypass the through hole TH and can be extended in the display area DA in which the plurality of pixels is located. The gate bypass connection lines GBL may connect the second lines SL terminated at one side of the through hole TH with the second lines SL terminated at the other side of the through hole TH. As the display device 10 includes the gate bypass connection lines GBL bypassing the through hole TH and extended in the display area DA and the non-display area NDA, it does not require any additional line area or wiring area connecting between the second lines SL located on the both sides of the through hole TH. As a result, it is possible to reduce the dead space area created by the through hole TH.

The gate bypass connection lines GBL may be connected to the second lines SL passing through one side of the non-display area NDA relatively adjacent to the through hole TH, and thus the distance between the through hole TH and the non-display area NDA can be reduced. The boundary between the display area DA and the non-display area NDA may be defined with respect to the pixel electrodes of the pixels SP located at the outermost position among the plurality of pixels SP. The area where the pixel electrodes of the pixels SP located at the outermost position are located may fall in the display area DA, while the area outside the pixel electrodes of the pixels SP located at the outermost position may fall in the non-display area NDA. Since the second portions GBLc of the gate bypass connection lines GBL do not pass through the display area DA located on the upper side of the through hole TH, the distance between the through hole TH and the non-display area NDA can be reduced. The bypass connection lines CBL may be connected to the first lines VL on the side of the non-display area NDA relatively adjacent to the through hole TH, and thus the distance between the through hole TH and the non-display area NDA can be reduced. For example, the distance L2 between the dead space area DSA and the non-display area NDA may be less than half the distance L1 between the center CP of the through hole TH and the display area DA (L2≤(L1)/2). Accordingly, the bypass connection lines CBL and the gate bypass connection lines GBL included in the display device 10 allow more degree of freedom for the position of the through hole TH.

Figure 25:
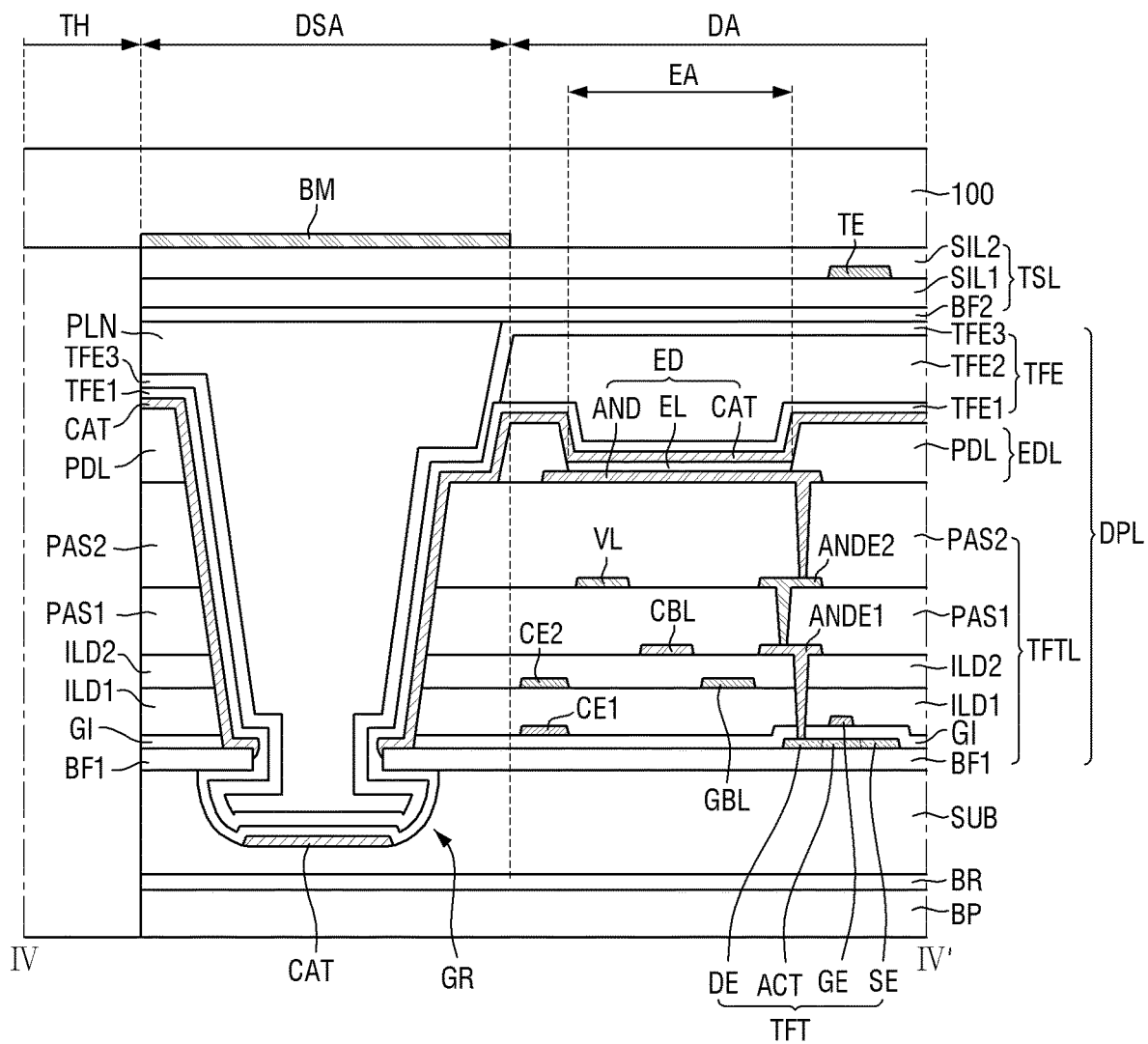
FIG. 25 is a cross-sectional view taken along the line IV-IV' of FIG. 24.

FIG. 25 is a cross-sectional view taken along line IV-IV' of FIG. 24. The display panel of FIG. 25 is substantially identical to the display panel of FIG. 14 except that the former further includes gate bypass connection lines GBL; and, therefore, some redundant description may be omitted.

Referring to FIG. 25, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a thin-film transistor TFT, a gate insulating layer GI, a first gate layer GTL1, a first interlayer dielectric layer ILD1, a second gate layer GTL2, a second interlayer dielectric layer ILD2, a first conductive layer SDL1, a first passivation layer PAS1, a second conductive layer SDL2, and a second passivation layer PAS2.

The first gate layer GTL1 may be located on the gate insulating layer GI. The first gate layer GTL1 may include the first capacitor electrode CE1 and a gate electrode GE of the thin-film transistor TFT. The gate electrode GE of the thin-film transistor TFT may be a part of the second line SL. For example, the gate electrode GE of the thin-film transistor TFT may be a part of the first gate line GL1, the second gate line GL2, the third gate line GL3, or the emission control line shown in FIG. 6. Therefore, the plurality of second lines SL may be located on the first gate layer GTL1. Each of the first capacitor electrode CE1 and the gate electrode GE of the thin-film transistor TFT may be made up of a single layer or multiple layers of at least one of molybdenum (Mo), aluminum (Al), chromium (Cr), gold (Au), titanium (Ti), nickel (Ni), neodymium (Nd), or copper (Cu).

The second gate layer GTL2 may be located on the first interlayer dielectric layer ILD1. The second gate layer GTL2 may include a second capacitor electrode CE2 and a gate bypass connection line GCL. Each of the second capacitor electrode CE2 and the gate bypass connection line GBL may be made up of a single layer or multiple layers of at least one of molybdenum (Mo), aluminum (Al), chromium (Cr), gold (Au), titanium (Ti), nickel (Ni), neodymium (Nd), or copper (Cu).

The display device 10 includes the gate bypass connection lines GBL located in a different layer from the second lines SL, thereby connecting between the second lines SL located on the both sides of the through hole TH around the through hole in the display area DA and the non-display area NDA. Accordingly, the display device 10 does not require any additional line area or wiring area for connecting between the second lines SL located on the both sides of the through hole TH, thereby reducing the dead space area created by the through hole TH.

For another example, the plurality of second lines SL may be located on the second gate layer GTL, and the gate bypass connection lines GBL may be located on the first gate layer GTL. Therefore, the arrangement relationship between the plurality of second lines SL and the gate bypass connection lines GBL is not limited to that shown in FIG. 25.

Figure 26:
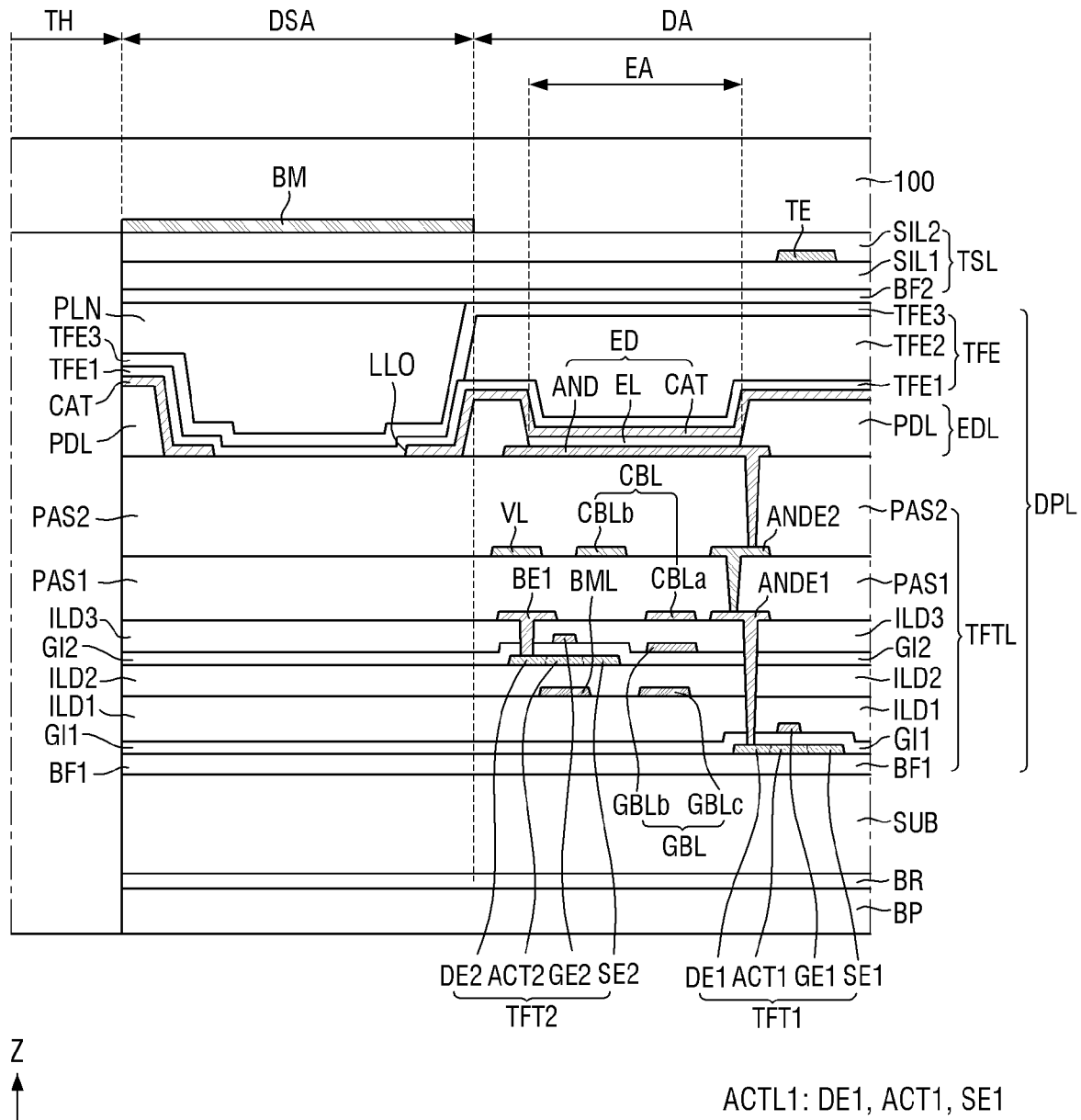
FIG. 26 is another cross-sectional view of a display panel according to some example embodiments of the present disclosure.

FIG. 26 is another cross-sectional view of a display panel according to some example embodiments of the present disclosure. The display panel of FIG. 26 is substantially identical to the display panel of FIG. 21 except for the configuration of gate bypass connection lines GBL; and, therefore, some redundant description may be omitted.

Referring to FIG. 26, the display panel 300 may include a substrate SUB, a barrier layer BR, a bottom panel part BP, a display layer DPL, and a touch electrode layer TSL.

The display layer DPL may include a thin-film transistor layer TFTL, a light-emitting element layer EDL, an encapsulation layer TFE.

The thin-film transistor layer TFTL may include a first buffer layer BF1, a first thin-film transistor TFT1, a first gate insulating layer GI1, a first gate layer GTL1, a first interlayer dielectric layer ILD1, a second gate layer GTL2, a second interlayer dielectric layer ILD2, a second gate insulating layer GI2, a third gate layer GTL3, a third interlayer insulating layer ILD3, a first conductive layer SDL1, a first passivation layer PAS1, a second conductive layer SDL2, and a second passivation layer PAS2.

Each of the gate bypass connection lines GBL may include first to third portions GBLa, GBLb, and GBLc.

The first portions GBLa of the gate bypass connection lines GBL may be connected to the respective second lines SL terminated at one side of the through hole TH. The first portions GBLa of the gate bypass connection lines GBL may extend in a direction crossing the direction in which the second lines SL are extended. For example, the first portion GBLa of the gate bypass connection lines GBL may pass through the display area DA on the upper side of the through hole TH to be extended to the upper side of the non-display area NDA. The first portion GBLa of the gate bypass connection line GBL may be located adjacent to and may extend in parallel with the first line VL when viewed from the top.

The second portion GBLb of the gate bypass connection line GBL may be connected between the first portion GBLa and the third portion GBLc. The second portion GBLb of the gate bypass connection line GBL may be bent from the first portion GBLa and may extend in a direction parallel to the second line SL. For example, one end of the second portion GBLb of the gate bypass connection line GBL may be connected to the first portion GBLa on the upper side of the non-display area NDA, and the other end of the second portion GBLb of the gate bypass connection line GBL may be connected to the third portion GBLc on the upper side of the non-display area NDA.

The third portions GBLc of the gate bypass connection lines GBL may be connected to the respective second lines SL terminated at the other side of the through hole TH. The third portion GBLc of the gate bypass connection line GBL may extend from the upper side of the non-display area NDA to the respective second line VL terminated at the other side of the through hole TH.

The first gate layer GTL1 may be located on the first gate insulating layer GI1. The first gate layer GTL1 may include the first gate electrode GE1 of the first thin-film transistor TFT1. For example, the first gate electrode GE1 of the first thin-film transistor TFT1 may be a part of the third scan line HGL3, the fourth scan line HGL4, or the emission control line EML shown in FIG. 10. Accordingly, the third scan line HGL3, the fourth scan line HGL4, and the emission control line EML may be located on the first gate layer GTL1.

The second gate layer GTL2 may be located on the first interlayer dielectric layer ILD1. The second gate layer GTL2 may include a light-blocking layer BML and a third portion GBLc of the gate bypass connection line GBL.

The third gate layer GTL3 may be located on the second gate insulating layer GI2. The third gate layer GTL3 may include the second gate electrode GE2 of the second thin-film transistor TFT2 and the second portion GBLb of the gate bypass connection line GBL. For example, the second gate electrode GE2 of the second thin-film transistor TFT2 may be a part of the first scan line HGL1 or the second can line HGL2 shown in FIG. 10. Accordingly, the first scan line HGL1 and the second scan line HGL2 may be located on the third gate layer GTL3.

Accordingly, the plurality of second lines SL may be located on the first gate layer GTL1 or the third gate layer GTL3.

The first portion GBLa and the third portion GBLc of the gate bypass connection line GBL may be located on the second gate layer GTL2, and the second portion GBLb of the gate bypass connection line GBL may be located one of the first to third gate layers GTL1 to GTL3. According to some example embodiments, a first portion GBLa of the gate bypass connection line GBL may be spaced apart from the third portion GBLc of the gate bypass connection line GBL and may be located in the same layer as the third portion GBLc of the gate bypass connection line GBL. For example, the first portion GBLa and the third portion GBLc of the gate bypass connection line GBL may be located on the second gate layer GTL2, and the second portion GBLb of the gate bypass connection line GBL may be located on the first gate layer GTL1. The first portions GBLa and the third portions GBLc of the gate bypass connection lines GBL crossing the plurality of second lines SL may be located in a different layer from the plurality of second lines SL and thus may be insulated from the plurality of second lines SL. The second portions GBLb of the gate bypass connection lines GBL parallel to the plurality of second lines SL may be located on the same layer as or on a different layer from the plurality of second lines SL. Accordingly, the gate bypass connection lines GBL may connect between the second lines SL spaced apart from one another by the through hole TH.

The display device 10 includes the gate bypass connection lines GBL, thereby connecting between the second lines SL located on the both sides of the through hole TH around the through hole in the display area DA and the non-display area NDA. Accordingly, the display device 10 does not require any additional line area or wiring area for connecting between the second lines SL located on the both sides of the through hole TH, thereby reducing the dead space area created by the through hole TH.

What is claimed is:

1. A display device comprising:
   a base part comprising a display area comprising a plurality of pixels each having at least one switching element and a light-emitting element including a first electrode electrically connected to the at least one switching element and an emissive layer on the first electrode, a non-display area surrounding the display area, a dead space area surrounded by the display area, and a through hole surrounded by the display area and the dead space area;
   a plurality of first lines extending in a first direction on the base part and connected to the plurality of pixels; and
   connection lines bypassing the through hole and extending in the display area to connect between the first lines spaced apart from one another by the through hole among the plurality of first lines, wherein a connection line from among the connection lines bypassing the through hole comprises a plurality of portions on different layers, wherein the plurality of pixels and the plurality of first lines are located outside the dead space area, and wherein the dead space area further comprises a cathode cut disconnecting a cathode electrode of the light-emitting element, and a light blocking layer located on top of the cathode cut,
   the first electrode is not disposed in the dead space area and does not overlap the light blocking layer.

2. The display device of claim 1, wherein each of the connection lines comprises:
   a first portion connected to a first line terminated at one side of the through hole;
   a second portion connected to the first portion and extending in a direction parallel to the first line; and
   a third portion connecting the first line terminated at an opposite side of the through hole with the second portion.

3. The display device of claim 2, further comprising:
   a first conductive layer comprising a first anode connection electrode connected to the at least one switching element; and
   a second conductive layer on the first conductive layer and comprising a second anode connection electrode connecting the first anode connection electrode with the light-emitting element,
   wherein the plurality of first lines and the second portion of each of the connection lines are in one of the first and second conductive layers, and the first portion of each of the connection lines is in the other of the first and second conductive layers.

4. The display device of claim 2, further comprising:
   a first conductive layer comprising a first anode connection electrode connected to the at least one switching element;
   a second conductive layer on the first conductive layer and comprising a second anode connection electrode connected to the first anode connection electrode; and
   a third conductive layer on the second conductive layer and comprising a third anode connection electrode connecting the second anode connection electrode with the light-emitting element,
   wherein the first lines are in one of the first to third conductive layers, and the first portion of each of the connection lines is in another of the first to third conductive layers, and the second portion of each of the connection lines is in the other one of the first to third conductive layers.

5. The display device of claim 1, further comprising:
   a first conductive layer comprising a first anode connection electrode connected to the at least one switching element; and
   a second conductive layer on the first conductive layer and comprising a second anode connection electrode connecting the first anode connection electrode with the light-emitting element,
   wherein the first lines are in one of the first and second conductive layers, and the connection lines are in the other one of the first and second conductive layers.

6. The display device of claim 1, wherein the plurality of first lines comprises:
   a plurality of data lines configured to supply a data voltage to each of the plurality of pixels; and
   a plurality of driving voltage lines configured to supply a driving voltage to each of the plurality of pixels.

7. The display device of claim 1, further comprising:
   a plurality of second lines extending in a second direction crossing the first direction on the base part to be connected to the plurality of pixels;
   a first gate driver on one side of the non-display area to supply gate signals to the plurality of second lines; and
   a second gate driver on an opposite side of the non-display area to supply gate signals to the plurality of second lines,
   wherein the first gate driver is configured to supply a gate signal to a second line terminated at one side of the through hole among the plurality of second lines, and
   wherein the second gate driver is configured to supply a gate signal to a second line terminated at an opposite side of the through hole.

8. The display device of claim 7, wherein the plurality of second lines comprises:
   a plurality of gate lines configured to supply a gate signal to each of the plurality of pixels; and
   a plurality of emission control lines configured to supply an emission signal to each of the plurality of pixels.

9. The display device of claim 1, further comprising:
a plurality of second lines extending in a second direction crossing the first direction on the base part to be connected to the plurality of pixels; and
gate connection lines bypassing the through hole and extending in the display area to connect the second lines spaced apart from each other by the through hole among the plurality of second lines.

10. The display device of claim 9, wherein each of the gate connection lines comprises:
a first portion connected to a second line terminated at one side of the through hole;
a second portion connected to the first portion and extended in a direction parallel to the second line; and
a third portion connecting the second line terminated at an opposite side of the through hole with the second portion.

11. The display device of claim 9, further comprising:
a first gate layer comprising the plurality of second lines; and
a second gate layer on the first gate layer and comprising the gate connection lines.

12. The display device of claim 11, further comprising:
a first gate layer comprising some of the plurality of second lines;
a second gate layer on the first gate layer and comprising a metal layer; and
a third gate layer on the second gate layer and comprising some others of the plurality of second lines,
wherein the second portion of each of the gate connection lines is in one of the first to third gate layers, and the third portion of each of the gate connection lines is in the second gate layer.

13. The display device of claim 1, wherein the first lines comprise data lines supplying a data voltage to the pixels,
the connection lines comprises a data connection line in the display area and connecting the data lines,
the data connection line is not disposed in the dead space area.

* * * * *